United States Patent
Yamazaki et al.

(10) Patent No.: US 11,355,530 B2
(45) Date of Patent: Jun. 7, 2022

(54) SEMICONDUCTOR DEVICE AND FABRICATION METHOD OF SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Yuichi Sato, Kanagawa (JP); Hitoshi Nakayama, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 53 days.

(21) Appl. No.: 17/041,852

(22) PCT Filed: Apr. 4, 2019

(86) PCT No.: PCT/IB2019/052744
§ 371 (c)(1),
(2) Date: Sep. 25, 2020

(87) PCT Pub. No.: WO2019/197946
PCT Pub. Date: Oct. 17, 2019

(65) Prior Publication Data
US 2021/0020667 A1 Jan. 21, 2021

(30) Foreign Application Priority Data

Apr. 12, 2018 (JP) .............. JP2018-076694
Apr. 12, 2018 (JP) .............. JP2018-076752

(51) Int. Cl.
*H01L 27/12* (2006.01)
*H01L 29/24* (2006.01)
*H01L 27/108* (2006.01)

(52) U.S. Cl.
CPC .... *H01L 27/1255* (2013.01); *H01L 27/10805* (2013.01); *H01L 27/1225* (2013.01); *H01L 29/24* (2013.01)

(58) Field of Classification Search
CPC .............. H01L 21/8258; H01L 23/485; H01L 23/5223; H01L 23/522; H01L 27/1255;
(Continued)

(56) References Cited

U.S. PATENT DOCUMENTS 9,773,787 B2   9/2017  Matsuzaki
10,019,025 B2  7/2018  Yamazaki
(Continued)

FOREIGN PATENT DOCUMENTS

JP   2016-139800 A   8/2016
JP   2016-219011 A   12/2016
(Continued)

OTHER PUBLICATIONS

International Search Report (Application No. PCT/IB2019/052744) dated Jul. 16, 2019.
(Continued)

*Primary Examiner* — Nikolay K Yushin
(74) *Attorney, Agent, or Firm* — Nixon Peabody LLP; Jeffrey L. Costellia

(57) ABSTRACT

A semiconductor device including: a first insulator in which an opening is formed; a first conductor positioned in the opening; a first oxide over the first insulator; a second oxide over the first oxide; a third oxide and a fourth oxide over the second oxide; a second conductor over the third oxide and the first conductor; a third conductor over the fourth oxide; a fifth oxide over the second oxide; a second insulator over the fifth oxide; and a fourth conductor positioned over the second insulator and overlapping with the fifth oxide. The fifth oxide is in contact with each of a side surface of the
(Continued)

third oxide and a side surface of the fourth oxide. The conductivity of the third oxide is higher than the conductivity of the second oxide. The second conductor is in contact with the top surface of the first conductor.

16 Claims, 32 Drawing Sheets

(58) Field of Classification Search
CPC ........... H01L 27/10805; H01L 27/1225; H01L 27/1156; H01L 27/108; H01L 27/0688; H01L 27/088; H01L 27/092; H01L 29/24; H01L 29/78696; H01L 29/78648; H01L 29/7869
See application file for complete search history.

(56) References Cited

U.S. PATENT DOCUMENTS

| | | | |
|---|---|---|---|
| 10,032,918 | B2 | 7/2018 | Yamazaki et al. |
| 10,141,069 | B2 | 11/2018 | Ikeda et al. |
| 10,333,004 | B2 | 6/2019 | Kimura et al. |
| 10,658,519 | B2 | 5/2020 | Kimura et al. |
| 10,699,794 | B2 | 6/2020 | Ikeda et al. |
| 2015/0263141 | A1 | 9/2015 | Yamazaki et al. |
| 2016/0247832 | A1 | 8/2016 | Suzawa et al. |
| 2016/0343452 | A1 | 11/2016 | Ikeda et al. |
| 2017/0033109 | A1 | 2/2017 | Yamazaki |
| 2017/0125420 | A1 | 5/2017 | Matsuzaki |
| 2017/0170211 | A1 | 6/2017 | Yamazaki |
| 2017/0236839 | A1 | 8/2017 | Yamazaki et al. |
| 2017/0271517 | A1 | 9/2017 | Kimura et al. |
| 2017/0309752 | A1 | 10/2017 | Yamazaki et al. |
| 2017/0317111 | A1 | 11/2017 | Ando et al. |
| 2019/0363108 | A1 | 11/2019 | Ando et al. |
| 2020/0176069 | A1 | 6/2020 | Ikeda et al. |
| 2020/0227564 | A1 | 7/2020 | Kimura et al. |

FOREIGN PATENT DOCUMENTS

| | | |
|---|---|---|
| JP | 2017-034243 A | 2/2017 |
| JP | 2017-034249 A | 2/2017 |
| JP | 2017-091599 A | 5/2017 |
| JP | 2017-175129 A | 9/2017 |
| JP | 2017-199901 A | 11/2017 |
| JP | 2019-201062 A | 11/2019 |
| KR | 2017-0015179 A | 2/2017 |
| TW | 201712809 | 4/2017 |
| WO | WO-2019/186331 | 10/2019 |

OTHER PUBLICATIONS

Written Opinion (Application No. PCT/IB2019/052744) dated Jul. 16, 2019.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.
Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.
Yamazaki.S et al., "In—Ga—Zn-Oxide Semiconductor and its Transistor Characteristics", ECS Journal of Solid State Science and Technology, Jul. 1, 2014, vol. 3, No. 9, pp. Q3012-Q3022.
Yamazaki.S, "Crystalline Oxide Semiconductor Using CAAC-IGZO and its Application", ECS Transactions, Oct. 1, 2014, vol. 64, No. 10, pp. 155-164, The Electrochemical Society.
Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.
Matsuda.S et al., "30-nm-Channel-Length C-Axis Aligned Crystalline In—Ga—Zn—O Transistors with Low Off-State Leakage Current and Steep Subthreshold Characteristics", 2015 Symposium On VLSI Technology: Digest of Technical Papers, 2015, pp. T216-T217.
Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

SEMICONDUCTOR DEVICE AND FABRICATION METHOD OF SEMICONDUCTOR DEVICE

TECHNICAL FIELD

One embodiment of the present invention relates to a semiconductor device and a method for fabricating the semiconductor device. Alternatively, one embodiment of the present invention relates to a semiconductor wafer, a module, and an electronic device.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. Alternatively, one embodiment of the present invention relates to a process, a machine, manufacture, or a composition (composition of matter).

BACKGROUND ART

As semiconductor thin films applicable to the transistors, silicon-based semiconductor materials have been widely known, but oxide semiconductors have been attracting attention as alternative materials. Examples of oxide semiconductors include not only single-component metal oxides, such as indium oxide and zinc oxide, but also multi-component metal oxides. Among the multi-component metal oxides, in particular, an In—Ga—Zn oxide (hereinafter also referred to as IGZO) has been actively studied.

From the studies on IGZO, in an oxide semiconductor, a CAAC (c-axis aligned crystalline) structure and an nc (nanocrystalline) structure, which are not single crystal nor amorphous, have been found (see Non-Patent Documents 1 to 3). In Non-Patent Documents 1 and 2, a technique for fabricating a transistor using an oxide semiconductor having the CAAC structure is disclosed. Moreover, Non-Patent Documents 4 and 5 disclose that a fine crystal is included even in an oxide semiconductor which has lower crystallinity than an oxide semiconductor having the CAAC structure or the nc structure.

In addition, a transistor which includes IGZO as an active layer has an extremely low off-state current (see Non-Patent Document 6), and an LSI and a display utilizing the transistor characteristics have been reported (see Non-Patent Documents 7 and 8).

REFERENCE

Non-Patent Document

[Non-Patent Document 1] S. Yamazaki et al., "SID Symposium Digest of Technical Papers", 2012, volume 43, issue 1, p. 183-186

[Non-Patent Document 2] S. Yamazaki et al., "Japanese Journal of Applied Physics", 2014, volume 53, Number 4S, p. 04ED18-1-04ED18-10

[Non-Patent Document 3] S. Ito et al., "The Proceedings of AM-FPD'13 Digest of Technical Papers", 2013, p. 151-154

[Non-Patent Document 4] S. Yamazaki et al., "ECS Journal of Solid State Science and Technology", 2014, volume 3, issue 9, p. Q3012-Q3022

[Non-Patent Document 5] S. Yamazaki, "ECS Transactions", 2014, volume 64, issue 10, p. 155-164

[Non-Patent Document 6] K. Kato et al., "Japanese Journal of Applied Physics", 2012, volume 51, p. 021201-1-021201-7

[Non-Patent Document 7] S. Matsuda et al., "2015 Symposium on VLSI Technology Digest of Technical Papers", 2015, p. T216-T217

[Non-Patent Document 8] S. Amano et al., "SID Symposium Digest of Technical Papers", 2010, volume 41, issue 1, p. 626-629

SUMMARY OF THE INVENTION

Problems to be Solved by the Invention

Another object of one embodiment of the present invention is to provide a semiconductor device that can be miniaturized or highly integrated. Another object of one embodiment of the present invention is to provide a semiconductor device with excellent electrical characteristics. Another object of one embodiment of the present invention is to provide a semiconductor device with high on-state current. Another object of one embodiment of the present invention is to provide a semiconductor device with excellent frequency characteristics. Another object of one embodiment of the present invention is to provide a highly reliable semiconductor device. Another object of one embodiment of the present invention is to provide a semiconductor device with high productivity.

An object of one embodiment of the present invention is to provide a semiconductor device capable of retaining data for a long time. An object of one embodiment of the present invention is to provide a semiconductor device capable of high-speed data writing. An object of one embodiment of the present invention is to provide a semiconductor device with high design flexibility. An object of one embodiment of the present invention is to provide a semiconductor device capable of reducing power consumption. An object of one embodiment of the present invention is to provide a novel semiconductor device.

Note that the descriptions of these objects do not disturb the existence of other objects. One embodiment of the present invention does not have to achieve all the objects. Other objects will be apparent from and can be derived from the description of the specification, the drawings, the claims, and the like.

Means for Solving the Problems

One embodiment of the present invention is a semiconductor device including: a first insulator in which an opening is formed; a first conductor positioned in the opening; a first oxide over the first insulator; a second oxide over the first oxide; a third oxide and a fourth oxide over the second oxide; a second conductor over the third oxide and the first conductor; a third conductor over the fourth oxide; a fifth oxide over the second oxide; a second insulator over the fifth oxide; and a fourth conductor positioned over the second insulator and overlapping with the fifth oxide. The fifth oxide is in contact with each of the side surface of the third oxide and the side surface of the fourth oxide. The conductivity of the third oxide is higher than the conductivity of the second oxide. The conductivity of the fourth oxide is higher than the conductivity of the second oxide. The second conductor is in contact with the top surface of the first conductor.

Another embodiment of the present invention is a semiconductor device including: a first insulator in which an opening is formed; a first conductor positioned in the opening; a first oxide over the first insulator, a second oxide over the first oxide; a third oxide and a fourth oxide over the second oxide; a second conductor over the third oxide and the first conductor; a third conductor over the fourth oxide; a fifth oxide over the second oxide; a second insulator over the fifth oxide; and a fourth conductor positioned over the second insulator and overlapping with the fifth oxide. The third oxide includes a first region that does not overlap with the second conductor. The fourth oxide includes a second region that does not overlap with the third conductor. The fifth oxide is in contact with the top surface of the first region and the top surface of the second region. The conductivity of the third oxide is higher than the conductivity of the second oxide. The conductivity of the fourth oxide is higher than the conductivity of the second oxide. The second conductor is in contact with the top surface of the first conductor.

The semiconductor device may further include a fifth conductor in contact with the top surface of the second conductor. The fifth conductor may overlap with at least part of the first conductor.

Another embodiment of the present invention is a semiconductor device including: a first to a third insulator, a first to a sixth conductor, a first to a fifth oxide; a capacitor; and a transistor. The capacitor includes, the fifth conductor, the third insulator over the fifth conductor, the sixth conductor over the third insulator. The transistor includes the first insulator in which an opening is formed, the first conductor positioned in the opening, the first oxide over the first insulator, the second oxide over the first oxide, the third oxide and the fourth oxide over the second oxide, the second conductor over the third oxide and the first conductor, the third conductor over the fourth oxide, the fifth oxide over the second oxide, the second insulator over the fifth oxide, and the fourth conductor positioned over the second insulator and overlapping with the fifth oxide. The fifth oxide is in contact with each of the side surface of the third oxide and the side surface of the fourth oxide. The conductivity of the third oxide is higher than the conductivity of the second oxide. The conductivity of the fourth oxide is higher than the conductivity of the second oxide. The second conductor is in contact with the top surface of the first conductor.

Another embodiment of the present invention is a semiconductor device including: a first to a third insulator, a first to a sixth conductor, a first to a fifth oxide; a capacitor; and a transistor. The capacitor includes the fifth conductor, the third insulator over the fifth conductor, and the sixth conductor over the third insulator. The transistor includes the first insulator in which an opening is formed, the first conductor positioned in the opening, the first oxide over the first insulator, the second oxide over the first oxide, the third oxide and the fourth oxide over the second oxide, the second conductor over the third oxide and the first conductor, the third conductor over the fourth oxide, the fifth oxide over the second oxide, the second insulator over the fifth oxide, and the fourth conductor positioned over the second insulator and overlapping with the fifth oxide. The third oxide includes a first region that does not overlap with the second conductor. The fourth oxide includes a second region that does not overlap with the third conductor. The fifth oxide is in contact with each of the top surface of the first region and the top surface of the second region. The conductivity of the third oxide is higher than the conductivity of the second oxide. The conductivity of the fourth oxide is higher than the conductivity of the second oxide. The second conductor is in contact with the top surface of the first conductor.

It is preferable that the capacitor be formed below the transistor and the first conductor be electrically connected to the sixth conductor.

A fourth insulator in which an opening is formed may be provided below the first insulator, and at least part of the fifth conductor, the third insulator, and the sixth conductor may be positioned in the opening of the fourth insulator.

Another embodiment of the present invention is a semiconductor device including: a first to a fourth insulator, a first to a seventh conductor, a first to a fifth oxide; a capacitor; a first transistor, and a second transistor. The capacitor includes the fifth conductor, the third insulator over the fifth conductor, and the sixth conductor over the third insulator. The first transistor includes the first insulator in which an opening is formed, the first conductor positioned in the opening, the first oxide over the first insulator, the second oxide over the first oxide, the third oxide and the fourth oxide over the second oxide, the second conductor over the third oxide and the first conductor, the third conductor over the fourth oxide, the fifth oxide over the second oxide, the second insulator over the fifth oxide, and the fourth conductor positioned over the second insulator and overlapping with the fifth oxide. The fifth oxide is in contact with each of the side surface of the third oxide and the side surface of the fourth oxide. The conductivity of the third oxide is higher than the conductivity of the second oxide. The conductivity of the fourth oxide is higher than the conductivity of the second oxide. The second conductor is in contact with the top surface of the first conductor. The second transistor includes the fourth insulator over a silicon substrate and the seventh conductor over the fourth insulator.

Another embodiment of the present invention is a semiconductor device including: a first to a fourth insulator, a first to a seventh conductor; a first to a fifth oxide; a capacitor a first transistor, and a second transistor. The capacitor includes the fifth conductor, the third insulator over the fifth conductor, and the sixth conductor over the third insulator. The first transistor includes the first insulator in which an opening is formed, the first conductor positioned in the opening, the first oxide over the first insulator, the second oxide over the first oxide, the third oxide and the fourth oxide over the second oxide, the second conductor over the third oxide and the first conductor, the third conductor over the fourth oxide, the fifth oxide over the second oxide, the second insulator over the fifth oxide, and the fourth conductor positioned over the second insulator and overlapping with the fifth oxide. The third oxide includes a first region that does not overlap with the second conductor. The fourth oxide includes a second region that does not overlap with the third conductor. The fifth oxide is in contact with each of the top surface of the first region and the top surface of the second region. The conductivity of the third oxide is higher than the conductivity of the second oxide. The conductivity of the fourth oxide is higher than the conductivity of the second oxide. The second conductor is in contact with the top surface of the first conductor. The second transistor includes the fourth insulator over a silicon substrate and the seventh conductor over the fourth insulator.

Furthermore, the first transistor may include an eighth conductor in contact with the top surface of the second conductor. The capacitor may be formed over the first transistor. The eighth conductor may be electrically connected to the fifth conductor. The second transistor may be formed below the first transistor. The first conductor may be electrically connected to the seventh conductor.

Furthermore, a fifth insulator in which an opening is formed may be provided over the eighth conductor. At least part of the fifth conductor, the third insulator and the sixth conductor may be positioned in the opening of the fifth insulator.

The third oxide and the fourth oxide each preferably include zinc.

The thickness of the third oxide and the fourth oxide is preferably each larger than or equal to 1 nm and smaller than or equal to 10 nm.

The third oxide and the fourth oxide each preferably has crystallinity.

The second oxide preferably includes In, an element M (M is Al, Ga, Y, or Sn), and Zn.

Effect of the Invention

According to one embodiment of the present invention, a semiconductor device that can be miniaturized or highly integrated can be provided. Alternatively, according to one embodiment of the present invention, a semiconductor device with excellent electrical characteristics can be provided. Alternatively, according to one embodiment of the present invention, a semiconductor device with high on-state current can be provided. Alternatively, according to one embodiment of the present invention, a semiconductor device with excellent frequency characteristics can be provided. Alternatively, according to one embodiment of the present invention, a highly reliable semiconductor device can be provided. Alternatively, according to one embodiment of the present invention, a semiconductor device with high productivity can be provided.

Alternatively, it is possible to provide a semiconductor device capable of retaining data for a long time. Alternatively, it is possible to provide a semiconductor device capable of high-speed data writing. Alternatively, it is possible to provide a semiconductor device with high design flexibility. Alternatively, it is possible to provide a semiconductor device capable of reducing power consumption. Alternatively, it is possible to provide a novel semiconductor device.

Note that the descriptions of the effects do not disturb the existence of other effects. One embodiment of the present invention does not have to have all of these effects. Effects other than these will be apparent from the description of the specification, the drawings, the claims, and the like and effects other than these can be derived from the description of the specification, the drawings, the claims, and the like.

MODE FOR CARRYING OUT THE INVENTION

Figure 1A:
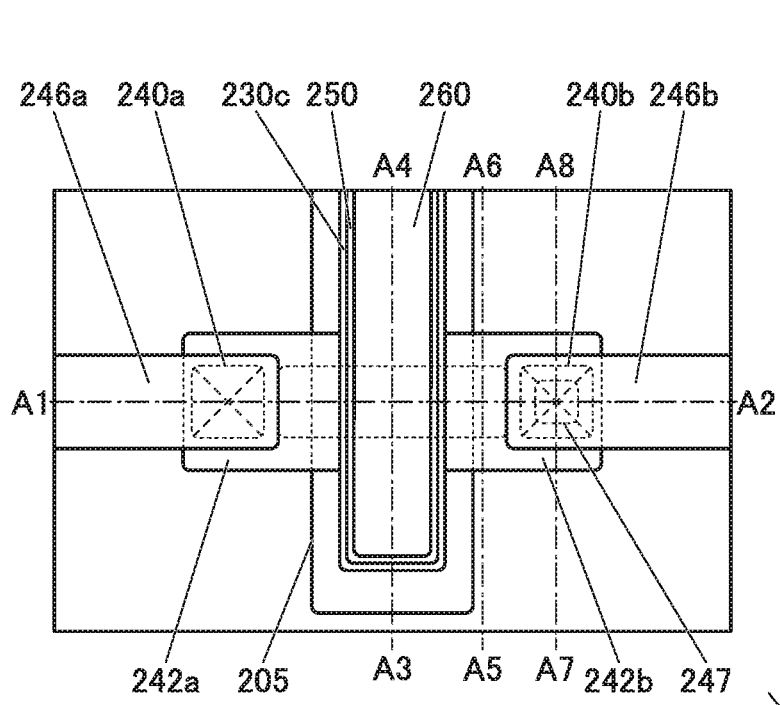
FIG. 1 (A)-(C) A top view and cross-sectional views of a semiconductor device of one embodiment of the present invention.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

In addition, in the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in an actual manufacturing process, a layer, a resist mask, or the like might be unintentionally reduced in size by treatment such as etching, which might be omitted for easy understanding. Furthermore, in the drawings, the same reference numerals are used in common for the same portions or portions having similar functions in different drawings, and repeated description thereof is omitted in some cases. The same hatching pattern is used for portions having similar functions, and the portions are not denoted by specific reference numerals in some cases.

In a top view (also referred to as a plan view), a perspective view, or the like, particularly, some components might not be illustrated for easy understanding of the invention. In addition, some hidden lines and the like might not be shown.

Note that the ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like are not necessarily the same as those which specify one embodiment of the present invention.

In addition, in this specification and the like, terms for describing arrangement, such as "over" and "below", are used for convenience to describe the positional relationship between components with reference to drawings. Furthermore, the positional relationship between components is changed as appropriate in accordance with a direction in which the components are described. Thus, terms for the description are not limited to terms used in the specification, and description can be made appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relationship, for example, a connection relationship shown in drawings or text, a connection relationship other than a connection relationship shown in drawings or text is regarded as being disclosed in the drawings or the text.

Here, X and Y each denote an object (e.g., a device, an element, a circuit, a wiring, an electrode, a terminal, a conductive film, or a layer).

Furthermore, functions of a source and a drain might be interchanged with each other when a transistor of opposite polarity is employed or when the direction of current is changed in circuit operation, for example. Therefore, the terms "source" and "drain" can sometimes be interchanged with each other in this specification and the like.

Note that in this specification and the like, depending on the transistor structure, a channel width in a region where a channel is actually formed (hereinafter also referred to as an effective channel width) is different from a channel width shown in a top view of a transistor (hereinafter also referred to as an apparent channel width) in some cases. For example, in a transistor whose gate electrode covers the side surface of a semiconductor, the effective channel width is larger than the apparent channel width, and its influence cannot be ignored in some cases. For example, in a miniaturized transistor whose gate electrode covers a semiconductor, the proportion of a channel formation region formed in a side surface of the semiconductor is increased in some cases. In that case, effective channel width is greater than apparent channel width.

In such a case, effective channel width is sometimes difficult to estimate by actual measurement. For example, estimation of effective channel width from a design value requires assumption that the shape of a semiconductor is known. Accordingly, in the case where the shape of a semiconductor is not known accurately, it is difficult to measure effective channel width accurately.

Furthermore, in this specification, the simple term "channel width" refers to apparent channel width in some cases. Alternatively, in this specification, the simple term "channel width" refers to effective channel width in some cases. Note that values of channel length, channel width, effective channel width, apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, DOS (Density of States) in a semiconductor might be increased or crystallinity might be decreased. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. In the case of an oxide semiconductor, water also serves as an impurity in some cases. Also in the case of an oxide semiconductor, oxygen vacancies are formed by the mixing of impurities, for example. Furthermore, when the semiconductor is silicon, examples of the impurity that changes characteristics of the semiconductor include oxygen, Group 1 elements except for hydrogen, Group 2 elements, Group 13 elements, and Group 15 elements.

Note that in this specification and the like, silicon oxynitride is a material that contains more oxygen than nitrogen in its composition. Moreover, silicon nitride oxide is a material that contains more nitrogen than oxygen in its composition.

In addition, in this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In addition, in this specification and the like, "parallel" indicates a state where two straight lines are placed at an angle greater than or equal to −10° and less than or equal to 10°. Accordingly, the case where the angle is greater than or equal to −5° and less than or equal to 5 is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle greater than or equal to 60° and less than or equal to 120°.

Note that in this specification, a barrier film means a film having a function of inhibiting the transmission of oxygen and impurities such as water and hydrogen; in the case where the barrier film has conductivity, the barrier film is referred to as a conductive barrier film in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, in the case where an OS FET or an OS transistor is stated, the OS FET or the OS transistor can also be referred to as a transistor including an oxide or an oxide semiconductor.

In addition, in this specification and the like, "normally off" means that current per micrometer of channel width flowing through a transistor when a potential is not applied to a gate or a ground potential is applied to the gate is lower than or equal to $1\times10^{-20}$ A at room temperature, lower than or equal to $1\times10^{-18}$ A at 85° C., or lower than or equal to $1\times10^{-16}$ A at 125° C.

Embodiment 1

An example of a semiconductor device including the transistor 200 of one embodiment of the present invention is described below.

<Structure Example of Semiconductor Device>

Figure 1C:
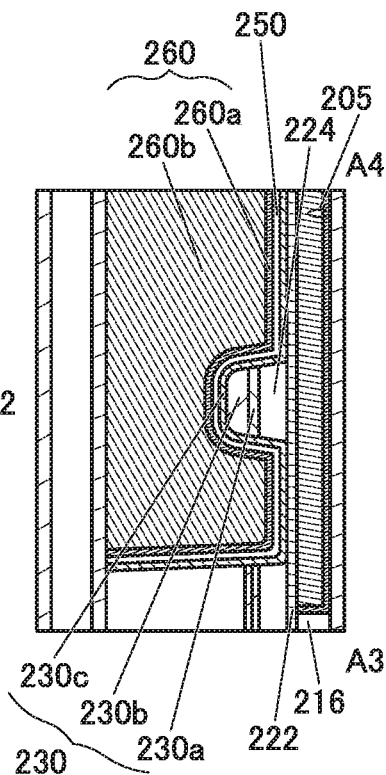
Figure 1B:
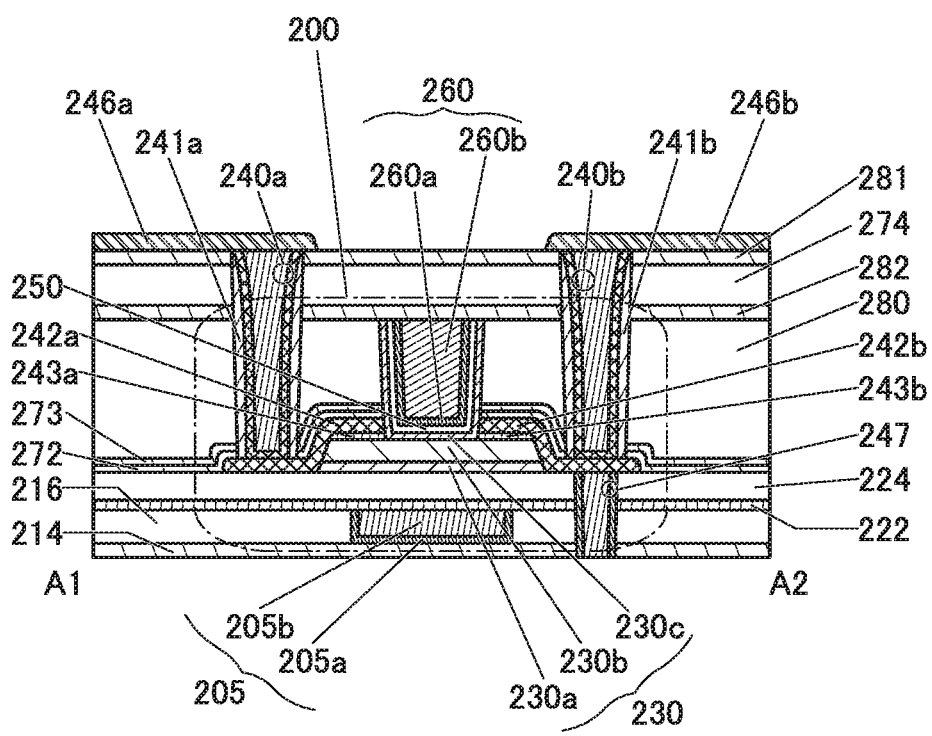

FIG. 1(A), FIG. 1(B), and FIG. 1(C) are a top view and cross-sectional views of a transistor 200 according to one embodiment of the present invention and the periphery of the transistor 200.

FIG. 1(A) is a top view of a semiconductor device including the transistor 200. FIG. 1(B) and FIG. 1(C) are cross-sectional views of the semiconductor device. Here, FIG. 1(B) is a cross-sectional view of a portion indicated by a dashed-dotted line A1-A2 in FIG. 1(A), and is a cross-sectional view in the channel length direction of the transistor 200. In addition, FIG. 1(C) is a cross-sectional view of a portion indicated by a dashed-dotted line A3-A4 in FIG. 1(A), and is a cross-sectional view in the channel width direction of the transistor 200. Note that for clarity of the drawing, some components are not illustrated in the top view of FIG. 1(A).

The semiconductor device of one embodiment of the present invention includes an insulator 214 over a substrate (not illustrated), the transistor 200 over the insulator 214, an insulator 280 over the transistor 200, an insulator 282 over the insulator 280, an insulator 274 over the insulator 282, and an insulator 281 over the insulator 274. The insulator 214, insulator 280, insulator 282, the insulator 274, and the insulator 281 function as interlayer films. A conductor 247 that functions as a plug and is electrically connected to the transistor 200 is provided. A conductor 240 (a conductor 240a and a conductor 240b) that functions as a plug and is electrically connected to the transistor 200 is also provided. Note that an insulator 241 (an insulator 241a and an insulator 241b) is provided in contact with a side surface of the conductor 240 functioning as a plug. A conductor 246 (a conductor 246a and a conductor 246b) electrically connected to the conductor 240 and functioning as a wiring is provided over the insulator 281 and the conductor 240.

The insulator 241a is provided in contact with the inner wall of an opening in an insulator 272, an insulator 273, the insulator 280, the insulator 282, the insulator 274, and the insulator 281, a first conductor of the conductor 240a is provided in contact with the side surface of the insulator 241a, and a second conductor of the conductor 240a is provided on the inner side thereof. The insulator 241b is provided in contact with the inner wall of an opening in the insulator 272, the insulator 273, the insulator 280, the insulator 282, the insulator 274, and the insulator 281, a first conductor of the conductor 240b is provided in contact with the side surface of the insulator 241b, and a second conductor of the conductor 240b is provided on the inner side thereof. Here, the level of a top surface of the conductor 240 and the level of a top surface of the insulator 281 can be substantially the same. Although the structure in which the first conductor of the conductor 240 and the second conductor of the conductor 240 are stacked is described in this embodiment, the present invention is not limited thereto. For example, the conductor 240 may be provided as a single layer or to have a stacked-layer structure of three or more layers. In contact with the inner wall of an opening formed in an insulator 214, an insulator 216, an insulator 222, and an insulator 224, a first conductor of the conductor 247 is provided, and a second conductor of the conductor 247 is further provided on the inner side. Although the structure in which the first conductor of the conductor 247 and the second conductor of the conductor 247 are stacked is described, the present invention is not limited thereto. For example, the conductor 247 may be provided as a single layer or to have a stacked-layer structure of three or more layers. In the case where a structure body has a stacked-layer structure, layers may be distinguished by ordinal numbers corresponding to the formation order.

[Transistor 200]

As shown in FIG. 1, the transistor 200 includes the insulator 216 over the insulator 214; a conductor 205 (a conductor 205a and a conductor 205b) positioned so as to be embedded in the insulator 216; the insulator 222 over the insulator 216 and the conductor 205; the insulator 224 over the insulator 222; an oxide 230*a* over the insulator 224; an oxide 230*b* over the oxide 230*a*; an oxide 243*a* and an oxide 243*b* over the oxide 230*b*; a conductor 242*a* in contact with part of the top surface of the insulator 224, the side surface of the oxide 230*a*, the side surface of the oxide 230*b*, the side surface of the oxide 243*a*, and the top surface of the oxide 243*a*; a conductor 242*b* in contact with part of the top surface of the insulator 224, the side surface of the oxide 230*a*, the side surface of the oxide 230*b*, the side surface of the oxide 243*b*, and the top surface of the oxide 243*b*; an oxide 230*c* over the oxide 230*b*; an insulator 250 over the oxide 230*c*; a conductor 260 (a conductor 260*a* and a conductor 260*b*) positioned over the insulator 250 and overlapping with the oxide 230*c*; the insulator 272 in contact with part of the top surface of the insulator 224, the side surface of the conductor 242*a*, the top surface of the conductor 242*a*, the side surface of the conductor 242*b*, and the top surface of the conductor 242*b*; and the insulator 273 over the insulator 272. The oxide 230*c* is in contact with each of the side surface of the oxide 243*a* and the side surface of the oxide 243*b*. The conductor 260 includes the conductor 260*a* and the conductor 260*b* and the conductor 260*a* is positioned to cover the bottom surface and the side surface of the conductor 260*b*. Here, as illustrated in FIG. 1(B), the top surface of the conductor 260 is positioned to be substantially aligned with the top surface of the insulator 250 and the top surface of the oxide 230*c*. The insulator 282 is in contact with each of the top surfaces of the conductor 260, the oxide 230*c*, the insulator 250, and the insulator 280.

An opening is formed in the insulator 214, the insulator 216, the insulator 222, and the insulator 224, and the conductor 247 is positioned in the opening. It is preferable that at least part of the top surface of the conductor 247 be exposed from the insulator 224, and the top surface of the conductor 247 be substantially aligned with the top surface of the insulator 224. A structure may be employed where the conductor 247 does not overlap with the oxide 230*a* and the oxide 230*b*.

Here, the conductor 247 is electrically connected to a circuit element such as a switch, a transistor, a capacitor, an inductor, a resistor, and a diode, a wiring, an electrode, or a terminal which are provided in a lower layer of the insulator 214. For example, a structure may be employed where the conductor 247 is electrically connected to a gate of a transistor provided below the insulator 214. Alternatively, a structure may be employed where the conductor 247 is electrically connected to one of electrodes of a capacitor provided below the insulator 214, for example.

The conductor 242*b* is provided over the oxide 243*b* and the conductor 247. The conductor 242*b* is in contact with at least part of the top surface of the conductor 247. By connecting the conductor 242*b* and the conductor 247 in such a manner, electrical resistance between the conductor 247 and a source or a drain of the transistor 200 can be reduced. Furthermore, by not overlapping the conductor 247 with the oxide 230*a* and the oxide 230*b*, and providing the conductor 242*b* to cover the top surface of the conductor 247, electrical resistance between the conductor 247 and the source or the drain of the transistor 200 can be further reduced.

With such a structure, frequency characteristics of a semiconductor device including the transistor 200 can be improved and favorable electric characteristics can be achieved.

It is preferable that, at least part of a circuit element such as a switch, a transistor, a capacitor, an inductor, a resistor, or a diode, a wiring, an electrode, or a terminal which is electrically connected to the conductor 247 overlaps with the oxide 230. This can reduce the area occupied by the transistor 200, the above-mentioned circuit element, the wiring, the electrode, or the terminal in a top view, so that the semiconductor device of this embodiment can achieve miniaturization or higher integration.

Note that the conductor 242*b* is provided to be in contact with the side surface of the oxide 243*b*, the side surface of the oxide 230*a*, and the side surface of the oxide 230*b* in some cases.

Although the conductor 247 is provided below the conductor 242*b* in FIGS. 1(A) and 1(B), the semiconductor device described in this embodiment is not limited thereto. For example, the conductor 247 may be provided below the conductor 242*a* or the conductor 247 may be provided below both of the conductor 242*a* and the conductor 242*b*.

It is preferable that the insulator 222, the insulator 272, the insulator 273, and the insulator 282 have a function of inhibiting diffusion of at least one of hydrogen (e.g., a hydrogen atom, a hydrogen molecule, and the like). In addition, it is preferable that the insulator 222, the insulator 272, the insulator 273, and the insulator 282 have a function of inhibiting diffusion of oxygen (e.g., at least one of an oxygen atom, an oxygen molecule, and the like). For example, preferably, the insulator 222, the insulator 272, the insulator 273, and the insulator 282 each have a lower permeability of one or both of oxygen and hydrogen than the insulator 224. Preferably, the insulator 222, the insulator 272, the insulator 273, and the insulator 282 each have a lower permeability of one or both of oxygen and hydrogen than the insulator 250. Preferably, the insulator 222, the insulator 272, the insulator 273, and the insulator 282 each have a lower permeability of one or both of oxygen and hydrogen than the insulator 280.

As illustrated in FIG. 1(B), the insulator 272 is preferably in contact with the top surface and side surface of the conductor 242*a*, the top surface and side surface of the conductor 242*b*, and the top surface of the insulator 224. The insulator 273 is preferably provided over and in contact with the insulator 272. Thus, the insulator 280 is isolated from the insulator 224, and the oxide 230 by the insulator 272 and the insulator 273.

The oxide 230 preferably includes the oxide 230*a* over the insulator 224, the oxide 230*b* over the oxide 230*a*, and the oxide 230*c* which is positioned over the oxide 230*b* and at least partly in contact with the top surface of the oxide 230*b*.

The transistor 200 has, in the region where a channel is formed (hereinafter also referred to as a channel formation region) and its vicinity, a structure in which three layers of the oxide 230*a*, the oxide 230*b*, and the oxide 230*c* are stacked; however, the present invention is not limited thereto. For example, a single layer of the oxide 230*b*, a two-layer structure of the oxide 230*b* and the oxide 230*a*, a two-layer structure of the oxide 230*b* and the oxide 230*c*, or a stacked-layer structure of four or more layers may be provided. Although the conductor 260 is shown to have a stacked-layer structure of two layers in the transistor 200, the present invention is not limited thereto. For example, the conductor 260 may have a single-layer structure or a stacked-layer structure of three or more layers.

Here, the conductor 260 functions as a gate electrode of the transistor, and the conductor 242*a* and the conductor 242*b* function as a source electrode and a drain electrode. In the transistor 200, the conductor 260 functioning as a gate electrode is formed in a self-aligned manner to fill an opening formed by the insulator 280 and the like. The formation of the conductor 260 in this manner allows the conductor 260 to be positioned certainly in the region between the conductor 242a and the conductor 242b without alignment.

In the transistor 200, as the oxide 230 (the oxide 230a, the oxide 230b, and the oxide 230c), which includes a channel formation region, a metal oxide functioning as an oxide semiconductor (hereinafter also referred to as an oxide semiconductor) is preferably used.

The transistor 200 using an oxide semiconductor in a channel formation region has an extremely low leakage current (off-state current) in a non-conduction state; thus, a semiconductor device with low power consumption can be provided. An oxide semiconductor can be deposited by a sputtering method or the like, and thus can be used for the transistor 200 included in a highly integrated semiconductor device.

For example, as the oxide 230, a metal oxide such as an In-M-Zn oxide (the element M is one kind or a plurality of kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used for the element M. Furthermore, as the oxide 230, an In—Ga oxide or an In—Zn oxide may be used.

The electrical characteristics of a transistor using an oxide semiconductor tend to have variations when impurities and oxygen vacancies exist in the channel formation region of the oxide semiconductor, and the reliability decreases in some cases. Moreover, if the region of the oxide semiconductor where a channel is formed includes oxygen vacancies, the transistor tends to have normally-on characteristics. Therefore oxygen vacancies in the region where a channel is formed are preferably reduced as much as possible. For example, oxygen is preferably supplied to the oxide 230 through the insulator 250 or the like to fill the oxygen vacancies. Thus, a transistor that has stable electrical characteristics with a small variation in electrical characteristics and improved reliability can be provided.

As illustrated in FIG. 1(B), in the transistor 200, an oxide 243 (the oxide 243a and the oxide 243b) is positioned between the top surface of the oxide 230b and a bottom surface of a conductor 242 (the conductor 242a, and the conductor 242b). In this structure, large parts of the conductor 242 and the oxide 230 are not in contact; thus, absorption of oxygen in the oxide 230 by the conductor 242 can be reduced. That is, inhibiting oxidization of the conductor 242 can inhibit the decrease in conductivity of the conductor 242. Accordingly, the oxide 243 preferably has a function of inhibiting oxidization of the conductor 242.

The oxide 243 preferably has conductivity. When the oxide 243, which has conductivity, is provided between the conductor 242 that functions as a source electrode or a drain electrode, and the oxide 230b, the electrical resistance between the conductor 242 and the oxide 230b can be reduced, which is preferable. Such a structure improves the electrical characteristics and reliability of the transistor 200. Note that the oxide 243 may have a crystal structure.

As the oxide 243, an oxide containing zinc can be used. For example, zinc oxide, gallium zinc oxide, indium zinc oxide, or indium gallium zinc oxide can be used. Alternatively, indium oxide or indium tin oxide may be used. The oxide 243 is preferably a metal oxide having a high bond energy between a metal atom and an oxygen atom. The conductivity of the oxide 243 is preferably higher than the conductivity of the oxide 230 (the oxide 230a, the oxide 230b, and the oxide 230c). The thickness of the oxide 243 is preferably larger than or equal to 1 nm and smaller than or equal to 10 nm, and more preferably, equal to or larger than 1 nm and smaller than or equal to 5 nm. The oxide 243 preferably has crystallinity. In the case where the oxide 243 has crystallinity release of oxygen from the oxide 230 can be favorably suppressed. For example, when the oxide 243 has a hexagonal crystal structure, release of oxygen from the oxide 230 can sometimes be inhibited.

As shown in FIGS. 1(B) and 1(C), the transistor 200 of one embodiment of the present invention has a structure in which the insulator 282 and the insulator 250 are directly in contact with each other. With such a structure, oxygen contained in the insulator 280 is less likely to be absorbed into the conductor 260. Therefore, oxygen contained in the insulator 280 can be injected into the oxide 230a and the oxide 230b efficiently through the oxide 230c; hence, oxygen vacancies in the oxide 230a and the oxide 230b can be reduced and the electric characteristics and the reliability of the transistor 200 can be improved. In addition, the mixing of impurities such as hydrogen contained in the insulator 280 into the insulator 250 can be suppressed, which can inhibit the adverse effects on the electrical characteristics and the reliability of the transistor 200. For the insulator 282, silicon nitride, silicon nitride oxide, aluminum oxide, or hafnium oxide can be used. For the insulator 282, it is favorable to use silicon nitride. The silicon nitride can favorably block an impurity (e.g., hydrogen or water) from the outside.

The insulator 272 and the insulator 273 preferably have a function of inhibiting the transmission of oxygen and impurities such as hydrogen and water.

Figure 3A:
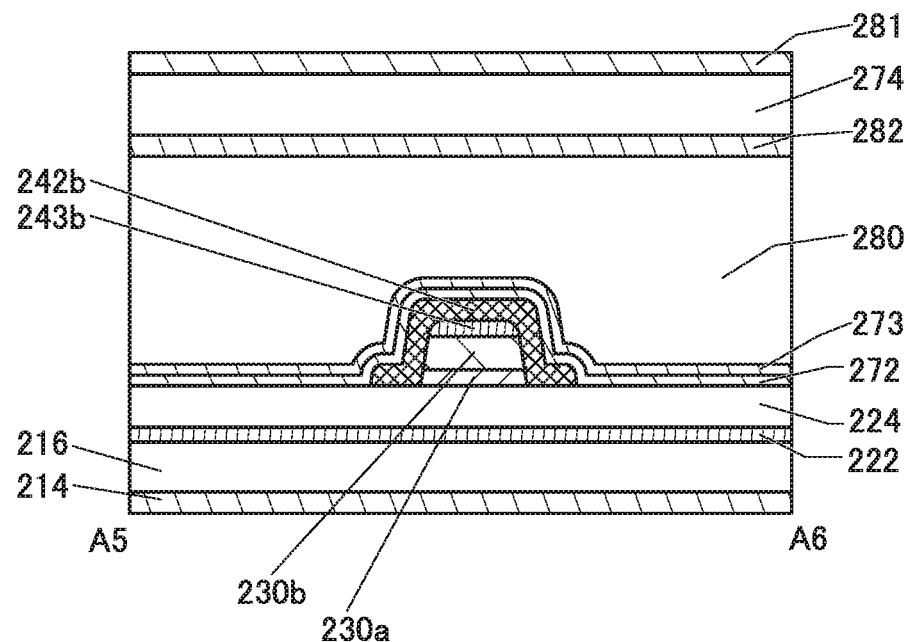
FIG. 3 (A)(B) Cross-sectional views of a semiconductor device of one embodiment of the present invention.

FIG. 3(A) is a cross-sectional view of a portion indicated by a dashed-dotted line A5-A6 in FIG. 1(A), and is also a cross-sectional view in the channel width direction of one of a source region and a drain region of the transistor 200. As illustrated in FIG. 3(A), a structure is employed in which the top surface of the conductor 242b and the side surface of the conductor 242b are covered with the insulator 272 and the insulator 273; thus, oxygen and impurities such as hydrogen and water can be inhibited from being diffused into the conductor 242b from the side surface direction of the conductor 242b and the top surface direction of the conductor 242b. Hence, diffusion of oxygen from the periphery of the conductor 242b into the conductor 242b can be inhibited, whereby the oxidation of the conductor 242b can be inhibited. Note that a similar effect can also be obtained with the conductor 242a. Impurities such as hydrogen and water can be inhibited from being diffused into the oxide 230a and the oxide 230b from the side surface direction of the oxide 230a and the side surface direction of the oxide 230b. For the insulator 272, a silicon oxide film, a silicon nitride film, or a silicon nitride oxide film can be used, for example. For the insulator 273, aluminum oxide or hafnium oxide can be used, for example.

Figure 3B:
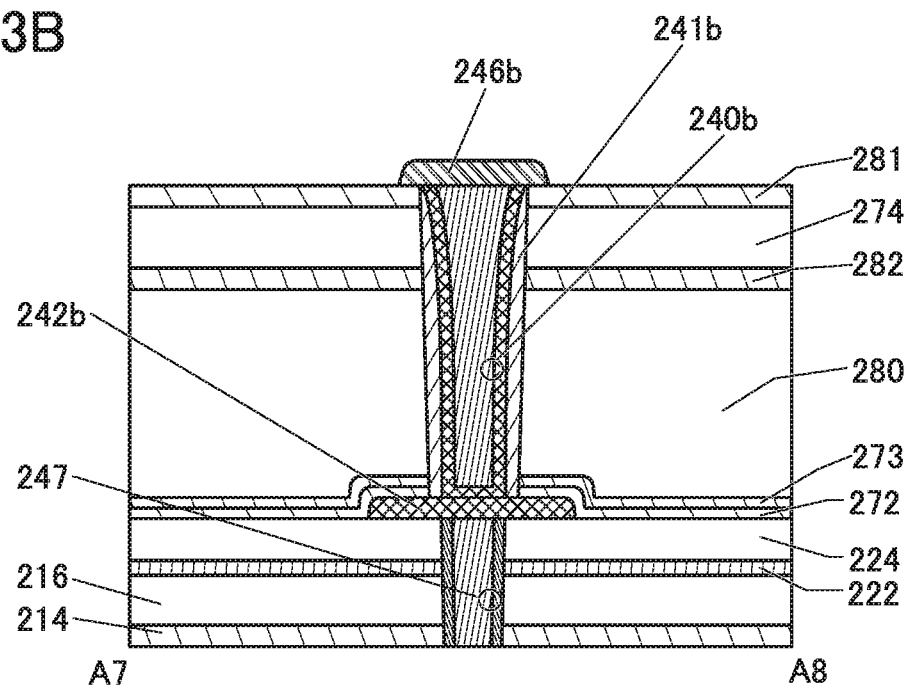

FIG. 3(B) is a cross-sectional view of a portion indicated by a dashed-dotted line A7-A8 in FIG. 1(A), which corresponds to a cross-sectional view in the channel width direction of the conductor 240b electrically connected to the transistor 200 and functioning as a plug. As illustrated in FIG. 3(B), the conductor 240b is provided in contact with the top surface of the conductor 242b. Since the insulator 241b is provided at the side surface of the conductor 240b, oxygen and impurities such as hydrogen and water from the insulator 280 can be prevented from diffusing into the conductor 240b. Note that a similar effect can also be obtained with the conductor 240a.

As illustrated in FIGS. 1(A) and 1(B) and FIG. 3(B), the conductor 240b is preferably provided to overlap with at least part of the conductor 247. Accordingly, the area occupied by the conductor 240b and the conductor 247 in a top view can be reduced, leading to miniaturization or higher integration of the semiconductor device of this embodiment.

As shown in FIG. 1(C), with the bottom surface of the insulator 224 as a reference, the height of the bottom surface of the conductor 260 in a region where the conductor 260 does not overlap with the oxide 230a and the oxide 230b is preferably positioned in a position lower than the height of the bottom surface of the oxide 230b. A difference between the level of the bottom surface of the conductor 260 in a region where the oxide 230b does not overlap with the conductor 260 and the level of the bottom surface of the oxide 230b is set to greater than or equal to 0 nm and less than or equal to 100 nm, preferably greater than or equal to 3 nm and less than or equal to 50 nm, and further preferably greater than or equal to 5 nm and less than or equal to 20 nm.

As described above, the conductor 260, which functions as the gate electrode, covers the side surface and the top surface of the oxide 230b of the channel formation region, with the oxide 230c and the insulator 250 positioned therebetween; this enables the electrical field of the conductor 260 to easily affect the entire oxide 230b of the channel formation region. Thus, the on-state current of the transistor 200 can be increased and the frequency characteristics of the transistor 200 can be improved.

Accordingly, a semiconductor device that is miniaturized or highly integrated can be provided. Alternatively, a semiconductor device including a transistor with high on-state current can be provided. Alternatively, a semiconductor device including a transistor with high frequency characteristics can be provided. Alternatively, a semiconductor device that has stable electrical characteristics with reduced variations in electrical characteristics and higher reliability can be provided. Alternatively, a semiconductor device including a transistor with low off-state current can be provided.

The detailed structure of the semiconductor device including the transistor 200 according to one embodiment of the present invention is described below.

The conductor 205 is provided to overlap with the oxide 230 and the conductor 260. Furthermore, the conductor 205 is preferably provided to be embedded in the insulator 214 and the insulator 216.

Here, the conductor 260 sometimes functions as a first gate (also referred to as top gate) electrode. Alternatively, the conductor 205 sometimes functions as a second gate (also referred to as bottom gate) electrode. In that case, $V_{th}$ of the transistor 200 can be controlled by changing a potential applied to the conductor 205 independently of a potential applied to the conductor 260. In particular, $V_{th}$ of the transistor 200 can be higher than 0 V and the off-state current can be reduced by applying a negative potential to the conductor 205. Thus, drain current when a potential applied to the conductor 260 is 0 V can be lower in the case where a negative potential is applied to the conductor 205 than in the case where the negative potential is not applied to the conductor 205.

As illustrated in FIG. 1(A), the size of the conductor 205 is preferably larger than the size of the region of the oxide 230 that does not overlap with the conductor 242a or the conductor 242b. As illustrated in FIG. 1(C), it is particularly preferable that the conductor 205 also extend to a region outside an end portion of the oxide 230 that intersects with the channel width direction. That is, the conductor 205 and the conductor 260 preferably overlap with each other with the insulators therebetween on an outer side of the side surface of the oxide 230 in the channel width direction. A large conductor 205 can sometimes reduce local charging, (referred to as charge up) in a treatment using plasma of a fabrication step after the formation of the conductor 205. Note that one embodiment of the present invention is not limited thereto. The conductor 205 is at least overlapped with the oxide 230 positioned between the conductor 242a and the conductor 242b.

Furthermore, with the above structure, the channel formation region can be electrically surrounded by the electric field of the conductor 260 functioning as the first gate electrode and the electric field of the conductor 205 functioning as the second gate electrode. In this specification, a transistor structure in which a channel formation region is electrically surrounded by electric fields of a first gate electrode and a second gate electrode is referred to as a surrounded channel (S-channel) structure.

The conductor 205a is preferably a conductor that inhibits the transmission of oxygen and impurities such as water and hydrogen. For example, titanium, titanium nitride, tantalum, or tantalum nitride can be used for the conductor 205a. Moreover, the conductor 205b is preferably formed using a conductive material containing tungsten, copper, or aluminum as its main component. Although the conductor 205 is illustrated as having two layers, the conductor 205 can have a multilayer structure with three or more layers.

The insulator 214 and the insulator 272, and the insulator 281 preferably function as a barrier insulating film that inhibits impurities such as water or hydrogen from entering the transistor 200 from the substrate side or from above. Thus, the insulator 214, the insulator 272, and the insulator 281 are preferably formed using an insulating material having a function of inhibiting diffusion of impurities (through which the impurities are unlikely to pass) such as a hydrogen atom, a hydrogen molecule, a water molecule, a nitrogen atom, a nitrogen molecule, a nitrogen oxide molecule (e.g., $N_2O$, NO, or $NO_2$), or a copper atom. Alternatively, it is preferable to use an insulating material having a function of inhibiting diffusion of oxygen (e.g., at least one of an oxygen atom, an oxygen molecule, and the like) (or through which the above oxygen is less likely to pass).

For example, it is preferable that silicon nitride or the like be used for the insulator 214, the insulator 272, and the insulator 281. Accordingly, impurities such as water or hydrogen can be inhibited from being diffused into the transistor 200 side from the substrate side through the insulator 214. Alternatively, oxygen contained in the insulator 224 and the like can be prevented from being diffused to the substrate side of the insulator 214. Impurities such as water or hydrogen can be inhibited from diffusing into the transistor 200 side from the insulator 280 and/or the conductor 246 and the like, which are provided above the insulator 272.

The resistivities of the insulator 214, the insulator 272, and the insulator 281 are preferably low in some cases. For example, by setting the resistivities of the insulator 214, the insulator 272, and the insulator 281 to approximately $1\times10^{13}$ $\Omega$cm, the insulator 214, the insulator 272, and the insulator 281 can reduce charge up of the conductor 205, the conductor 242 or the conductor 260 in a treatment using plasma or the like of a fabrication step of a semiconductor device in some cases. The resistivities of the insulator 214, the insulator 272, and the insulator 281 are preferably higher than or equal to $1\times10^{10}$ Ωcm and lower than or equal to $1\times10^{15}$ Ωcm.

The insulator 214 may have a stacked-layer structure. For example, it is preferable that a stacked-layer structure of an aluminum oxide film and a silicon nitride film be used as the insulator 214. With the aluminum oxide film, oxygen can be supplied to a lower part of the insulator 214. Furthermore, diffusion of impurities such as hydrogen and water that enter the transistor 200 side from the substrate side can be suppressed by the silicon nitride film.

The insulator 216, the insulator 280, and the insulator 274 preferably have a lower permittivity than the insulator 214. When a material with a low permittivity is used for an interlayer film, the parasitic capacitance generated between wirings can be reduced. For each of the insulator 216, the insulator 280, and the insulator 274, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

The insulator 222 and the insulator 224 each have a function of a gate insulator.

Here, it is preferable that the insulator 224 in contact with the oxide 230 release oxygen by heating. In this specification, oxygen that is released by heating is referred to as excess oxygen in some cases. For example, for the insulator 224, silicon oxide, silicon oxynitride, or the like is used as appropriate. When an insulator containing oxygen is provided in contact with the oxide 230, oxygen vacancies in the oxide 230 can be reduced and the reliability of the transistor 200 can be improved.

As the insulator 224, specifically, an oxide material from which part of oxygen is released by heating is preferably used. An oxide that releases oxygen by heating is an oxide film in which the amount of released oxygen converted into oxygen molecules is greater than or equal to $1.0\times10^{18}$ molecules/cm, preferably greater than or equal to $1.0\times10^{19}$ molecules/cm, further preferably greater than or equal to $2.0\times10^{19}$ molecules/cm$^3$ or greater than or equal to $3.0\times10^{20}$ molecules/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

The insulator 222 preferably functions as a barrier insulating film that inhibits impurities such as water and hydrogen from entering the transistor 200 from the substrate side. For example, the insulator 222 preferably has lower hydrogen permeability than the insulator 224. Surrounding the insulator 224, the oxide 230, and the like by the insulator 222 and the insulator 272 can inhibit entry of impurities such as water or hydrogen into the transistor 200 from the outside.

Furthermore, the insulator 222 preferably has a function of inhibiting diffusion of oxygen (e.g., at least one of an oxygen atom, an oxygen molecule, and the like)(or is less likely to transmit the above oxygen). For example, the insulator 222 preferably has lower oxygen permeability than the insulator 224. When the insulator 222 has a function of inhibiting diffusion of oxygen or impurities, diffusion of oxygen included in the oxide 230 into an area below the insulator 222 can be reduced, which is preferable. Furthermore, the conductor 205 can be inhibited from reacting with oxygen contained in the insulator 224 or the oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer that inhibits release of oxygen from the oxide 230 and entry of impurities such as hydrogen from the periphery of the transistor 200 into the oxide 230.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

Alternatively, for example, a single layer or stacked layers of an insulator containing what is called a high-k material such as aluminum oxide, hafnium oxide, tantalum oxide, zirconium oxide, lead zirconate titanate (PZT), strontium titanate (SfTiO$_3$), or (Ba,Sr)TiO$_3$ (BST) may be used for the insulator 222. With miniaturization and high integration of transistors, a problem such as leakage current may arise because of a thinner gate insulator. When a high-k material is used for an insulator functioning as the gate insulator, a gate potential during operation of the transistor can be reduced while the physical thickness of the gate insulator is kept.

Note that the insulator 222 and the insulator 224 may each have a stacked-layer structure of two or more layers. In that case, without limitation to a stacked-layer structure formed of the same material, a stacked-layer structure formed of different materials may be employed.

The conductor 247 may also have a structure in which a first conductive layer and a second conductive layer positioned on an inner side of the first conductive layer like the conductor 205. The first conductive layer of the conductor 247 is preferably a conductor that inhibits the transmission of oxygen and impurities such as water and hydrogen. For example, titanium, titanium nitride, tantalum, or tantalum nitride can be used. A conductive material containing tungsten, copper, or aluminum as its main component is preferably used for the second conductive layer of the conductor 247. Although the conductor 247 is illustrated as having two layers, the conductor 247 can have a multilayer structure with three or more layers.

An insulator that inhibits the diffusion of oxygen and impurities such as hydrogen and water like the insulator 241 may be provided at the side surface of the conductor 247 like the conductor 240.

The oxide 230 includes the oxide 230a, the oxide 230b over the oxide 230a, and the oxide 230c over the oxide 230b. Including the oxide 230a below the oxide 230b makes it possible to inhibit diffusion of impurities into the oxide 230b from the components formed below the oxide 230a. Moreover, including the oxide 230c over the oxide 230b makes it possible to inhibit diffusion of impurities into the oxide 230b from the components formed above the oxide 230c.

Note that the oxide 230 preferably has a stacked-layer structure of oxides that differ in the atomic ratio of metal atoms. Specifically, the atomic ratio of the element M to the constituent elements in the metal oxide used for the oxide 230a is preferably greater than the atomic ratio of the element M to the constituent elements in the metal oxide used for the oxide 230b. Moreover, the atomic ratio of the element M to In in the metal oxide used for the oxide 230a is preferably greater than the atomic ratio of the element M to In in the metal oxide used for the oxide 230b. Furthermore, the atomic ratio of In to the element M in the metal oxide used for the oxide 230b is preferably greater than the atomic ratio of In to the element M in the metal oxide used for the oxide 230a. A metal oxide that can be used for the oxide 230a or the oxide 230b can be used for the oxide 230c.

The oxide 230b preferably has crystallinity. For example, a CAAC-OS (c-axis aligned crystalline oxide semiconductor) described later is preferably used. An oxide having crystallinity, such as a CAAC-OS, has a dense structure with small amounts of impurities and defects (oxygen vacancies or the like) and high crystallinity. This can inhibit oxygen extraction from the oxide 230b by the source electrode or the drain electrode. This can reduce oxygen extraction from the oxide 230b even when heat treatment is performed; thus, the transistor 200 is stable with respect to high temperatures in a manufacturing process (what is called thermal budget).

The energy of the conduction band minimum of each of the oxide 230a and the oxide 230c is preferably higher than the energy of the conduction band minimum of the oxide 230b. In other words, the electron affinity of each of the oxide 230a and the oxide 230c is preferably smaller than the electron affinity of the oxide 230b.

Here, the energy level of the conduction band minimum gradually changes at junction portions of the oxide 230a, the oxide 230b, and the oxide 230c. In other words, the energy level of the conduction band minimum at the junction portions of the oxide 230a, the oxide 230b, and the oxide 230c continuously changes or is continuously connected. To obtain this, the density of defect states in a mixed layer formed at an interface between the oxide 230a and the oxide 230b and an interface between the oxide 230b and the oxide 230c is preferably made low.

Specifically, as the oxide 230a, a metal oxide with In:Ga:Zn=1:3:4 [atomic ratio] or 1:1:0.5 [atomic ratio] is used. As the oxide 230b, a metal oxide with In:Ga:Zn=4:2:3 [atomic ratio] or 1:1:1 [atomic ratio] is used. As the oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Specific examples of the oxide 230c having a stacked-layer structure include a stacked-layer structure of In:Ga:Zn=4:2:3 [atomic ratio] and In:Ga:Zn=1:3:4 [atomic ratio], a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

At this time, the oxide 230b serves as a main carrier path. When the oxide 230a and the oxide 230c have the above structure, the density of defect states at the interface between the oxide 230a and the oxide 230b and the interface between the oxide 230b and the oxide 230c can be made low. Thus, the influence of interface scattering on carrier conduction is small, and the transistor 200 can have high on-state current and high frequency characteristics. Note that in the case where the oxide 230c has a stacked-layer structure, in addition to the reduction of density of defect states at the interface between the oxide 230b and the oxide 230c, the inhibition of diffusion of the constituent element of the oxide 230c to the insulator 250 side is expected. More specifically, since the oxide 230c has a stacked-layer structure in which an oxide that does not contain In is positioned in the upper layer, the diffusion of In to the insulator 250 side can be inhibited. Since the insulator 250 functions as a gate insulator, the transistor exhibits poor characteristics when In diffuses. Thus, when the oxide 230c has a stacked-layer structure, a highly reliable semiconductor device can be provided.

A metal oxide functioning as an oxide semiconductor is preferably used as the oxide 230. For example, a metal oxide whose energy gap is greater than or equal to 2 eV, preferably greater than or equal to 2.5 eV, is preferably used. With use of a metal oxide having such a wide energy gap, the off-state current of the transistor can be reduced. With the use of such a transistor, a semiconductor device with low power consumption can be provided.

Figure 12:
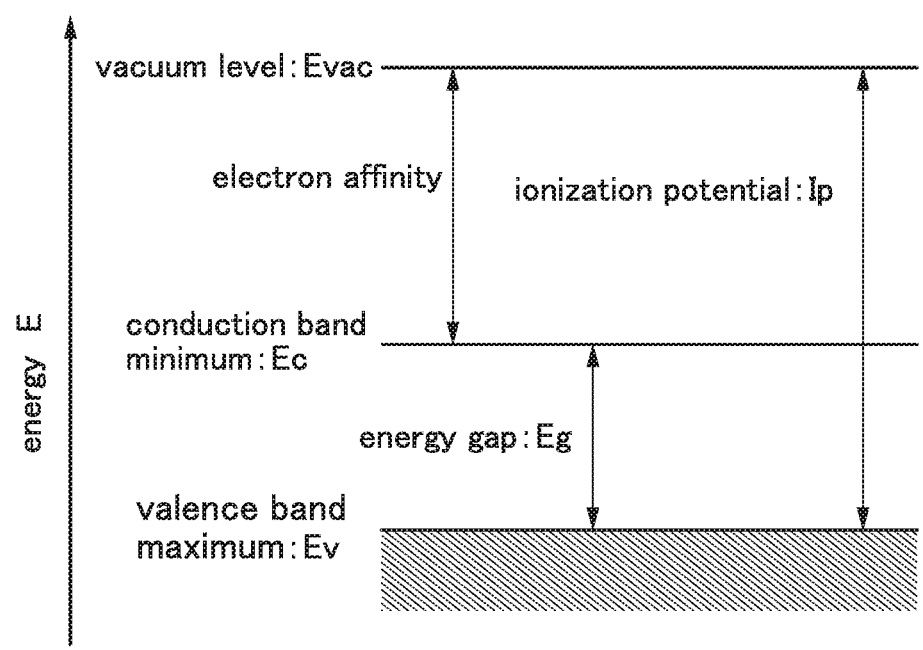
FIG. 12 A diagram illustrating an energy band structure of an oxide semiconductor.

Electron affinity or conduction band minimum Ec can be obtained from an energy gap Eg and an ionization potential Ip, which is a difference between a vacuum level and an energy of valence band maximum Ev, as shown in FIG. 12. The ionization potential $I_p$ can be measured using, for example, an ultraviolet photoelectron spectroscopy (UPS) apparatus. The energy gap $E_g$ can be measured using, for example, a spectroscopic ellipsometer.

The oxide 243 is provided over the oxide 230b, and the conductor 242 (the conductor 242a and the conductor 242b) functioning as the source electrode and the drain electrode is provided over the oxide 243. The thickness of the conductor 242 is greater than or equal to 1 nm and less than or equal to 50 nm, preferably greater than or equal to 2 nm and less than or equal to 25 nm, for example.

For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen.

The insulator 250 functions as a gate insulator. The insulator 250 is preferably placed in contact with the top surface of the oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which have thermal stability, are preferable.

The insulator 250 is preferably formed using an insulator from which oxygen is released by heating as in the insulator 224. When an insulator from which oxygen is released by heating is provided as the insulator 250 in contact with the top surface of the oxide 230c, oxygen can be efficiently supplied to the channel formation region of the oxide 230b. Furthermore, as in the insulator 224, the concentration of impurities such as water or hydrogen in the insulator 250 is preferably reduced. The thickness of the insulator 250 is preferably greater than or equal to 1 nm and less than or equal to 20 nm.

Furthermore, a metal oxide may be provided between the insulator 250 and the conductor 260. The metal oxide preferably inhibits diffusion of oxygen from the insulator 250 to the conductor 260. Provision of the metal oxide that inhibits diffusion of oxygen inhibits diffusion of oxygen from the insulator 250 to the conductor 260. That is, a reduction in the amount of oxygen supplied to the oxide 230 can be inhibited. In addition, oxidation of the conductor 260 due to oxygen from the insulator 250 can be inhibited.

In addition, the metal oxide has a function of part of the gate insulator in some cases. Therefore, when silicon oxide, silicon oxynitride, or the like is used for the insulator 250, a metal oxide that is a high-k material with high relative permittivity is preferably used for the metal oxide. When the gate insulator has a stacked-layer structure of the insulator 250 and the metal oxide, the stacked-layer structure can be thermally stable and have high relative permittivity. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, a metal oxide containing one kind or a plurality of kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, such as aluminum oxide, hafnium oxide, or an oxide containing aluminum and hafnium (hafnium aluminate).

The metal oxide has a function of part of the gate electrode in some cases. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

Although FIG. 1 shows that the conductor 260 has a two-layer structure, the conductor 260 may have a single-layer structure or a stacked-layer structure of three or more layers.

For the conductor 260a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, and the like), and a copper atom. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As a conductive material having a function of inhibiting oxygen diffusion, for example, tantalum, tantalum nitride, ruthenium, ruthenium oxide, or the like is preferably used.

A conductive material containing tungsten, copper, or aluminum as its main component is preferably used for the conductor 260b. The conductor 260 also functions as a wiring and thus is preferably formed using a conductor having high conductivity. For example, a conductive material containing tungsten, copper, or aluminum as its main component can be used. The conductor 260b may have a stacked-layer structure, for example, a stacked-layer structure of any of the above conductive materials and titanium or titanium nitride.

For example, for the insulator 280, silicon oxide, silicon oxynitride, silicon nitride oxide, silicon oxide to which fluorine is added, silicon oxide to which carbon is added, silicon oxide to which carbon and nitrogen are added, porous silicon oxide, or the like is preferably included. In particular, silicon oxide and silicon oxynitride, which have thermal stability, are preferable. Materials such as silicon oxide, silicon oxynitride, and porous silicon oxide, in each of which a region containing oxygen released by heating can be easily formed, are particularly preferable.

The concentration of impurities such as water or hydrogen in the insulator 280 is preferably lowered. In addition, the top surface of the insulator 280 may be planarized.

The insulator 282 preferably functions as a barrier insulating film that inhibits impurities such as water and hydrogen from entering the insulator 280 from the above. As the insulator 282, an insulator such as aluminum oxide, silicon nitride, or silicon nitride oxide may be used.

The insulator 274 functioning as an interlayer film is preferably provided over the insulator 282. As in the insulator 224 or the like, the concentration of impurities such as water or hydrogen in the insulator 274 is preferably lowered.

For the conductor 240a and the conductor 240b, a conductive material containing tungsten, copper, or aluminum as its main component is preferably used. In addition, the conductor 240a and the conductor 240b may each have a stacked-layer structure.

In the case where the conductor 240 has a stacked-layer structure, a conductive material having a function of inhibiting the transmission of an impurity such as water or hydrogen is preferably used for a conductor in contact with the insulator 281, the insulator 274, the insulator 282, the insulator 280, the insulator 273, and the insulator 272. For example, tantalum, tantalum nitride, titanium, titanium nitride, ruthenium, ruthenium oxide, or the like is preferably used. A single layer or a stacked layer of the conductive material having a function of inhibiting the transmission of impurities such as water or hydrogen may be used. The use of the conductive material can prevent oxygen added to the insulator 280 from being absorbed by the conductor 240a and the conductor 240b. Moreover, the mixing of impurities such as water or hydrogen into the oxide 230 through the conductor 240a and the conductor 240b from a layer above the insulator 281 can be inhibited.

As the insulator 241a and the insulator 241b, an insulator such as aluminum oxide, silicon nitride, or silicon nitride oxide may be used. Since the insulator 241a and the insulator 241b are provided in contact with the insulator 272 and the insulator 273, the mixing of impurities such as water or hydrogen into the oxide 230 through the conductor 240a and the conductor 240b from the insulator 280 or the like can be inhibited. In addition, oxygen contained in the insulator 280 can be prevented from being absorbed by the conductor 240a and the conductor 240b.

The conductor 246 (the conductor 246a and the conductor 246b) functioning as a wiring may be provided in contact with a top surface of the conductor 240a and a top surface of the conductor 240b. The conductor 246 is preferably formed using a conductive material containing tungsten, copper, or aluminum as its main component. Furthermore, the conductor may have a stacked-layer structure; for example, stacked layers of the above conductive material, and titanium or titanium nitride. Note that the conductor may be formed to be embedded in an opening provided in an insulator.

Note that in the semiconductor device illustrated in FIG. 1, a structure is employed where the conductor 240b, the insulator 241b, and the conductor 246b are provided; however, a structure where these are not provided can be employed.

<Constituent Material of Semiconductor Device>

Constituent materials that can be used for the semiconductor device are described below.

<Substrate>

As a substrate over which the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. In addition, examples of the semiconductor substrate include a semiconductor substrate including silicon, germanium, or the like as a material, and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<Insulator>

Examples of an insulator include an oxide, a nitride, an oxynitride, a nitride oxide, a metal oxide, a metal oxynitride, and a metal nitride oxide, each of which has an insulating property.

As miniaturization and high integration of the transistor progress, for example, a problem such as leakage current may arise because of a thinner gate insulator. When a high-k material is used for the insulator functioning as a gate insulator, the voltage when the transistor operates can be reduced while keeping the physical thickness of the gate insulator. In contrast, when a material with low relative permittivity is used for the insulator functioning as an interlayer film, parasitic capacitance generated between wirings can be reduced. Thus, a material is preferably selected depending on the function of an insulator.

In addition, examples of the insulator with high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

In addition, examples of the insulator with low relative permittivity include silicon oxide, silicon oxynitride, silicon nitride oxide, silicon oxide to which fluorine is added, silicon oxide to which carbon is added, silicon oxide to which carbon and nitrogen are added, porous silicon oxide, and a resin.

Furthermore, when a transistor using an oxide semiconductor is surrounded by an insulator having a function of inhibiting the transmission of oxygen and impurities such as hydrogen, the electrical characteristics of the transistor can be stable. For the insulator having a function of inhibiting the transmission of oxygen and impurities such as hydrogen, a single layer or stacked layers of an insulator containing for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; a metal nitride such as aluminum nitride, aluminum titanium nitride, titanium nitride, silicon nitride oxide or silicon nitride; or the like can be used.

In addition, the insulator functioning as the gate insulator is preferably an insulator including a region containing oxygen released by heating. For example, when a structure is employed in which silicon oxide or silicon oxynitride including a region containing oxygen released by heating is in contact with the oxide 230, oxygen vacancies included in the oxide 230 can be compensated for.

<Conductor>

For the conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum, an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure in which a material containing the above metal element and a conductive material containing oxygen are combined is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With use of such a material, hydrogen contained in the metal oxide where the channel is formed can be trapped in some cases. Alternatively, hydrogen entering from an external insulator or the like can be trapped in some cases.

<Metal Oxide>

As the oxide 230, a metal oxide functioning as an oxide semiconductor is preferably used. A metal oxide that can be applied to the oxide 230 of the present invention is described below.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Examples of other elements that can be used as the element M include boron, titanium, iron, nickel, germanium, zirconium, molybdenum, lanthanum, cerium, neodymium, hafnium, tantalum, tungsten, and magnesium. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) can be classified into a single crystal oxide semiconductor and a non-single-crystal oxide semiconductor. Examples of the non-single-crystal oxide semiconductors include a CAAC-OS, a polycrystalline oxide semiconductor, an nc-OS, an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that a clear crystal grain boundary (also referred to as grain boundary) is difficult to observe even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter referred to as an In layer) and a layer containing the element M, zinc, and oxygen (hereinafter referred to as an (M,Zn) layer) are stacked. Note that indium and the element M can be replaced with each other, and when the element M in the (M,Zn) layer is replaced with indium, the layer can also be referred to as an (n,M,Zn) layer. Furthermore, when indium in the In layer is replaced with the element M, the layer can be referred to as an (In,M) layer.

The CAAC-OS is a metal oxide with high crystallinity. By contrast, in the CAAC-OS, a reduction in electron mobility due to the crystal grain boundary is less likely to occur because it is difficult to observe a clear crystal grain boundary. Furthermore, entry of impurities, formation of defects, or the like might decrease the crystallinity of a metal oxide, which means that the CAAC-OS is a metal oxide having small amounts of impurities and defects (e.g., oxygen vacancies (VO)). Thus, a metal oxide including a CAAC-OS is physically stable. Therefore, the metal oxide including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor.

The a-like OS includes a void or a low-density region. That is, the a-like OS has low crystallinity compared with the nc-OS and the CAAC-OS.

An oxide semiconductor (metal oxide) can have various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

Note that a structure of an oxide semiconductor (metal oxide) in the semiconductor device of one embodiment of the present invention is not particularly limited; however, the oxide semiconductor (metal oxide) preferably has crystallinity. For example, the oxide 230 can have a CAAC-OS structure and the oxide 243 can have a hexagonal crystal structure. The semiconductor device can have high reliability when the oxide 230 and the oxide 243 have the above crystal structure.

[Impurities]

Here, the influence of each impurity in the metal oxide will be described.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS (the concentration of an alkali metal or an alkaline earth metal obtained by secondary ion mass spectrometry) is set lower than or equal to $1 \times 10^{18}$ atoms/cm$^3$, preferably lower than or equal to $2 \times 10^{16}$ atoms/cm$^3$.

Hydrogen contained in a metal oxide reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using a metal oxide containing hydrogen is likely to have normally-on characteristics.

Accordingly, hydrogen in the metal oxide is preferably reduced as much as possible. Specifically, the hydrogen concentration of the metal oxide obtained by SIMS is set lower than $1 \times 10^{20}$ atoms/cm, preferably lower than $1 \times 10^{91}$ atoms/cm$^3$, further preferably lower than $5 \times 10^{18}$ atoms/cm$^3$, still further preferably lower than $1 \times 10^{18}$ atoms/cm$^3$. When a metal oxide in which the impurities are sufficiently reduced is used in a channel formation region of a transistor, stable electrical characteristics can be given.

Note that as a metal oxide used for a semiconductor of a transistor, a thin film having high crystallinity is preferably used. With use of the thin film, the stability or reliability of the transistor can be improved. Examples of the thin film include a thin film of a single-crystal metal oxide and a thin film of a polycrystalline metal oxide. However, to form the thin film of a single-crystal metal oxide or the thin film of a polycrystalline metal oxide over a substrate, a high-temperature process or a laser heating process is needed. Thus, manufacturing cost is increased, and throughput is decreased.

Non-Patent Document 1 and Non-Patent Document 2 have reported that an In—Ga—Zn oxide having a CAAC structure (referred to as CAAC-IGZO) was found in 2009. Here, it has been reported that CAAC-IGZO has c-axis alignment, a crystal grain boundary is not clearly observed in CAAC-IGZO, and CAAC-IGZO can be formed over a substrate at low temperatures. It has also been reported that a transistor using CAAC-IGZO has excellent electrical characteristics and high reliability.

In addition, an In—Ga—Zn oxide having an nc structure (referred to as nc-IGZO) was found in 2013 (see Non-Patent Document 3). Here, it has been reported that nc-IGZO has periodic atomic arrangement in a microscopic region (for example, a region with a size greater than or equal to 1 nm and less than or equal to 3 nm) and there is no regularity of crystal orientation between different regions.

Non-Patent Document 4 and Non-Patent Document 5 have shown changes in average crystal size due to electron beam irradiation to thin films of CAAC-IGZO, nc-IGZO, and IGZO having low crystallinity. In the thin film of IGZO having low crystallinity, crystalline IGZO with a size of approximately 1 nm was observed even before electron beam irradiation. Thus, here, it has been reported that the existence of a completely amorphous structure could not be observed in IGZO. In addition, it has been shown that the thin film of CAAC-IGZO and the thin film of nc-IGZO each have higher stability to electron beam irradiation than the thin film of IGZO having low crystallinity. Thus, the thin film of CAAC-IGZO or the thin film of nc-IGZO is preferably used for the semiconductor of the transistor.

Non-Patent Document 6 shows that a transistor using a metal oxide has an extremely low leakage current in an off state; specifically, the off-state current per micrometer in the channel width of the transistor is of the order of yA/μm ($10^{-24}$ A/μm). For example, a CPU with low power consumption utilizing a characteristic of a low leakage current of the transistor using a metal oxide is disclosed (see Non-Patent Document 7).

Furthermore, application of a transistor using a metal oxide to a display device that utilizes the characteristic of a low leakage current of the transistor has been reported (see Non-Patent Document 8). In the display device, a displayed image is changed several tens of times per second. The number of times an image is changed per second is referred to as a refresh rate. The refresh rate is also referred to as drive frequency. Such high-speed screen change that is hard for human eyes to recognize is considered as a cause of eyestrain. Thus, it is proposed that the refresh rate of the display device is lowered to reduce the number of times of image rewriting. Moreover, driving with a lowered refresh rate can reduce the power consumption of the display device. Such a driving method is referred to as idling stop (IDS) driving.

The discovery of the CAAC structure and the nc structure has contributed to an improvement in electrical characteristics and reliability of a transistor using a metal oxide having the CAAC structure or the nc structure, a reduction in manufacturing cost, and an improvement in throughput. Furthermore, applications of the transistor to a display device and an LSI utilizing the property of low leakage current of the transistor have been studied.

<Fabrication Method of Semiconductor Device>

Next, a method for fabricating a semiconductor device including the transistor 200 according to the present invention, which is illustrated in FIG. 1, will be described with reference to FIG. 4 to FIG. 11. In FIG. 4 to FIG. 11, (A) of each drawing is a top view. Moreover, (B) of each drawing is a cross-sectional view corresponding to a portion indicated by the dashed-dotted line A1-A2 in (A), and is also a cross-sectional view in the channel length direction of the transistor 200. Moreover, (C) in each drawing is a cross-sectional view corresponding to a portion indicated by a dashed-dotted line A3-A4 in (A), and is also a cross-sectional view of the transistor 200 in the channel width direction. Note that for clarity of the drawing, some components are not illustrated in the top view of (A) in each drawing.

First, a substrate (not illustrated) is prepared, and the insulator 214 is deposited over the substrate. The insulator 214 can be deposited by a sputtering method, a chemical vapor deposition (CVD) method, a molecular beam epitaxy (MBE) method, a pulsed laser deposition (PLD) method, an ALD (Atomic Layer Deposition) method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method that does not use plasma, and thus the yield of the semiconductor device can be increased. In addition, the thermal CVD method does not cause plasma damage during deposition, so that a film with few defects can be obtained.

In addition, in an ALD method, one atomic layer can be deposited at a time using self-regulating characteristics of atoms. Thus, the ALD method has advantages such as deposition of an extremely thin film, deposition on a component with a high aspect ratio, deposition of a film with a small number of defects such as pinholes, deposition with good coverage, and low-temperature deposition. Furthermore, the ALD method includes a plasma enhanced ALD (PEALD) method that is a deposition method using plasma. The use of plasma is sometimes preferable because deposition at lower temperature is possible. Note that a precursor used in the ALD method sometimes contains impurities such as carbon. Thus, in some cases, a film provided by the ALD method contains impurities such as carbon in a larger amount than a film provided by another deposition method. Note that impurities can be quantified by X-ray photoelectron spectroscopy (XPS).

Unlike a film formation method in which particles ejected from a target or the like are deposited, a CVD method and an ALD method are film deposition methods in which a film is deposited by reaction at a surface of an object. Thus, a CVD method and an ALD method are film deposition methods that enable favorable step coverage almost regardless of the shape of an object. In particular, an ALD method has excellent step coverage and excellent thickness uniformity and thus is suitable for covering a surface of an opening with a high aspect ratio, for example. On the other hand, an ALD method has a relatively low deposition rate, and thus is preferably used in combination with another film deposition method with a high deposition rate, such as a CVD method, in some cases.

When a CVD method or an ALD method is used, the composition of a film to be deposited can be controlled with a flow rate ratio of source gases. For example, by a CVD method or an ALD method, a film with a certain composition can be deposited depending on the flow rate ratio of the source gases. Moreover, with a CVD method or an ALD method, by changing the flow rate ratio of the source gases while depositing the film, a film whose composition is continuously changed can be formed. In the case of depositing a film while changing the flow rate ratio of source gases, as compared with the case of depositing a film with use of a plurality of deposition chambers, time taken for the deposition can be shortened because time taken for transfer and pressure adjustment is not required. Thus, the productivity of the semiconductor device can be increased in some cases.

In this embodiment, for the insulator 214, silicon nitride is deposited by a CVD method. As described here, an insulator through which copper such as silicon nitride is less likely to pass, is used for the insulator 214; accordingly, even when a metal that is likely to diffuse copper or the like is used for a conductor of a lower layer (not illustrated) of the insulator 214, diffusion of the metal into the upper layer of the insulator 214 can be inhibited.

Next, the insulator 216 is deposited over the insulator 214. The insulator 216 can be deposited by a sputtering method, a CVD method, an MBE method, a PLD method, an ALD method, or the like.

Then, an opening reaching the insulator 214 is formed in the insulator 216. Note that examples of the opening include a groove and a slit. A region where the opening is formed may be referred to as an opening portion. Wet etching can be used for the formation of the openings; however, dry etching is preferably used for microfabrication. As the insulator 214, it is preferable to select an insulator that functions as an etching stopper film used in forming the groove by etching the insulator 216. For example, in the case where a silicon oxide film is used as the insulator 216 in which the groove is to be formed, a silicon nitride film, an aluminum oxide film, or a hafnium oxide film is preferably used as the insulator 214.

After the formation of the opening, a conductive film to be the conductor 205 is deposited. The conductive film preferably includes a conductor that has a function of inhibiting the transmission of oxygen. For example, tantalum nitride, tungsten nitride, or titanium nitride can be used. Alternatively, a stacked-layer film with tantalum, tungsten, titanium, molybdenum, aluminum, copper, or a molybdenum-tungsten alloy can be used. The conductive film to be the conductor 205 can be deposited by a sputtering method, a CVD method, an MBE method, a PLD method, an ALD method, or the like.

In this embodiment, the conductive film to be the conductor 205 has a multilayer structure. First, tantalum nitride is deposited by a sputtering method, and titanium nitride is stacked over the tantalum nitride. Even when a metal that is likely to diffuse, such as copper, is used for an upper layer of the conductive film to be the conductor 205 described below, the use of such metal nitrides for a lower layer of the conductive film to be the conductor 205 can prevent outward diffusion of the metal from the conductor 205.

Next, a conductive film that is the upper layer of the conductive film to be the conductor 205 is deposited. The conductive film can be deposited by a plating method, a sputtering method, a CVD method, an MBE method, a PLD method, an ALD method, or the like. In this embodiment, for the conductive film of the upper layer of the conductive film to be the conductor 205, a low-resistance conductive material such as copper is deposited.

Next, CMP treatment is performed to remove parts of the upper layer of the conductive film to be the conductor 205 and the lower layer of the conductive film to be the conductor 205, so that the insulator 216 is exposed. As a result, the conductive film to be the conductor 205 remains only in the opening portion. Thus, the conductor 205 whose top surface is flat can be formed. Note that the insulator 216 is partly removed by the CMP treatment in some cases (see FIG. 4).

Here, a method for forming the conductor 205 which is different from the above will be described below.

Next, the conductive film to be the conductor 205 is deposited over the insulator 214. The conductive film to be the conductor 205 can be deposited by a sputtering method, a CVD method, an MBE method, a PLD method, an ALD method, or the like. In addition, the conductive film to be the conductor 205 can be a multilayer film. In this embodiment, tungsten is deposited for the conductive film to be the conductor 205.

Next, the conductive film to be the conductor 205 is processed by a lithography method, so that the conductor 205 is formed.

Note that in the lithography method, first, a resist is exposed to light through a mask. Next, a region exposed to light is removed or left using a developer, so that a resist mask is formed. Then, etching treatment through the resist mask is performed, so that a conductor, a semiconductor, an insulator, or the like can be processed into a desired shape. The resist mask is formed by, for example, exposure of the resist to light such as KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that for removal of the resist mask, dry etching treatment such as ashing can be performed, wet etching treatment can be performed, wet etching treatment can be performed after dry etching treatment, or dry etching treatment can be performed after wet etching treatment.

In addition, a hard mask formed of an insulator or a conductor may be used instead of the resist mask. In the case where a hard mask is used, a hard mask with a desired shape can be formed by forming an insulating film or a conductive film that is the hard mask material over the conductive film to be the conductor 205, forming a resist mask thereover, and then etching the hard mask material. The etching of the conductive film to be the conductor 205 may be performed after removal of the resist mask or with the resist mask remaining. In the latter case, the resist mask sometimes disappears during the etching. The hard mask may be removed by etching after the etching of the conductive film to be the conductor 205. Meanwhile, the hard mask is not necessarily removed when the hard mask material does not affect a post-process or can be utilized in the post-process.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

Next, an insulating film to be the insulator 216 is deposited over the insulator 214 and the conductor 205. The insulator to be the insulator 216 can be deposited by a sputtering method, a CVD method, an MBE method, a PLD method, an ALD method, or the like. In this embodiment, for the insulating film to be the insulator 216, silicon oxide is deposited by a CVD method.

Here, the thickness of the insulating film to be the insulator 216 is preferably greater than or equal to the thickness of the conductor 205. For example, when the thickness of the conductor 205 is 1, the thickness of the insulating film to be the insulator 216 is greater than or equal to 1 and less than or equal to 3. In this embodiment, the thickness of the thickness of the conductor 205 is 150 nm and the thickness of the insulating film to be the insulator 216 is 350 nm.

Figure 2A:
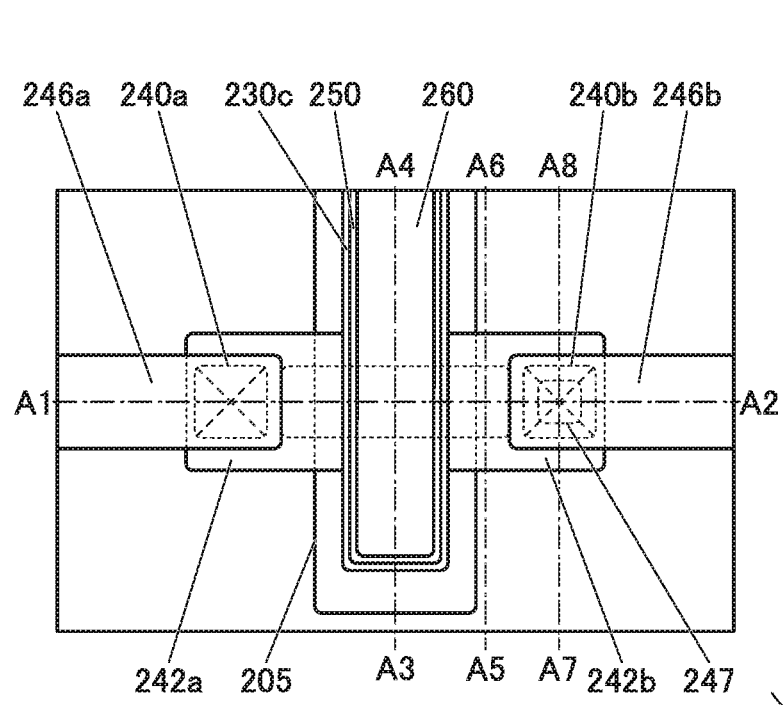
FIG. 2 (A)-(C) A top view and cross-sectional views of a semiconductor device of one embodiment of the present invention.
Figure 2C:
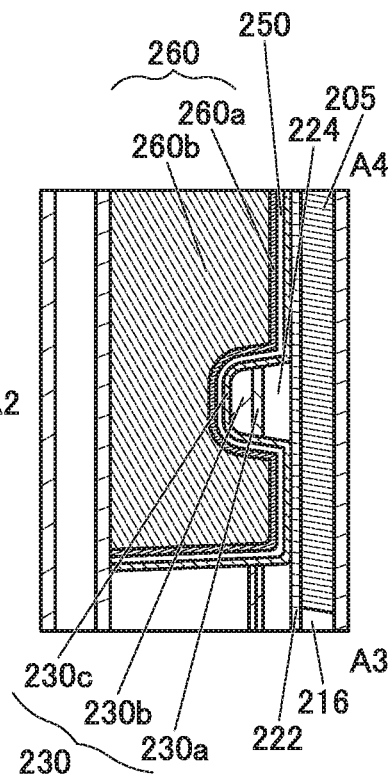
Figure 2B:
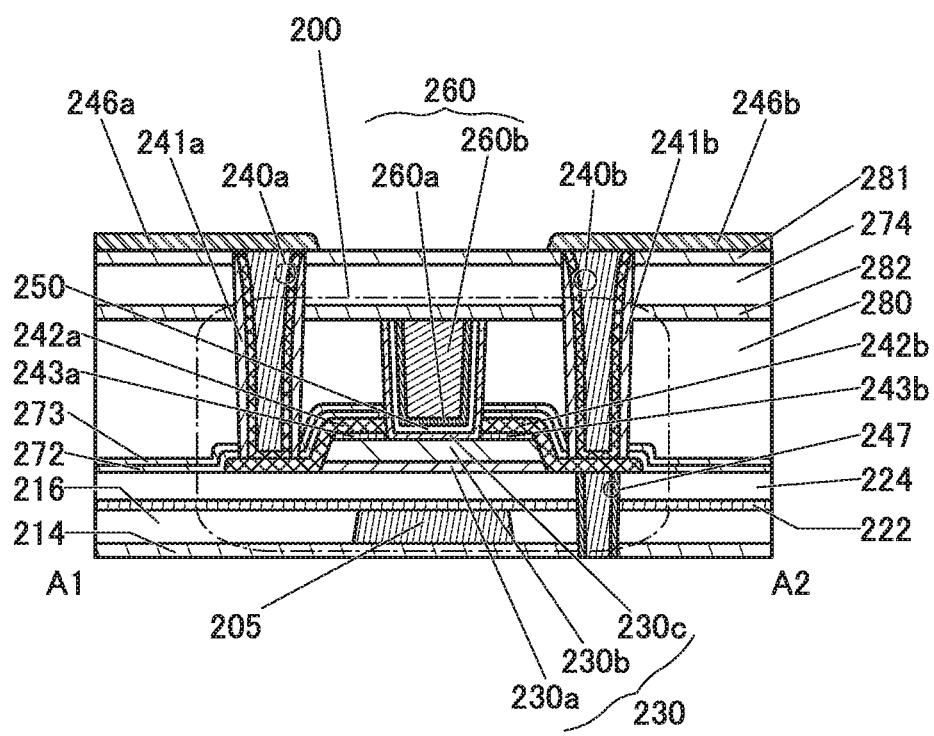

Next, CMP (chemical Mechanical Polishing) treatment is performed on the insulating film to be the insulator 216, so that part of the insulating film to be the insulator 216 is removed and a surface of the conductor 205 is exposed. Thus, the conductor 205 and the insulator 216 whose top surfaces are flat can be formed. The above is the different method for forming the conductor 205. FIG. 2 illustrates an example of a semiconductor device including the transistor 200 in which the conductor 205 and the insulator 216 are formed in the above manner.

Next, the insulator 222 is deposited over the insulator 216 and the conductor 205. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from being diffused into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Next, the insulator 224 is deposited over the insulator 222. The insulator 224 can be deposited by a sputtering method, a CVD method, an MBE method, a PLD method, an ALD method, or the like.

Then, an opening is formed in the insulator 224, the insulator 222, the insulator 216, and the insulator 214. Wet etching can be used for the formation of the opening; however, dry etching is preferably used for microfabrication.

After the formation of the opening, a conductive film to be the conductor 247 is deposited. The conductive film preferably includes a conductor that has a function of inhibiting the transmission of oxygen. For example, tantalum nitride, tungsten nitride, or titanium nitride can be used.

Alternatively, a stacked-layer film with tantalum, tungsten, titanium, molybdenum, aluminum, copper, or a molybdenum-tungsten alloy can be used. The conductive film to be the conductor 247 can be deposited by a sputtering method, a CVD method, an MBE method, a PLD method, an ALD method, or the like.

Next, CMP treatment is performed to remove part of the conductive film to be the conductor 247, so that the insulator 224 is exposed. As a result, the conductive film to be the conductor 247 remains only in the opening portion. Thus, the conductor 247 whose top surface is flat can be formed. Note that the insulator 224 is partly removed by the CMP treatment in some cases (see FIG. 4).

Next, heat treatment is preferably performed. The heat treatment may be performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen or inert gas atmosphere, or an atmosphere containing an oxidizing gas at 10 ppm or more, 1% or higher, or 10% of higher. Alternatively, the heat treatment may be performed under reduced pressure. Alternatively, the heat treatment may be performed by performing heat treatment in a nitrogen or inert gas atmosphere and then performing heat treatment in an atmosphere containing an oxidizing gas at 10 ppm or higher, 1% or higher, or 10% or higher to compensate for released oxygen.

In this embodiment, treatment is performed at 400° C. in a nitrogen atmosphere for 1 hour, and treatment is successively performed at 400° C. in an oxygen atmosphere for 1 hour. By the heat treatment, impurities such as water and hydrogen contained in the insulator 224 can be removed.

The above heat treatment may be performed after the insulator 222 is deposited. For the heat treatment, the conditions for the above-described heat treatment can be used.

Here, in order to form an excess-oxygen region in the insulator 224, plasma treatment containing oxygen may be performed under reduced pressure. For the plasma treatment containing oxygen, an apparatus including a power source for generating high-density plasma using microwaves is preferably used, for example. Alternatively, a power source for applying an RF (Radio Frequency) to a substrate side may be included. The use of high-density plasma enables high-density oxygen radicals to be produced, and RF application to the substrate side allows the oxygen radicals produced by the high-density plasma to be efficiently introduced into the insulator 224. Alternatively, after plasma treatment containing an inert gas is performed with this apparatus, plasma treatment containing oxygen may be performed to compensate for released oxygen. Note that impurities such as water and hydrogen contained in the insulator 224 can be removed by selecting the conditions for the plasma treatment as appropriate. In that case, the heat treatment does not need to be performed.

Here, aluminum oxide may be deposited over the insulator 224 by a sputtering method and the aluminum oxide may be subjected to CMP until the insulator 224 is reached. The CMP treatment can planarize the surface of the insulator 224 and smooth the surface of the insulator 224. When the CMP treatment is performed on the aluminum oxide placed over the insulator 224, it is easy to detect the endpoint of CMP. Although part of the insulator 224 is polished by CMP and the thickness of the insulator 224 is reduced in some cases, the thickness can be adjusted when the insulator 224 is deposited. Planarizing and smoothing the surface of the insulator 224 can improve the coverage with an oxide deposited later and a decrease in the yield of the semiconductor device in some cases. The deposition of aluminum oxide over the insulator 224 by a sputtering method is preferred because oxygen can be added to the insulator 224.

Figure 4A:
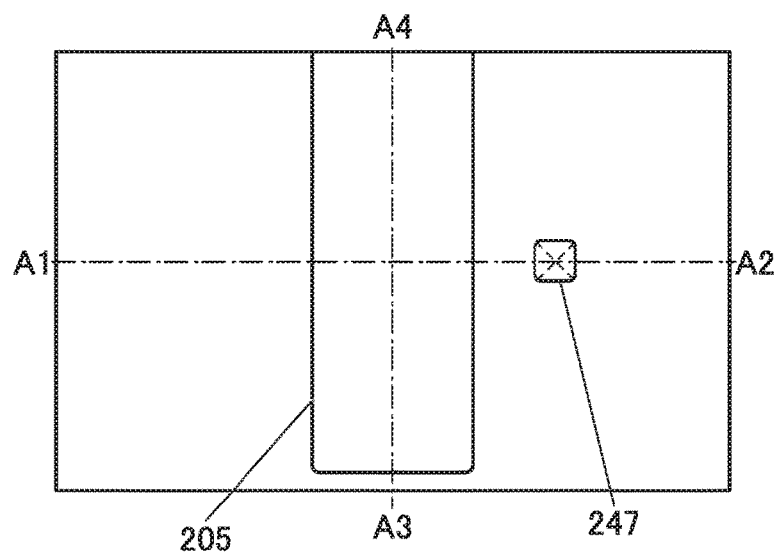
FIG. 4 (A)-(C) A top view and cross-sectional views illustrating a method for fabricating a semiconductor device of one embodiment of the present invention.
Figure 4C:
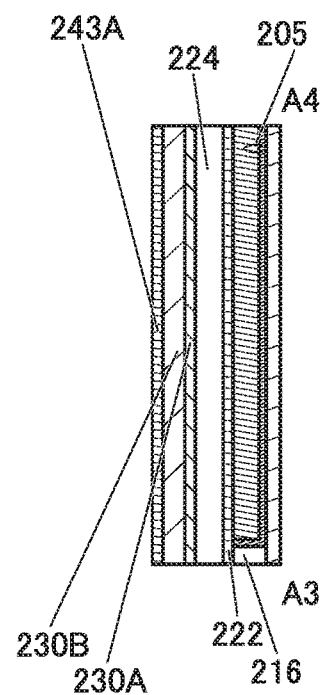
Figure 4B:
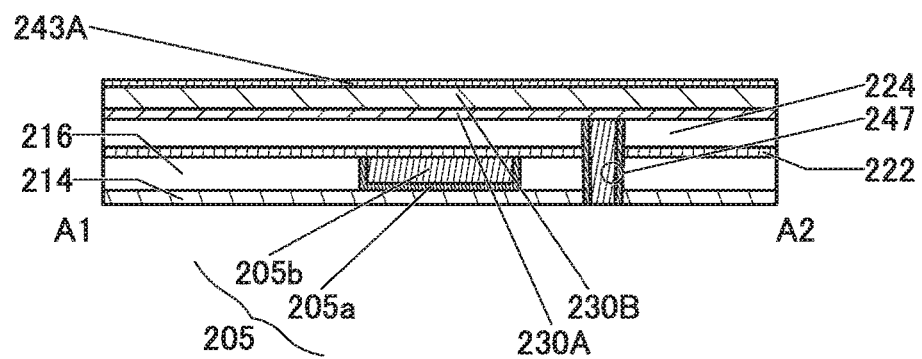

Next, an oxide film 230A to be the oxide 230a and an oxide film 230B to be the oxide 230b are deposited in this order over the insulator 224 and over the conductor 247 (see FIG. 4). Note that the oxide films are preferably deposited successively without being exposed to an atmospheric environment. By the deposition without exposure to the air, impurities or moisture from the atmospheric environment can be prevented from being attached onto the oxide film 230A and the oxide film 230B, so that the vicinity of an interface between the oxide film 230A and the oxide film 230B can be kept clean.

The oxide film 230A and the oxide film 230B can be deposited by a sputtering method, a CVD method, an MBE method, a PLD method, an ALD method, or the like.

In the case where the oxide film 230A and the oxide film 230B are deposited by a sputtering method, for example, oxygen or a mixed gas of oxygen and a rare gas is used as a sputtering gas. Increasing the proportion of oxygen contained in the sputtering gas can increase the amount of excess oxygen in the deposited oxide films. In the case where the above oxide films are deposited by a sputtering method, the above In-M-Zn oxide target can be used.

In particular, part of oxygen contained in the sputtering gas is supplied to the insulator 224 during the deposition of the oxide film 230A in some cases. Therefore, the proportion of oxygen contained in the sputtering gas for the oxide film 230A is higher than or equal to 70%, preferably higher than or equal to 80%, further preferably 100%.

In addition, in the case where the oxide film 230B is formed by a sputtering method, when the proportion of oxygen contained in the sputtering gas is higher than or equal to 1% and lower than or equal to 30%, preferably higher than or equal to 5% and lower than or equal to 20% during the deposition, an oxygen-deficient oxide semiconductor is formed. In a transistor in which an oxygen-deficient oxide semiconductor is used for its channel formation region, comparatively high field-effect mobility can be obtained.

In this embodiment, the oxide film 230A is deposited by a sputtering method using a target with In:Ga:Zn=1:1:0.5 [atomic ratio] (2:2:1 [atomic ratio]) or 1:3:4 [atomic ratio]. In addition, the oxide film 230B is deposited by a sputtering method using a target with In:Ga:Zn=4:2:4.1 [atomic ratio] or 1:1:1 [atomic ratio]. Note that each of the oxide films is formed to have characteristics required for the oxide 230 by selecting the deposition condition and the atomic ratio as appropriate.

Next, heat treatment may be performed. For the heat treatment, the conditions for the above heat treatment can be used. Through the heat treatment, impurities such as water and hydrogen in the oxide film 230A and the oxide film 230B can be removed, for example. In this embodiment, treatment is performed at 400° C. in a nitrogen atmosphere for 1 hour, and treatment is successively performed at 400° C. in an oxygen atmosphere for 1 hour.

Next, a conductive film 243A is deposited over the oxide film 230B. The oxide film 243A can be deposited by a sputtering method, a CVD method, an MBE method, a PLD method, an ALD method, or the like (see FIG. 4).

Figure 5A:
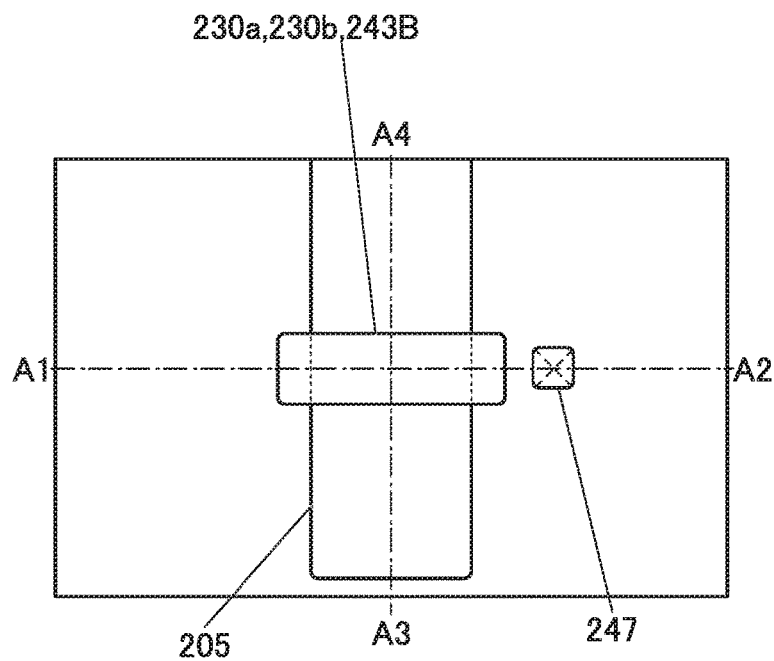
FIG. 5 (A)-(C) A top view and cross-sectional views illustrating a method for fabricating a semiconductor device of one embodiment of the present invention.
Figure 5C:
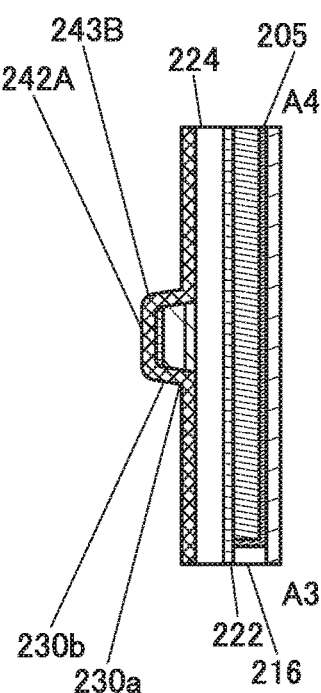
Figure 5B:
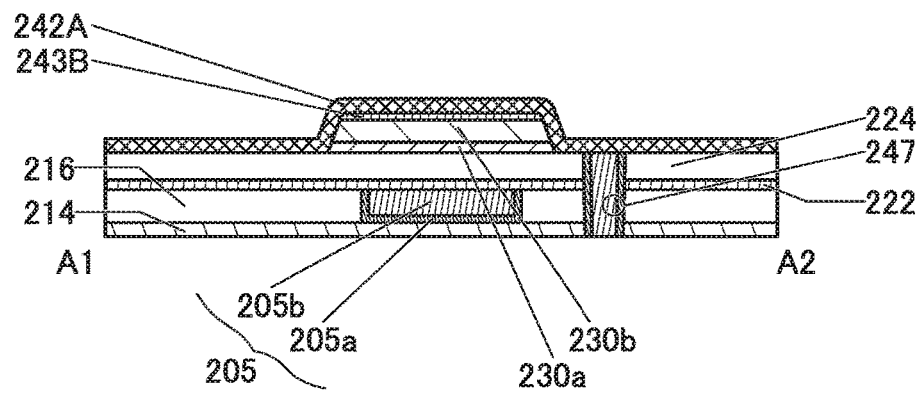

Next, the oxide film 230A, the oxide film 230B, and the oxide film 243A are processed into island shapes to form the oxide 230a, the oxide 230b, and an oxide layer 243B (see FIG. 5). Here, at least part of the top surface of the conductor 247 is exposed from the oxide film 230A, the oxide film 230B, and the oxide film 243A. Alternatively, the oxide film 230A, the oxide film 230B, and the oxide film 243A are prevented from overlapping with the conductor 247. Note that in this step, although not illustrated, the thickness of a region of the insulator 224 that does not overlap with the oxide 230a is reduced in some cases.

Note that the oxide 230a, the oxide 230b, and the oxide layer 243B are formed to at least partly overlap with the conductor 205. It is preferable that the side surfaces of the oxide 230a, the oxide 230b, and the conductive layer 243B be substantially perpendicular to the top surface of the insulator 222. When the side surfaces of the oxide 230a, the oxide 230b, and the oxide layer 243B are substantially perpendicular to the top surface of the insulator 222, reduction in area and higher integration can be achieved when a plurality of the transistors 200 is provided. Alternatively, a structure may be employed in which an angle formed by the side surfaces of the oxide 230a, the oxide 230b, and the oxide layer 243B and the top surface of the insulator 222 is a small angle. In that case, the angle formed by the side surfaces of the oxide 230a, the oxide 230b, and the oxide layer 243B and the top surface of the insulator 222 is preferably greater than or equal to 60° and less than 70°. With such a shape, in a later step, the coverage with the insulator 272 and the like can be improved, so that defects such as a void can be reduced.

Note that for the processing of the oxide films and the conductive film, a lithography method can be employed. A dry etching method or a wet etching method can be used for the processing. Processing by a dry etching method is suitable for microfabrication.

Then, a conductive film 242A is deposited over the insulator 224, the oxide 230a, the oxide 230b, and the oxide layer 243B. The conductive film 242A can be deposited by a sputtering method, a CVD method, an MBE method, a PLD method, an ALD method, or the like (see FIG. 5).

Figure 6A:
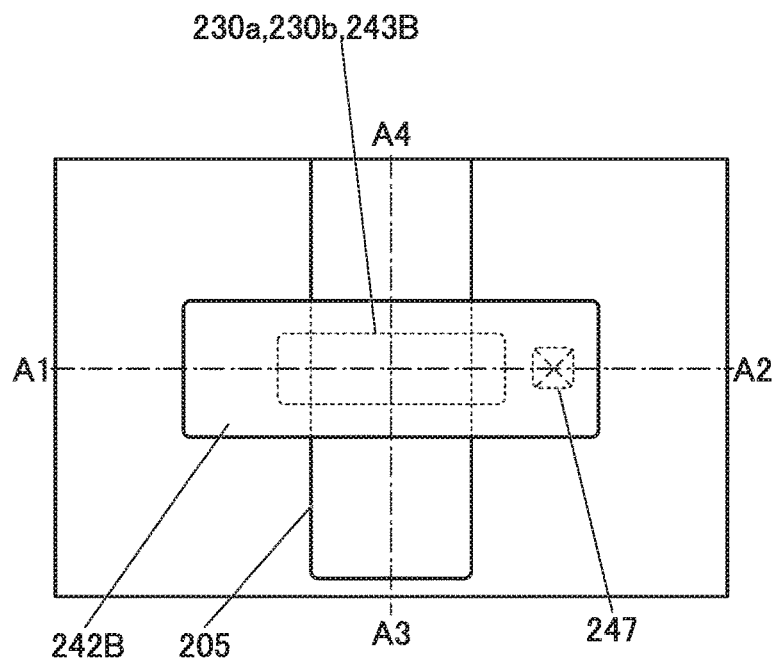
FIG. 6 (A)-(C) A top view and cross-sectional views illustrating a method for fabricating a semiconductor device of one embodiment of the present invention.
Figure 6C:
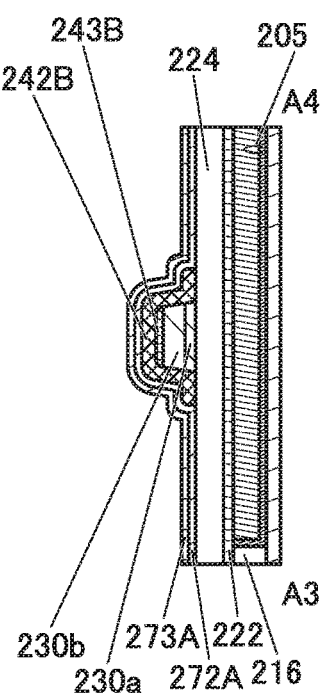
Figure 6B:
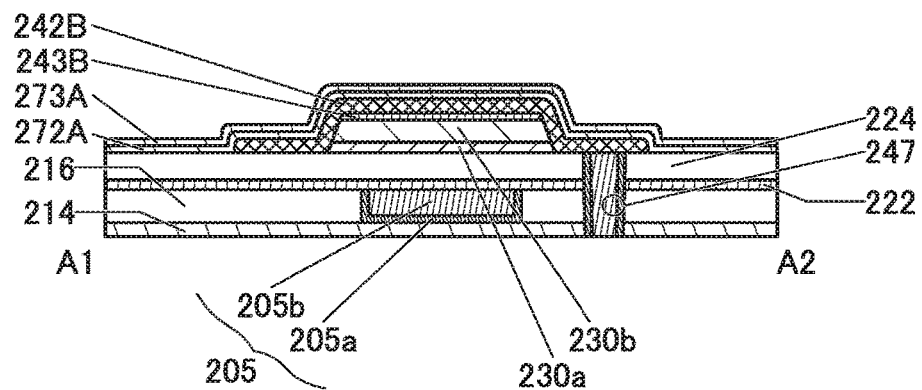
Figure 7A:
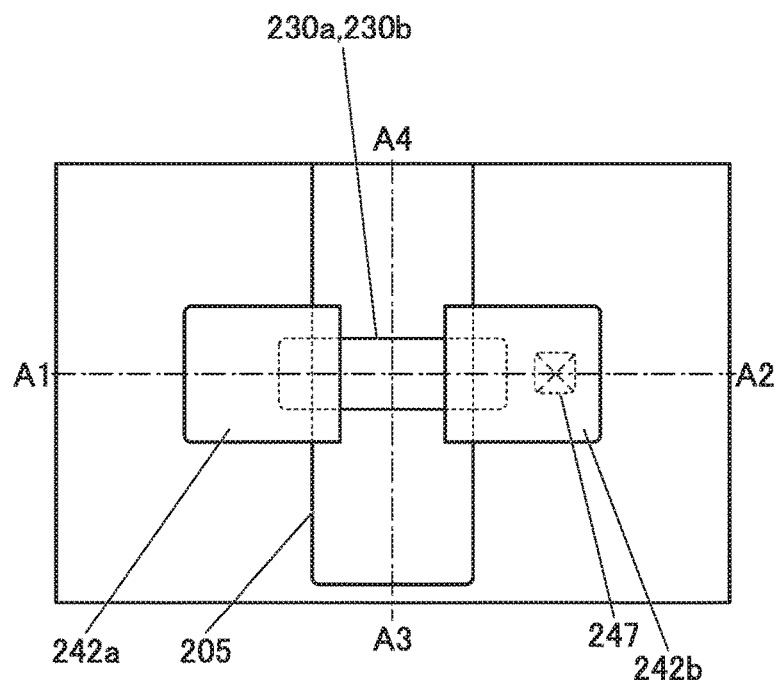
FIG. 7 (A)-(C) A top view and cross-sectional views illustrating a method for fabricating a semiconductor device of one embodiment of the present invention.
Figure 7C:
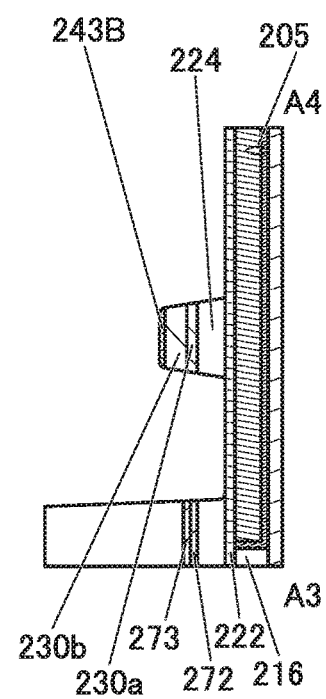
Figure 7B:
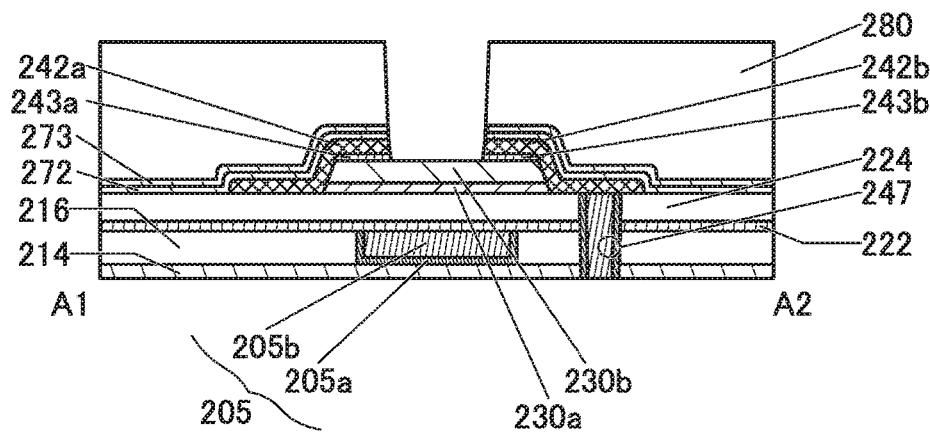
Figure 8A:
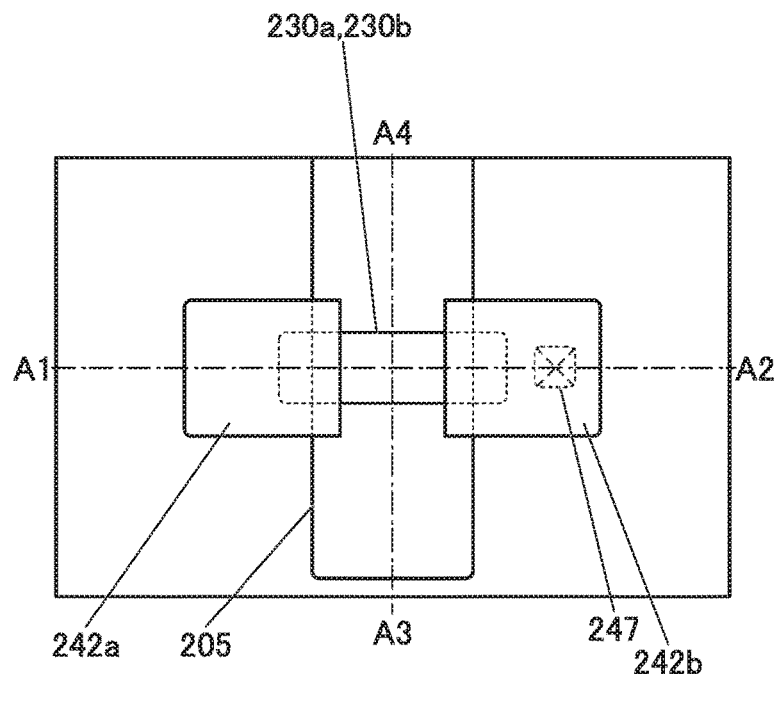
FIG. 8 (A)-(C) A top view and cross-sectional views illustrating a method for fabricating a semiconductor device of one embodiment of the present invention.
Figure 8C:
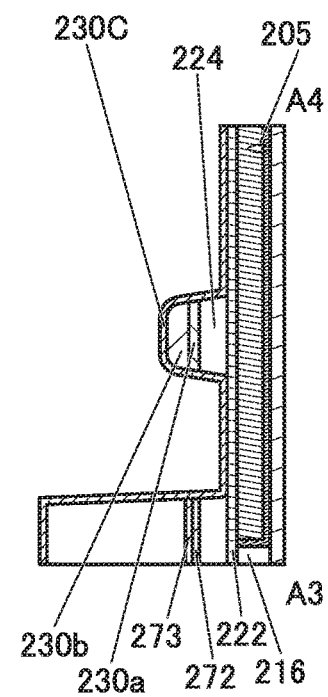
Figure 8B:
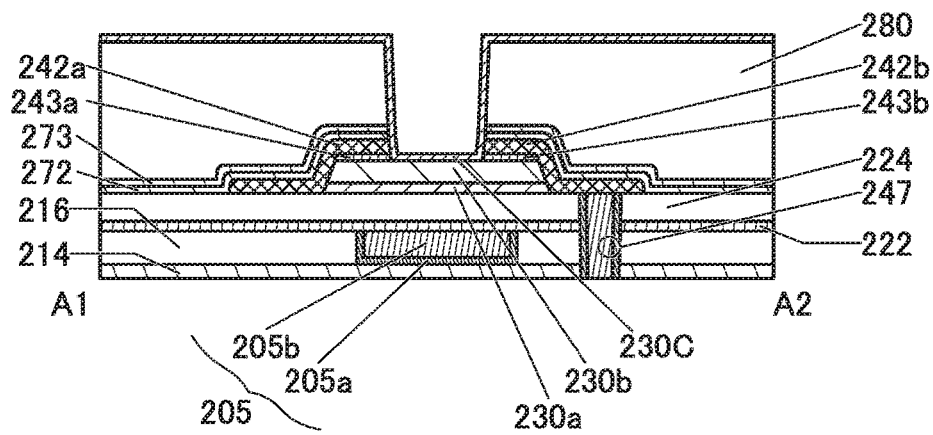
Figure 9A:
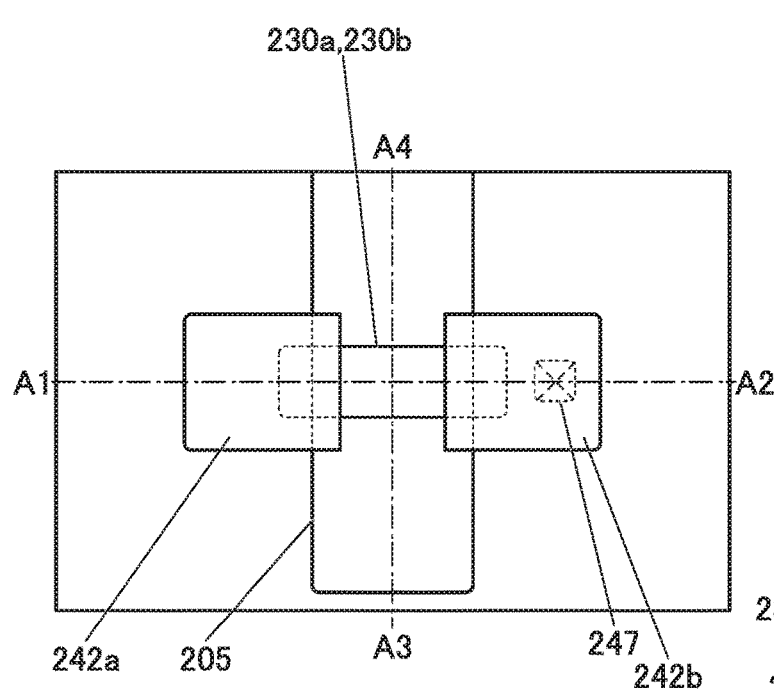
FIG. 9 (A)-(C) A top view and cross-sectional views illustrating a method for fabricating a semiconductor device of one embodiment of the present invention.
Figure 9C:
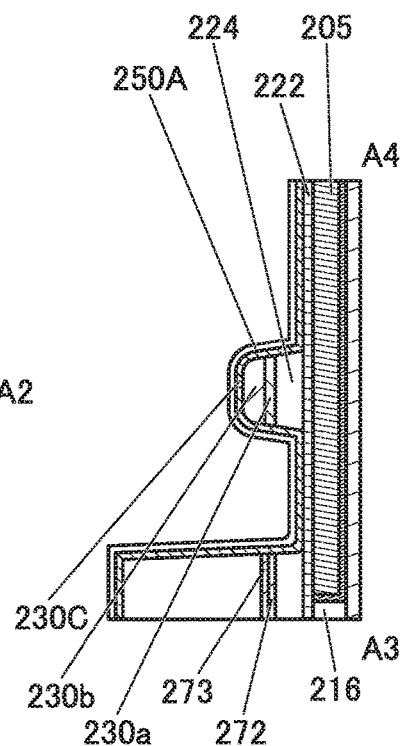
Figure 9B:
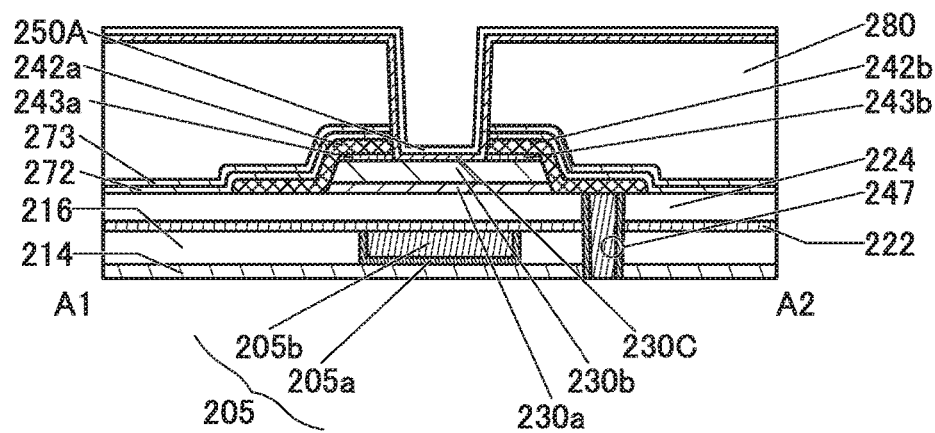
Figure 10A:
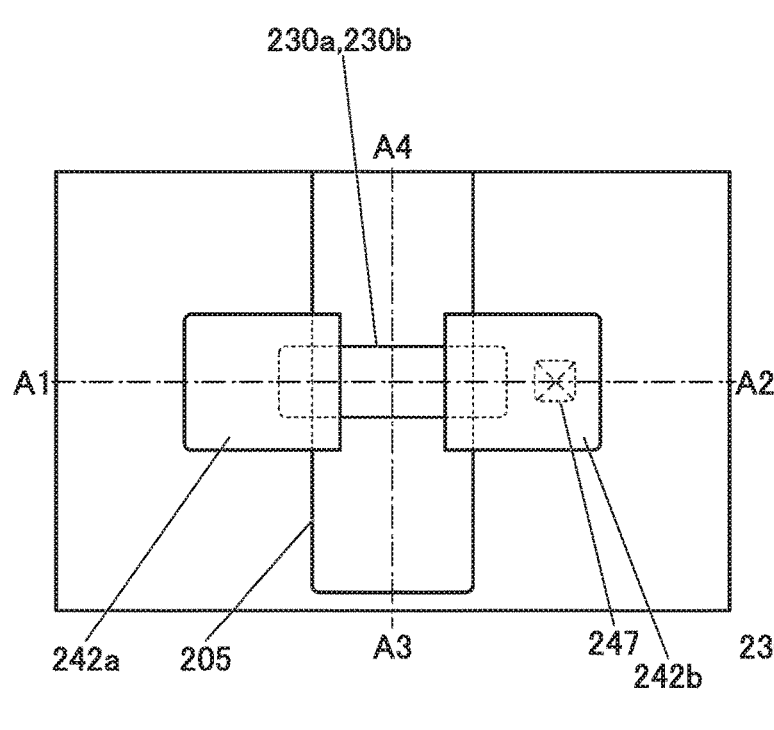
FIG. 10 (A)-(C) A top view and cross-sectional views illustrating a method for fabricating a semiconductor device of one embodiment of the present invention.
Figure 10C:
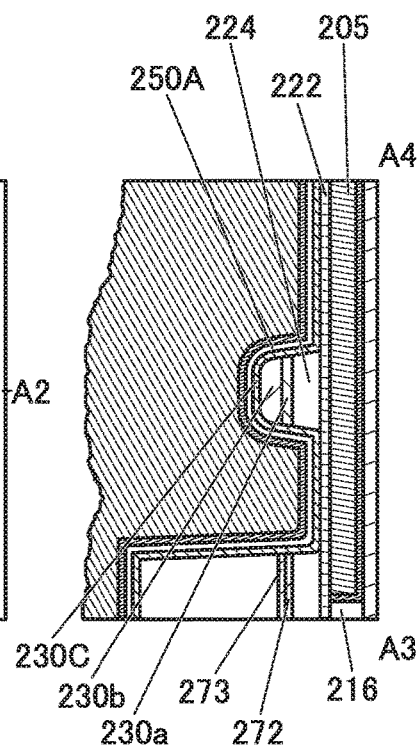
Figure 10B:
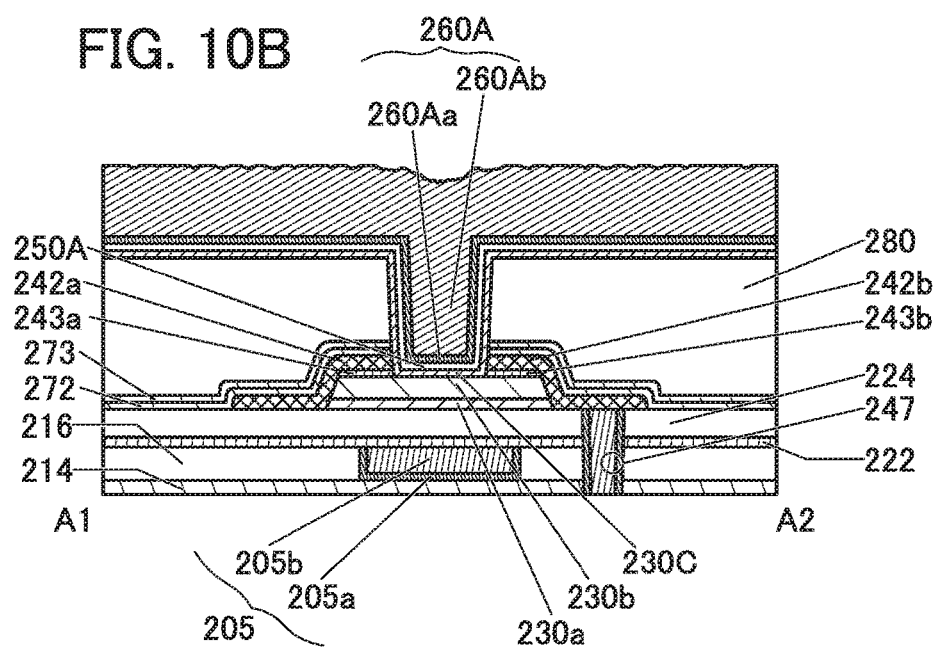

Next, the conductive film 242A is processed into an island shape, whereby a conductor layer 242B is formed (see FIG. 6). Here, the conductor layer 242B is made to be in contact with at least part of the top surface of the conductor 247. Alternatively, the conductor layer 242B is made to cover the top surface of the conductor 247. Note that in this step, although not illustrated, the thickness of the region of the insulator 224 that does not overlap with the conductor layer 242B is reduced in some cases.

It is preferable that a curved surface is included between the side surface of the conductor layer 242B and the top surface of the conductor layer 242B. That is, an end portion of the side surface and an end portion of the top surface are preferably curved (hereinafter, also referred to as a rounded shape). The radius of curvature of the curved surface at an end portion of the conductor layer 242B is greater than or equal to 3 nm and less than or equal to 10 nm, preferably greater than or equal to 5 nm and less than or equal to 6 nm, for example. When the end portions are not angular, coverage with films in later deposition steps is improved.

Note that for the processing of the conductive films, a lithography method can be employed. A dry etching method or a wet etching method can be used for the processing. Processing by a dry etching method is suitable for microfabrication.

Next, an insulating film 272A is deposited over the insulator 224, the oxide 230a, the oxide 230b, the oxide layer 243B, and the conductor layer 242B (see FIG. 6).

The insulating film 272A can be deposited by a sputtering method, a CVD method, an MBE method, a PLD method, an ALD method, or the like. As the insulating film 272A, an insulating film having a function of inhibiting the transmission of oxygen is preferably used. For example, silicon nitride, silicon oxide, or aluminum oxide is deposited by a sputtering method.

Then, an insulating film 273A is deposited over the insulating film 272A. The insulating film 273A can be deposited by a sputtering method, a CVD method, an MBE method, a PLD method, an ALD method, or the like. For example, an aluminum oxide film is preferably deposited by an ALD method or a sputtering method. In this embodiment, an aluminum oxide film is deposited by an ALD method (see FIG. 6).

Next, an insulating film to be the insulator 280 is deposited over the insulating film 273A. The insulating film to be the insulator 280 can be deposited by a sputtering method, a CVD method, an MBE method, a PLD method, an ALD method, or the like. Next, the insulating film to be the insulator 280 is subjected to CMP treatment, so that the insulator 280 having a flat top surface is formed (see FIG. 7).

Then, part of the insulator 280, part of the insulating film 273A, part of the insulating film 272A, part of the conductor layer 242B, and part of the oxide layer 243B are processed to form an opening reaching the oxide 230b. The opening is preferably formed to overlap with the conductor 205. The oxide 243a, the oxide 243b, the conductor 242a, the conductor 242b, the insulator 272, and the insulator 273 are formed by forming the opening (see FIG. 7).

Part of the insulator 280, part of the insulating film 273A, part of the insulating film 272A, part of the conductor layer 242B, and part of the oxide layer 243B may be processed under different conditions. For example, part of the insulator 280 may be processed by a dry etching method, part of the insulating film 273A may be processed by a wet etching method, and part of the insulating film 272A, part of the conductor layer 242B, and part of the oxide layer 243B may be processed by a dry etching method.

In some cases, treatment such as dry etching performed in the above process causes the attachment or diffusion of impurities due to an etching gas or the like to a surface or an inside of the oxide 230a, the oxide 230b, or the like. Examples of the impurities include fluorine and chlorine.

In order to remove the impurities and the like, cleaning is performed. Examples of a cleaning method include wet cleaning using a cleaning solution or the like, plasma treatment using plasma, and cleaning by heat treatment, and these cleanings may be performed in appropriate combination.

As the wet cleaning, cleaning treatment may be performed using an aqueous solution obtained by diluting an oxalic acid, a phosphoric acid, ammonia water, a hydrofluoric acid, or the like with carbonated water or pure water. Alternatively, ultrasonic cleaning using pure water or carbonated water may be performed.

Next, heat treatment may be performed. Heat treatment may be performed under reduced pressure, and an oxide film 230C may be successively deposited without exposure to the air. The treatment can remove moisture and hydrogen adsorbed onto the surface of the oxide 230b and the like, and further can reduce the moisture concentration and the hydrogen concentration of the oxide 230a and the oxide 230b. The heat treatment is preferably performed In this embodiment, the heat treatment is performed at 200° C. (see FIG. 8).

Here, it is preferable that the oxide film 230C be provided in contact with at least part of the side surface of the oxide 230a, part of the side surface and part of the top surface of the oxide 230b, part of the side surface of the oxide 243, part of the side surface of the conductor 242, the side surface of the insulator 272, the side surface of the insulator 273, and the side surface of the insulator 280. When the conductor 242 is surrounded by the oxide 243, the insulator 272, and the oxide film 230C, a decrease in the conductivity of the conductor 242 due to oxidation can be inhibited in a later step.

The oxide film 230C can be deposited by a sputtering method, a CVD method, an MBE method, a PLD method, an ALD method, or the like. The oxide film 230C is deposited by a deposition method similar to that for the oxide film 230A or the oxide film 230B depending on characteristics required for the oxide film 230C. In this embodiment, the oxide film 230C is deposited by a sputtering method using a target with In:Ga:Zn=4:2:4.1 [atomic ratio].

The oxide film 230C may have a stacked-layer structure. For example, the oxide film 230C may be deposited by a sputtering method using a target of In:Ga:Zn=4:2:4.1 [atomic ratio] and successively deposited using a target of In:Ga:Zn=1:3:4 [atomic ratio].

In particular, in the deposition of the oxide film 230C, part of oxygen contained in the sputtering gas is sometimes supplied to the oxide 230a and the oxide 230b. Therefore, the proportion of oxygen contained in the sputtering gas for the oxide film 230C is higher than or equal to 70%, preferably higher than or equal to 80%, further preferably 100%.

Next, heat treatment may be performed. Heat treatment may be performed under reduced pressure, and an insulating film 250A may be successively deposited without exposure to the air. The treatment can remove moisture and hydrogen adsorbed onto the surface of the oxide film 230C and the like, and further can reduce the moisture concentration and the hydrogen concentration of the oxide 230a, the oxide 230b, and the oxide film 230C. The heat treatment is preferably performed at a temperature higher than or equal to 100° C. and lower than or equal to 400° C. (see FIG. 9).

The insulating film 250A can be deposited by a sputtering method, a CVD method, an MBE method, a PLD method, an ALD method, or the like. For the insulating film 250A, silicon oxynitride is preferably deposited by a CVD method. Note that the deposition temperature at the time of the deposition of the insulating film 250A is preferably higher than or equal to 350° C. and lower than 450° C., particularly preferably approximately 400° C. When the insulating film 250A is deposited at 400° C., an insulator having few impurities can be deposited.

Next, a conductive film 260Aa and a conductive film 260Ab are deposited. The conductive film 260Aa and the conductive film 260Ab can be deposited by a sputtering method, a CVD method, an MBE method, a PLD method, an ALD method, or the like. A CVD method is preferably used, for example. In this embodiment, the conductive film 260Aa is deposited by an ALD method, and the conductive film 260Ab is deposited by a CVD method (see FIG. 10).

Figure 11A:
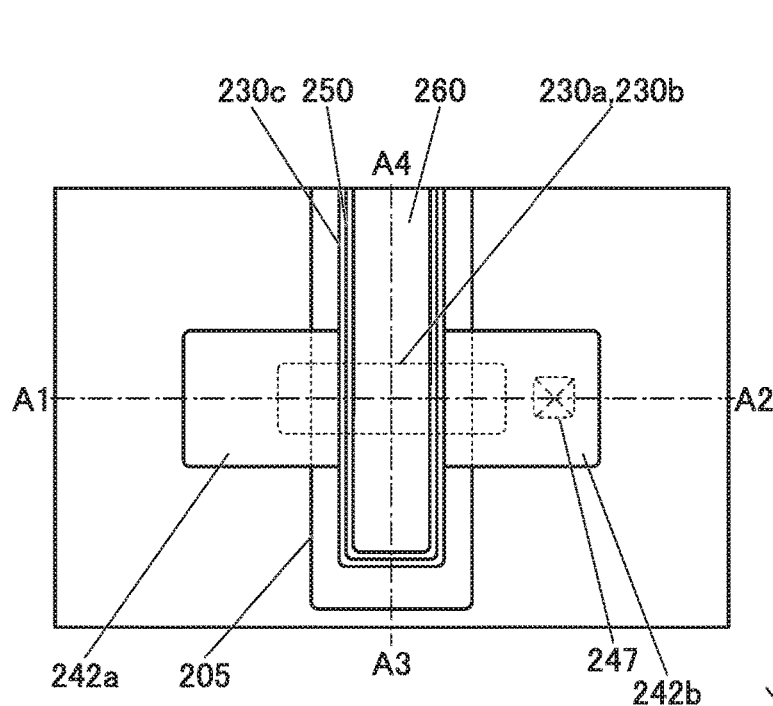
FIG. 11 (A)-(C) A top view and cross-sectional views illustrating a method for fabricating a semiconductor device of one embodiment of the present invention.
Figure 11C:
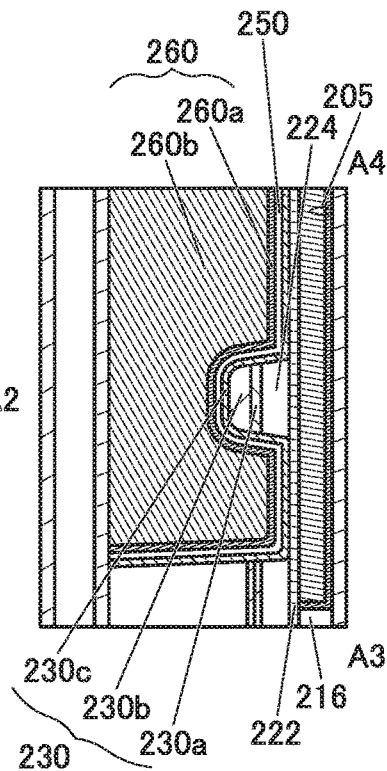
Figure 11B:
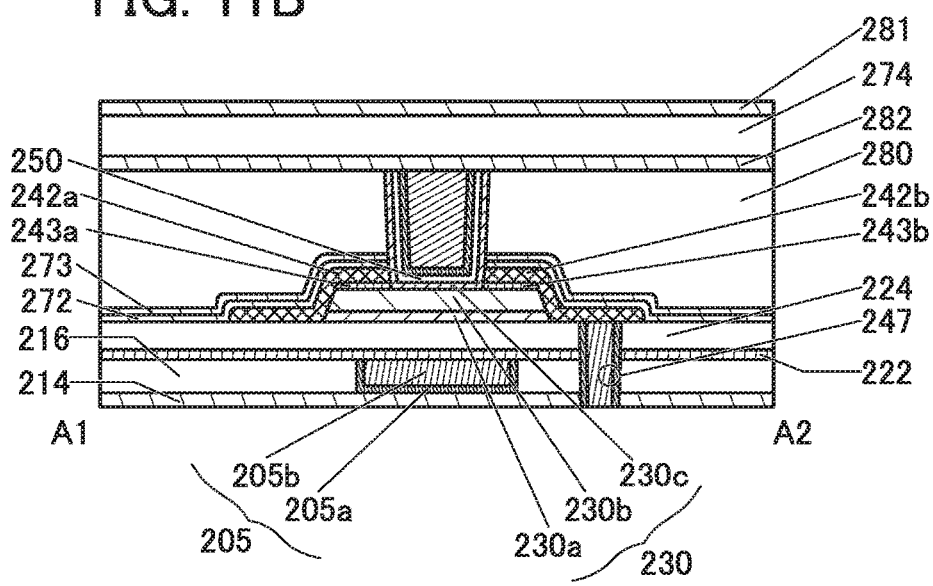

Then, the oxide film 230C, the insulating film 250A, the conductive film 260Aa, and the conductive film 260Ab are polished by CMP treatment until the insulator 280 is exposed, so that the oxide 230c, the insulator 250, and the conductor 260 (the conductor 260a and the conductor 260b) are formed (see FIG. 11).

Here, the conductor 242 is surrounded by the oxide 243, the insulator 272, and the oxide 230c; therefore, a decrease in conductivity of the conductor 242 due to oxidation can be inhibited.

Next, heat treatment may be performed. In this embodiment, the treatment is performed at 400° C. in a nitrogen atmosphere for one hour. The heat treatment can reduce the moisture concentration and the hydrogen concentration in the insulator 250 and the insulator 280.

Next, an insulating film to be the insulator 282 may be formed over the conductor 260, the oxide 230c, the insulator 250, and the insulator 280. The insulating film to be the insulator 282 can be deposited by a sputtering method, a CVD method, an MBE method, a PLD method, an ALD method, or the like. An aluminum oxide is preferably deposited as the insulating film to be the insulator 282 by a sputtering method, for example. It is preferable to form the insulator 282 in contact with the top surface of the conductor 260 in this manner because oxygen included in the insulator 280 can be inhibited from being absorbed into the conductor 260 in a later heat treatment (see FIG. 11).

Next, heat treatment may be performed. In this embodiment, the treatment is performed at 400° C. in a nitrogen atmosphere for one hour. By the heat treatment, oxygen added by the deposition of the insulator 282 can be injected into the insulator 280. In addition, the oxygen can be injected into the oxide 230a and the oxide 230b through the oxide 230c.

Next, an insulator to be the insulator 274 may be deposited over the insulator 282. An insulating film to be the insulator 274 can be deposited by a sputtering method, a CVD method, an MBE method, a PLD method, an ALD method, or the like (see FIG. 11).

Next, an insulator to be the insulator 281 may be deposited over the insulator 274. An insulating film to be the insulator 281 can be deposited by a sputtering method, a CVD method, an MBE method, a PLD method, an ALD method, or the like. Silicon nitride is preferably deposited as the insulating film to be the insulator 281 by a sputtering method, for example (see FIG. 11).

Next, openings reaching the conductor 242a and the conductor 242b are formed in the insulator 272, the insulator 273, the insulator 280, the insulator 282, the insulator 274, and the insulator 281. The openings are formed by a lithography method.

Next, an insulating film to be the insulator 241 is deposited and the insulating film is subjected to anisotropic etching, so that the insulator 241 is formed. The conductive film can be deposited by a sputtering method, a CVD method, an MBE method, a PLD method, an ALD method, or the like. As the insulating film to be the insulator 241, an insulating film having a function of inhibiting the transmission of oxygen is preferably used. For example, aluminum oxide or silicon nitride is preferably deposited by an ALD method. For the anisotropic etching, a dry etching method or the like may be employed, for example. When the side wall portions of the openings have such a structure, transmission of oxygen from the outside can be inhibited and oxidation of the conductor 240a and the conductor 240b to be formed next can be prevented. Furthermore, impurities such as water and hydrogen can be prevented from diffusing from the conductor 240a and the conductor 240b to the outside.

Next, a conductive film to be the conductor 240a and the conductor 240b is deposited. The conductive film to be the conductor 240a and the conductor 240b desirably has a stacked-layer structure which includes a conductor having a function of inhibiting transmission of impurities such as water and hydrogen. For example, a stacked layer of tantalum nitride, titanium nitride, or the like and tungsten, molybdenum, copper, or the like can be employed. A conductive film to be the conductor 240 can be deposited by a sputtering method, a CVD method, an MBE method, a PLD method, an ALD method, or the like.

Next, CMP treatment is performed to remove part of the conductive film to be the conductor 240a and the conductor 240b, so that the insulator 281 is exposed. As a result, the conductive film remains only in the openings, so that the conductor 240a and the conductor 240b having flat top surfaces can be formed (see FIG. 1). Note that the insulator 281 is partly removed by the CMP treatment in some cases.

Next, a conductive film to be the conductor 246 is deposited. The conductive film to be the conductor 246 can be deposited by a sputtering method, a CVD method, an MBE method, a PLD method, an ALD method, or the like.

Next, the conductive film to be the conductor 246 is processed by a lithography method to form the conductor 246a in contact with the top surface of the conductor 240a and the conductor 246b in contact with the top surface of the conductor 240b (see FIG. 1).

Through the above process, the semiconductor device including the transistor 200 illustrated in FIG. 1 can be fabricated. As illustrated in FIG. 4 to FIG. 11, with the use of the method of fabricating the semiconductor device described in this embodiment, the transistor 200 can be fabricated.

According to one embodiment of the present invention, a semiconductor device that can be miniaturized or highly integrated can be provided. Alternatively, according to one embodiment of the present invention, a semiconductor device with excellent electrical characteristics can be provided. According to one embodiment of the present invention, a semiconductor device with a high on-state current can be provided. Alternatively, according to one embodiment of the present invention, a semiconductor device with excellent frequency characteristics can be provided. Alternatively, according to one embodiment of the present invention, a highly reliable semiconductor device can be provided. Alternatively, according to one embodiment of the present invention, a semiconductor device with low off-state current can be provided. Alternatively, according to one embodiment of the present invention, a semiconductor device with reduced power consumption can be provided. Alternatively, according to one embodiment of the present invention, a semiconductor device with high productivity can be provided.

<Modification Example of Semiconductor Device>

An example of a semiconductor device including the transistor 200 of one embodiment of the present invention which is different from the semiconductor device described in <Structure example of semiconductor device> above will be described below with reference to FIG. 13 to FIG. 23.

Note that in the semiconductor device illustrated in FIG. 13 to FIG. 23, components having the same functions as the components in the semiconductor device described in <Structure example of semiconductor device> (see FIG. 1) are denoted by the same reference numerals. Note that in this section, the materials described in detail in <Structure example of semiconductor device> can be used as the constituent materials for the transistor 200.

Modification Example 1 of Semiconductor Device

Figure 13A:
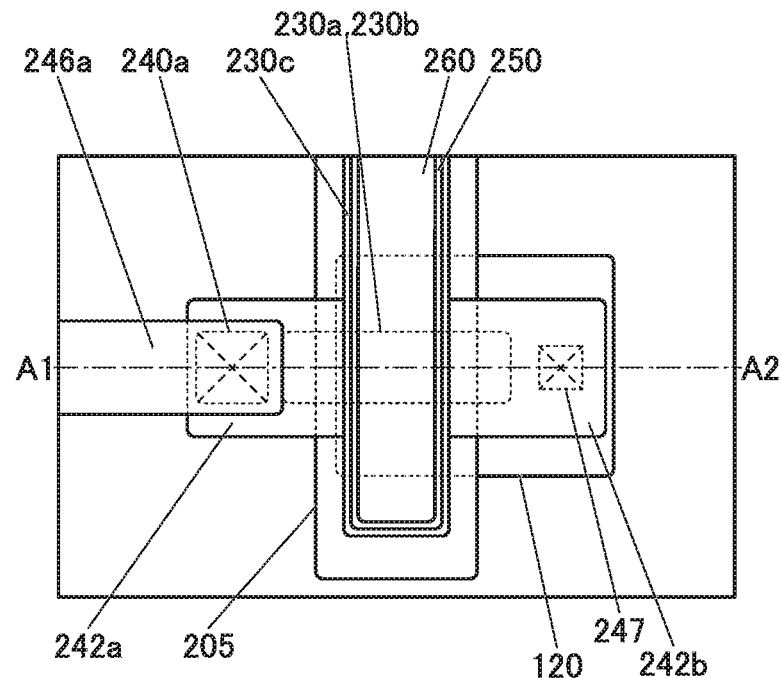
FIG. 13 (A)(B) A top view and a cross-sectional view of a semiconductor device of one embodiment of the present invention.
Figure 13B:
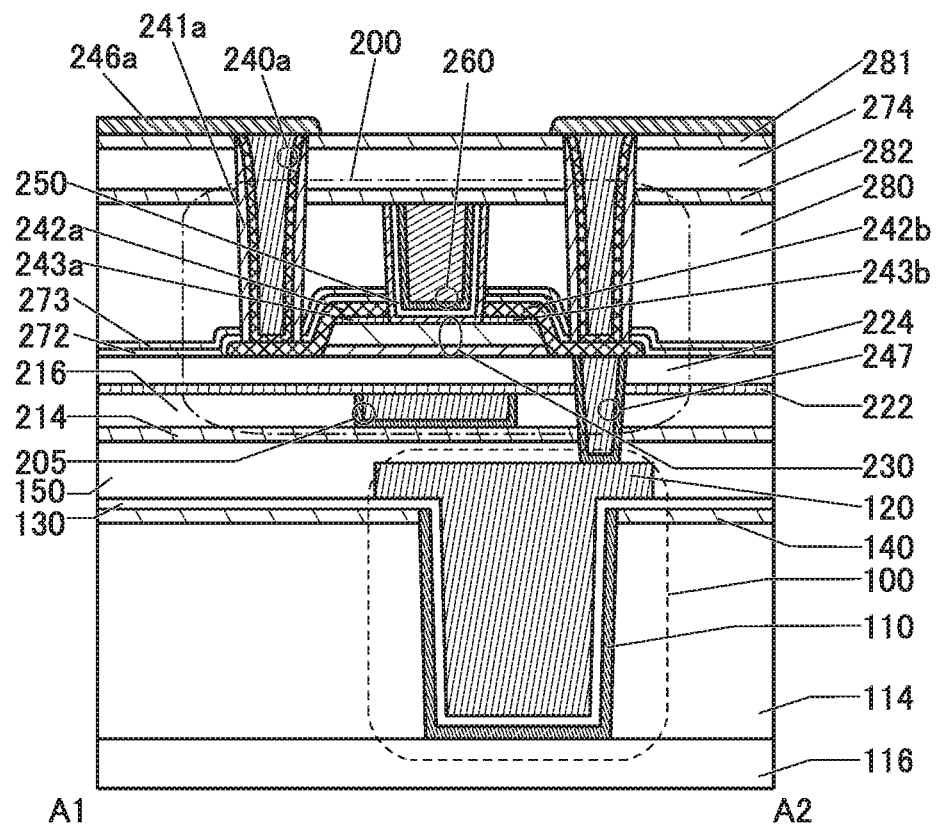

FIG. 13(A) and FIG. 13(B) are a top view and a cross-sectional view of a semiconductor device of one embodiment of the present invention including the transistor 200 and a capacitor 100.

In FIG. 13, FIG. 13(A) illustrates a top view. Furthermore, FIG. 13(B) is a cross-sectional view corresponding to a portion indicated by a dashed-dotted line A1-A2 in FIG. 13(A), and is also a cross-sectional view of the transistor 200 in the channel length direction. For clarity of the drawing, some components are not illustrated in the top view of FIG. 13(A).

The semiconductor device illustrated in FIG. 13 includes the capacitor 100 and the transistor 200 over the capacitor 100. The semiconductor device illustrated in FIG. 13 is different from the semiconductor device illustrated in FIG. 1 in that the capacitor 100 is provided under the conductor 247. Note that the transistor 200 illustrated in FIG. 13 is the same as the transistor 200 illustrated in FIG. 1 except that the conductor 240b, the insulator 241b, and the conductor 246b are not provided.

The capacitor 100 includes an insulator 114 over an insulator 116, an insulator 140 over the insulator 114, a conductor 110 positioned in an opening formed in the insulator 114 and the insulator 140, an insulator 130 over the conductor 110 and the insulator 140, a conductor 120 over the insulator 130, and an insulator 150 over the conductor 120 and the insulator 130. Here, at least parts of the conductor 110, the insulator 130, and the conductor 120 are positioned in the opening formed in the insulator 114 and the insulator 140.

The conductor 110 functions as a lower electrode of the capacitor 100, the conductor 120 functions as an upper electrode of the capacitor 100, and the insulator 130 functions as a dielectric of the capacitor 100. In the capacitor 100, the upper electrode and the lower electrode face each other with the dielectric positioned therebetween on the side surface as well as the bottom surface of the opening in the insulator 114 and the insulator 140; thus, the capacitance per unit area can be increased. And the deeper the opening is, the larger the capacitance of the capacitor 100 can be. Increasing the capacitance per unit area of the capacitor 100 in this manner can promote miniaturization or higher integration of a semiconductor device.

An insulator that can be used as the insulator 280 can be used as the insulator 114 and the insulator 150. The insulator 116 and the insulator 140 preferably function as an etching stopper at the time of forming the opening in the insulator 114 and are formed using an insulator that can be used as the insulator 214.

The shape of the opening formed in the insulator 114 and the insulator 140 when seen from above may be a quadrangular shape, a polygonal shape other than a quadrangular shape, a polygonal shape with rounded corners, or a circular shape including an elliptical shape. Here, the area where the opening and the transistor 200 overlap with each other is preferably larger in the top view. Such a structure can reduce the area occupied by the semiconductor device including the capacitor 100 and the transistor 200.

The conductor 110 is provided in contact with the opening formed in the insulator 140, the insulator 114, and the insulator 116. Preferably, the top surface of the conductor 110 is substantially aligned with the top surface of the insulator 140. The conductor 110 is preferably formed by an ALD method, a CVD method, or the like and is deposited using a conductor that can be used as the conductor 205, for example.

The insulator 130 is positioned to cover the conductor 110 and the insulator 140. For the insulator 130, a high-k material such as hafnium oxide, hafnium silicate ($HfSi_xO_y$, (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), or yttrium oxide. The use of such a high-k material can secure sufficient capacitance of the capacitor 100 even if the insulator 130 has a large thickness. When the insulator 130 has a large thickness, leakage current generated between the conductor 110 and the conductor 120 can be inhibited. The insulator 130 is preferably deposited by an ALD method or a CVD method, for example.

Note that the insulator 130 can be provided by stacking a material with high dielectric strength such as silicon oxynitride (a material with low relative permittivity) over an insulator of the above-mentioned high-k material. Examples of the material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. In the capacitor 100, by stacking the insulator 130 in such a manner, a sufficient capacitance can be secured owing to the insulator of the high-k material, and the dielectric strength can be increased owing to the insulator with high dielectric strength, so that the electrostatic breakdown of the capacitor 100 can be prevented. Note that in the case where sufficient capacitance of the capacitor 100 can be secured, the insulator 130 can be formed only with a material with high dielectric strength.

The conductor 120 is positioned to fill the opening formed in the insulator 140 and the insulator 114. The conductor 247 is in contact with the top surface of the conductor 120 through an opening in the insulator 150. The conductor 120 is preferably deposited by an ALD method, a CVD method, or the like and is formed using a conductor that can be used as the conductor 205, for example.

In the fabrication process of the capacitor 100, high-temperature heat treatment of higher than 700° C. is needed in some cases. When such a high-temperature heat treatment is performed after the formation of the transistor 200, the oxide 230 might be affected by the diffusion of oxygen or impurities such as hydrogen or water, which might degrade the electrical characteristics of the transistor 200.

However, when the transistor 200 is formed over the capacitor 100 as described in this modification example, the thermal budget in the fabrication process of the capacitor 100 does not affect the transistor 200. Thus, degradation in electrical characteristics of the transistor 200 can be prevented and a semiconductor device having stable electrical characteristics can be provided.

Note that although, in this modification example, the conductor 242b and the conductor 120 are electrically connected to each other through the conductor 247, this modification example is not limited thereto. For example, the capacitor 100 may be provided so that the top surface of the conductor 120 is exposed from the insulator 224, and the top surface of the conductor 120 may be in contact with the conductor 242b.

Modification Example 2 of Semiconductor Device

Figure 14A:
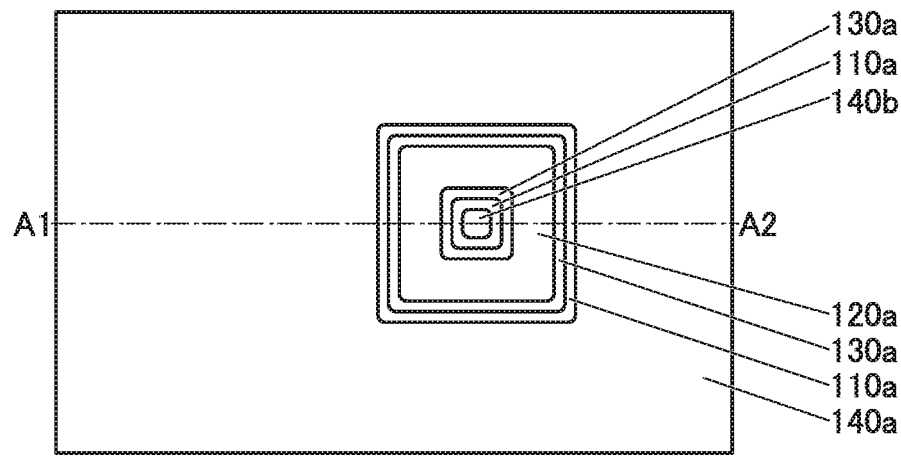
FIG. 14 (A)(B) A top view and a cross-sectional view of a semiconductor device of one embodiment of the present invention.
Figure 14B:
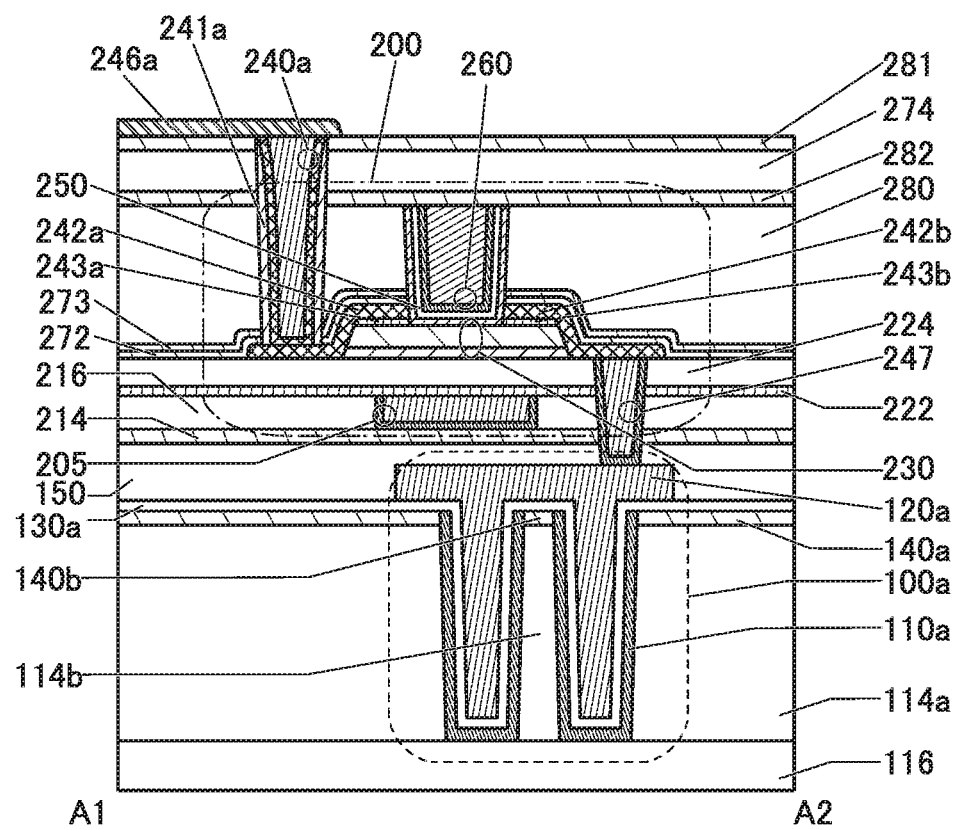

FIG. 14(A) and FIG. 14(B) are a top view and a cross-sectional view of a semiconductor device of one embodiment of the present invention including the transistor 200 and a capacitor 100a.

In FIG. 14, FIG. 14(A) illustrates a top view of a layer including the insulator 140 (an insulator 140a and an insulator 140b). Furthermore, FIG. 14(B) is a cross-sectional view corresponding to a portion indicated by a dashed-dotted line A1-A2 in FIG. 14(A), and is also a cross-sectional view of the transistor 200 in the channel length direction.

The semiconductor device illustrated in FIG. 14 is different from the semiconductor device illustrated in FIG. 13 in that the shape of the capacitor 100a is different from that of the capacitor 100. The capacitor 100a includes an insulator 114a, an insulator 114b, the insulator 140a, the insulator 140b, a conductor 110a, an insulator 130a, and a conductor 120a. Here, the insulator 114a and the insulator 114b correspond to the insulator 114, the insulator 140a and the insulator 140b correspond to the insulator 140, the conductor 110a corresponds to the conductor 110, the insulator 130a corresponds to the insulator 130, and the conductor 120a corresponds to the conductor 120; therefore, for the details, the above description can be referred to.

In the capacitor 100a, the insulator 114b with a columnar shape and the insulator 140b are formed in an opening in the insulator 114a and the insulator 140a. Also at the side surfaces of the columnar insulator 114b and the insulator 140b, the conductor 110a and the conductor 120a face each other with the insulator 130a positioned therebetween. Accordingly, the capacitor 100a can be formed not only at the side surfaces of the insulator 114a and the insulator 140a, but also at the side surfaces of the insulator 114b and the insulator 140b. Accordingly, the capacitance of the capacitor 100a can be larger than that of the capacitor 100, while the area occupied by the 100a is substantially the same as that of the capacitor 100.

Modification Example 3 of Semiconductor Device

Figure 15A:
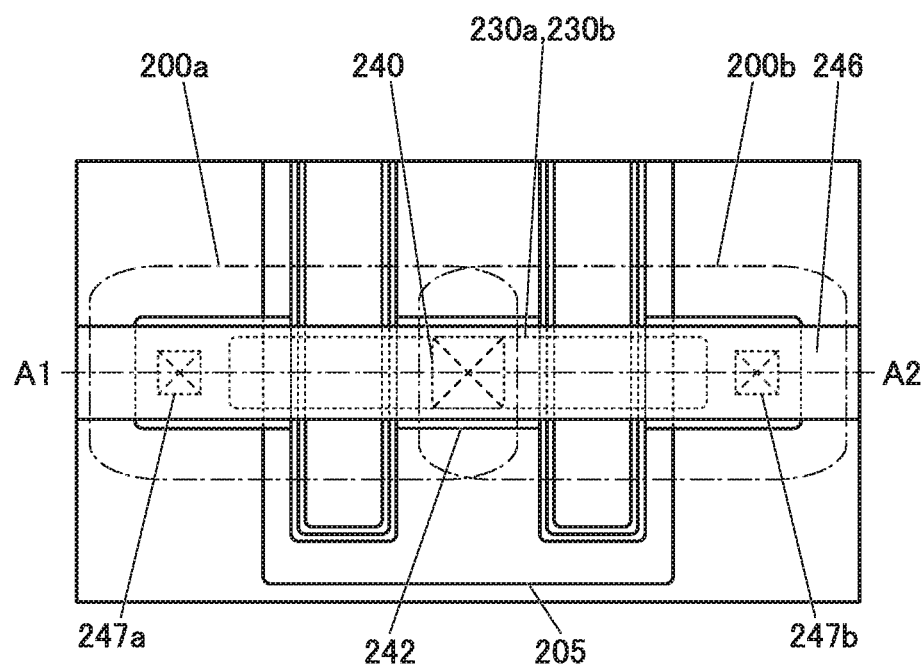
FIG. 15 (A)(B) A top view and a cross-sectional view of a semiconductor device of one embodiment of the present invention.
Figure 15B:
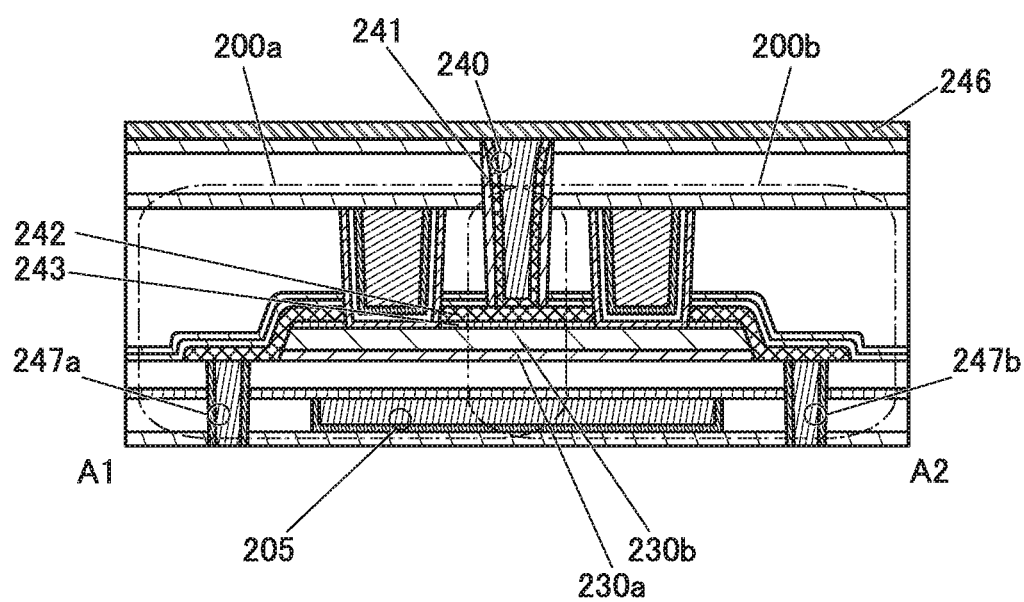

FIG. 15(A) and FIG. 15(B) are a top view and a cross-sectional view of a semiconductor device including a transistor 200a and a transistor 200b of one embodiment of the present invention.

In FIG. 15, FIG. 15(A) illustrates a top view. FIG. 15(B) is a cross-sectional view corresponding of a portion indicated by a dashed-dotted line A1-A2 in FIG. 15(A) and also is a cross-sectional view of the transistor 200a and the transistor 200b in a channel length direction. For clarity of the drawing, some components are not illustrated in the top view of FIG. 15(A).

In the semiconductor device illustrated in FIG. 15, the transistor 200a and the transistor 200b each have a similar structure to that of the transistor 200 except that the conductor 205, the oxide 230a, the oxide 230b, the oxide 243, the conductor 242, the conductor 240, the insulator 241, and the conductor 246 are shared between the transistor 200a and the transistor 200b. Thus, for the details, the above description can be referred to.

As illustrated in FIGS. 15(A) and 15(B), when the transistor 200a and the transistor 200b share the conductor 240, the area occupied by one transistor element in the top view can be reduced; therefore, higher integration of the semiconductor device can be achieved.

Note that although in this modification example, a structure where the transistor 200a includes a conductor 247a and the transistor 200b includes a conductor 247b is described, although, one embodiment of the present invention is not limited thereto. For example, a structure may be employed where, as in the structure in FIG. 13, a capacitor electrically connected to the transistor 200a through the conductor 247a may be provided below the transistor 200a, and a capacitor electrically connected to the transistor 200b through the conductor 247b may be provided below the transistor 200b.

Modification Example 4 of Semiconductor Device

Figure 16A:
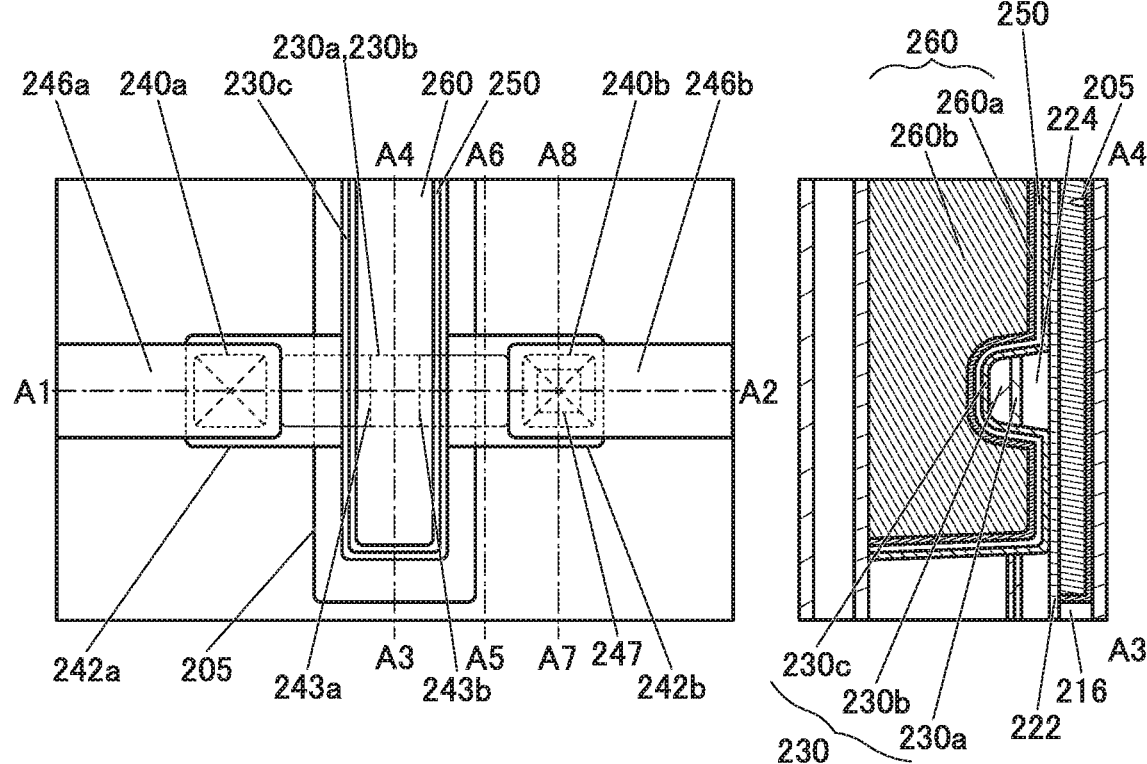
FIG. 16 (A)-(C) A top view and cross-sectional views of a semiconductor device of one embodiment of the present invention.
Figure 16C:
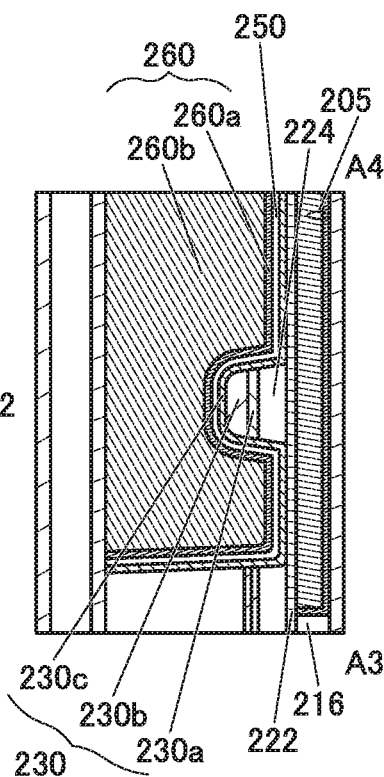
Figure 16B:
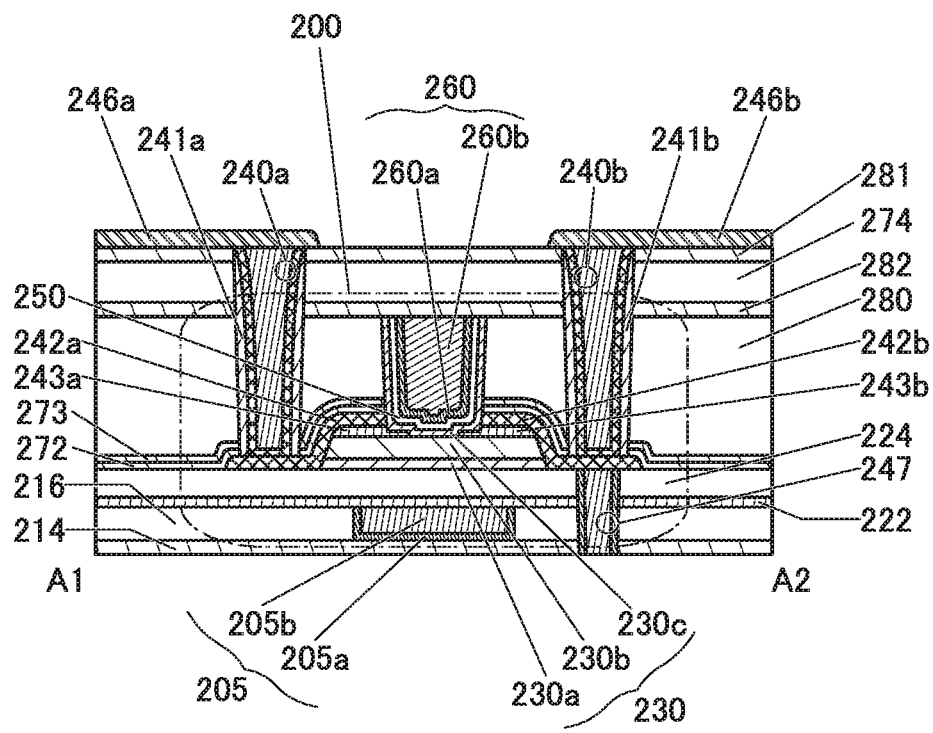
Figure 17:
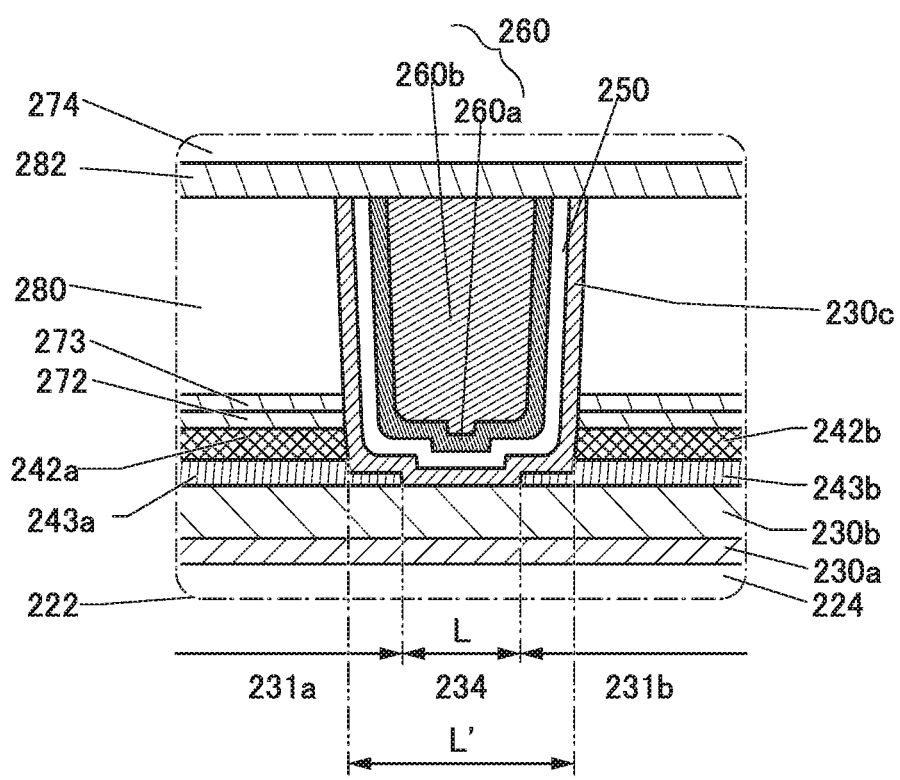
FIG. 17 A cross-sectional view of a semiconductor device of one embodiment of the present invention.

The semiconductor devices illustrated in FIG. 16 to FIG. 18 are semiconductor devices including the transistor 200 with a different shape from the transistor 200 illustrated in FIG. 1.

Figure 18A:
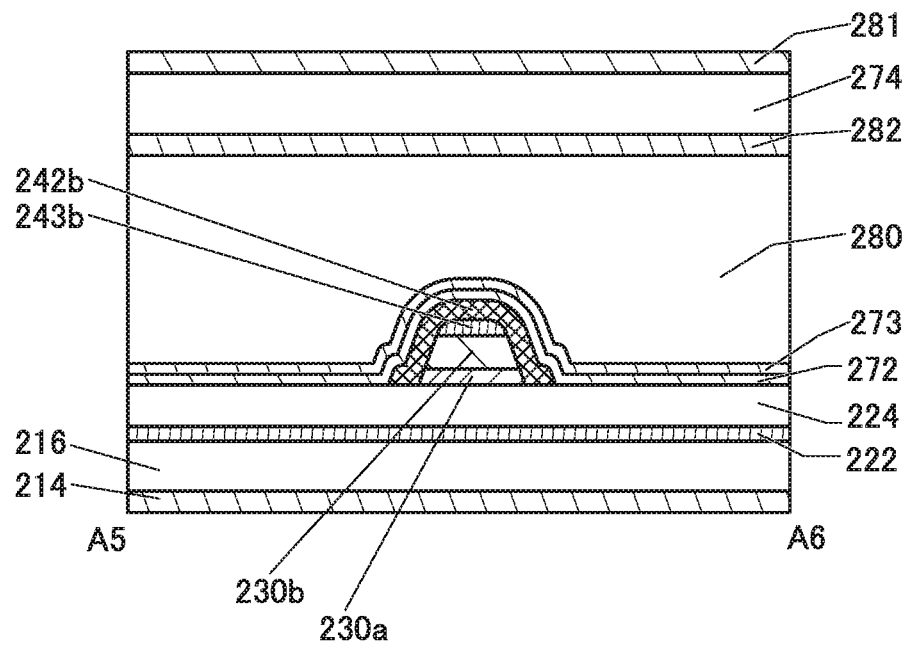
FIG. 18 (A), (B) Cross-sectional views of a semiconductor device of one embodiment of the present invention.
Figure 18B:
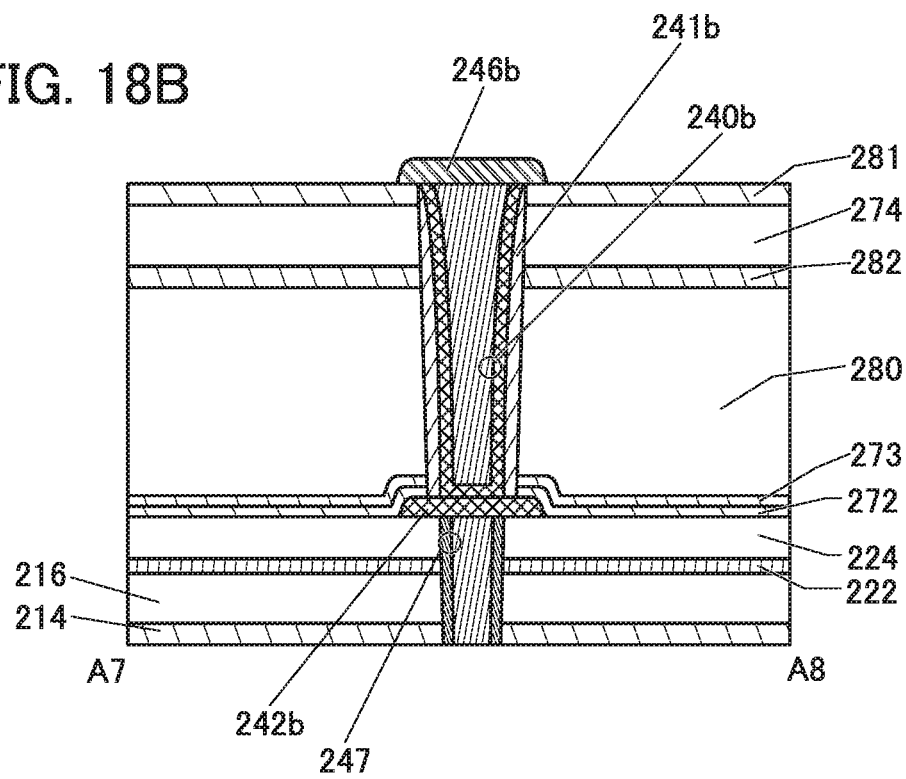
Figure 19A:
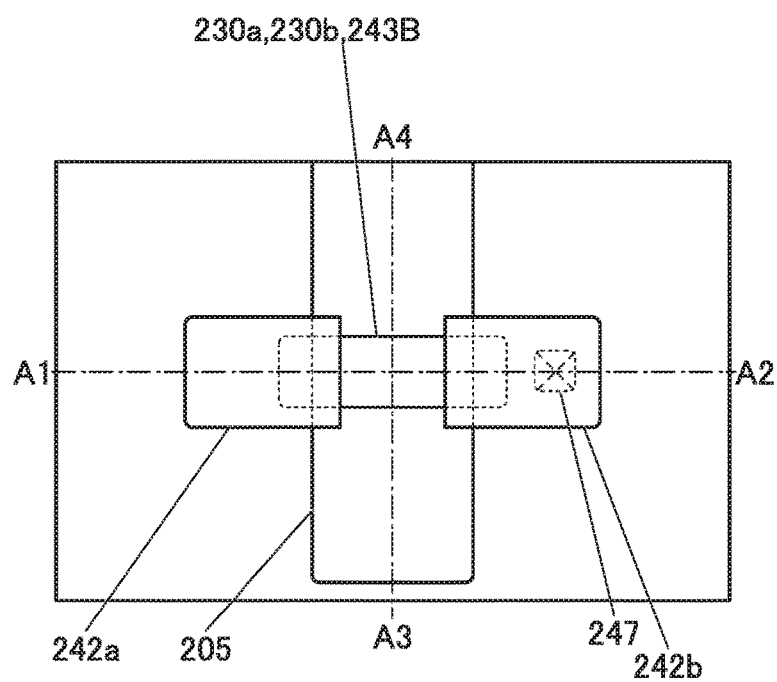
FIG. 19 (A)-(C) A top view and cross-sectional views illustrating a method for fabricating a semiconductor device of one embodiment of the present invention.
Figure 19C:
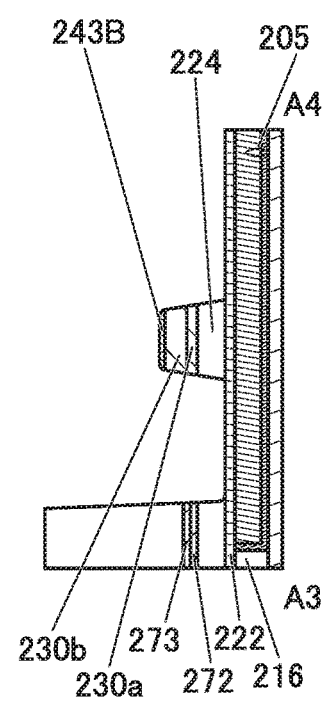
Figure 19B:
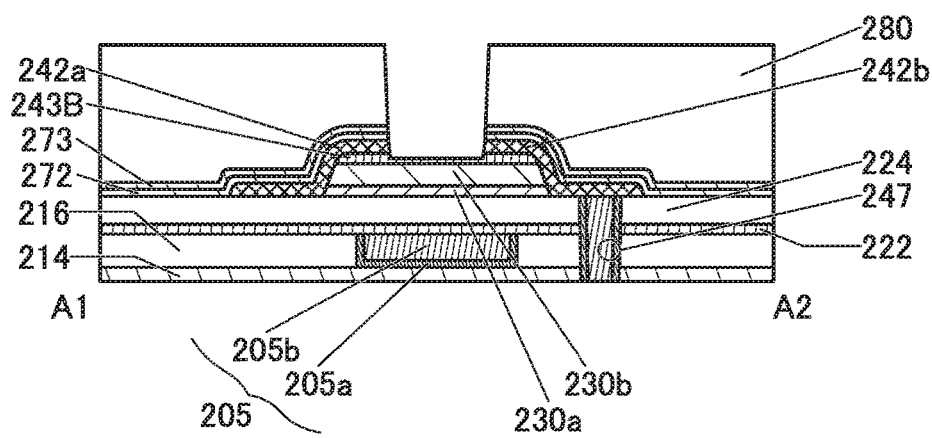

FIG. 16(A) is a top view of a semiconductor device including the transistor 200. FIG. 16(B) and FIG. 16(C) are cross-sectional views of the semiconductor device. Here, FIG. 16(B) is a cross-sectional view of a portion indicated by a dashed-dotted line A1-A2 in FIG. 16(A), and is a cross-sectional view of the transistor 200 in the channel length direction In addition, FIG. 16(C) is a cross-sectional view of a portion indicated by a dashed-dotted line A3-A4 in FIG. 16(A), and is a cross-sectional view of the transistor 200 in the channel width direction. For clarity of the drawing, some components are not illustrated in the top view of FIG. 16(A). FIG. 17 is an enlarged view of the vicinity of a channel formation region of the transistor 200 in FIG. 16(B). FIG. 18(A) is a cross-sectional view of a portion indicated by a dashed-dotted line A5-A6 in FIG. 16(A), and is also a cross-sectional view in the channel width direction of a source region or a drain region of the transistor 200. FIG. 18(B) is a cross-sectional view of a portion indicated by a dashed-dotted line A7-A8 in FIG. 16(A), which corresponds to a cross-sectional view in the channel width direction of the conductor 240b electrically connected to the transistor 200 and functioning as a plug.

The semiconductor device illustrated in FIG. 16 and the like includes the insulator 214 over a substrate (not illustrated), the transistor 200 over the insulator 214, the insulator 280 over the transistor 200, the insulator 282 over the insulator 280, the insulator 274 over the insulator 282, and the insulator 281 over the insulator 274. The insulator 214, the insulator 280, the insulator 282, the insulator 274, and the insulator 281 function as interlayer films. The conductor 247 functioning as a plug and electrically connected to the transistor 200 is provided. In addition, the conductor 240 (the conductor 240a and the conductor 240b) that is electrically connected to the transistor 200 and functions as a plug is preferably provided. Note that the insulator 241 (the insulator 241a and the insulator 241b) is provided in contact with the side surface of the conductor 240 functioning as a plug. The conductor 246 (the conductor 246a and the conductor 246b) electrically connected to the conductor 240 and functioning as a wiring is provided over the insulator 281 and the conductor 240.

As illustrated in FIG. 16, the transistor 200 includes the insulator 216 over the insulator 214; the conductor 205 (the conductor 205a and the conductor 205b) positioned so as to be embedded in the insulator 216; the insulator 222 over the insulator 216 and the conductor 205; the insulator 224 over the insulator 222; the oxide 230a over the insulator 224; the oxide 230b over the oxide 230a; the oxide 243a and the oxide 243b over the oxide 230b; the conductor 242a in contact with part of the top surface of the insulator 224, the side surface of the oxide 230a, the side surface of the oxide 230b, the side surface of the oxide 243a, and the top surface of the oxide 243a; the conductor 242b in contact with part of the top surface of the insulator 224, the side surface of the oxide 230a, the side surface of the oxide 230b, the side surface of the oxide 243b, and the top surface of the oxide 243b; the oxide 230c over the oxide 230b; the insulator 250 over the oxide 230c; the conductor 260 (the conductor 260a and the conductor 260b) positioned over the insulator 250 and overlapping with the oxide 230c; the insulator 272 in contact with part of the top surface of the insulator 224, the side surface of the conductor 242a, the top surface of the conductor 242a, the side surface of the conductor 242b, and the top surface of the conductor 242b; and the insulator 273 over the insulator 272. The oxide 230c is in contact with each of the side surface of the oxide 243a, the top surface of an area of the oxide 243a that does not overlap with the conductor 242a, the side surface of the oxide 243b, and the top surface of an area of the oxide 243b that does not overlap with the conductor 242b.

Here, the oxide 243a includes the region that does not overlap with the conductor 242a, and the oxide 243b includes the region that does not overlap with the conductor 242b. That is, the oxide 243a and the oxide 243b are provided so as to have a portion that projects into the opening provided in the insulator 280. In this regard, the transistor 200 illustrated in FIG. 16 is different from the transistor illustrated in FIG. 1. For other structures of the semiconductor device illustrated in FIG. 16, corresponding structures illustrated in FIG. 1 can be referred to.

FIG. 17 is an enlarged view of the vicinity of the channel formation region of the transistor 200 in FIG. 16(B). As illustrated in FIG. 17, the side surfaces of the oxide 243a and the oxide 243b that face each other are positioned in an inner side of the side surfaces of the conductor 242a and the conductor 242b that face each other. Thus, the distance between a source electrode and a drain electrode of the transistor 200, that is, the length of the channel length (L) is determined by the distance between the oxide 243a and the oxide 243b. The distance between the oxide 243a and the oxide 243b can be shorter than the width of the opening provided in the insulator 280, and than the distance between the conductor 242a and the conductor 242b. That is, the opening provided in the insulator 280 can be formed large; thus, the oxide 230c, the insulator 250, and the conductor 260 can be embedded easily in the opening even when the channel length of the transistor 200 is provided to be short.

For example, in the case where the channel length (L) of the transistor 200 is 20 nm, the width of the opening formed in the insulator 280 can be 60 nm when the width of the region of the oxide 243 that does not overlap with the conductor 242 can be 20 nm. Similarly, the width of the opening formed in the insulator 280 can be 30 nm when the width of the region of the oxide 243 that does not overlap with the conductor 242 can be 5 nm. In addition, part of the oxide 243 and part of the conductor 260 can overlap with each other. Furthermore, in the case where the length (L) between the conductor 242a and the conductor 242b illustrated in FIG. 17 is 60 nm, for example, the length of the channel length (L) can be less than 60 nm, preferably less than or equal to 30 nm, more preferably greater than or equal to 5 nm and less than or equal to 10 nm.

Here, in the oxide 230b, a region 234 functions as a channel formation region, a region 231a functions as one of a source region and a drain region, and a region 231b functions as the other of the source region and the drain region.

FIG. 18(A) is a cross-sectional view of a portion indicated by a dashed-dotted line A5-A6 in FIG. 16(A), and is also a cross-sectional view in the channel width direction of a source region or a drain region of the transistor 200. As illustrated in FIG. 18(A), a structure is employed in which the top surface of the conductor 242b and the side surface of the conductor 242b are covered with the insulator 272 and the insulator 273; thus, oxygen and impurities such as hydrogen and water can be inhibited from being diffused into the conductor 242b from the side surface direction of the conductor 242b and the top surface direction of the conductor 242b. Diffusion of oxygen from the periphery of the conductor 242b into the conductor 242b can be inhibited, so that the oxidation of the conductor 242b can be inhibited. Note that a similar effect can also be obtained with the conductor 242a. Impurities such as hydrogen and water can be inhibited from being diffused into the oxide 203a and the oxide 230b from the side surface direction of the oxide 230a and the side surface direction of the oxide 230b. For the insulator 272, a silicon oxide film, a silicon nitride film or a silicon nitride oxide film can be used, for example. For the insulator 273, aluminum oxide or hafnium oxide can be used, for example.

FIG. 18(B) is a cross-sectional view of a portion indicated by a dashed-dotted line A7-A8 in FIG. 16(A), which corresponds to a cross-sectional view in the channel width direction of the conductor 240b electrically connected to the transistor 200 and functioning as a plug. As illustrated in FIG. 18(B), the conductor 240b is provided in contact with the top surface of the conductor 242b. Since the insulator 241b is positioned at the side surface of the conductor 240b, oxygen and impurities such as hydrogen and water from the insulator 280 can be prevented from diffusing into the conductor 240b. Note that a similar effect can also be obtained with the conductor 240a.

As illustrated in FIGS. 16(A) and 16(B) and FIG. 18(B), it is preferable that the conductor 240b be provided so as to overlap with at least part of the conductor 247. Accordingly, the area occupied by the conductor 240b and the conductor 247 in a top-view can be reduced; thus, miniaturization or higher integration of the semiconductor device of this embodiment can be achieved.

Next, a method for fabricating the semiconductor device including the transistor 200 shown in FIG. 16 will be described with reference to FIG. 19 to FIG. 23. In addition, (A) in each of FIG. 19 to FIG. 23 is a top view. Furthermore, (B) in each drawing is a cross-sectional view corresponding to a portion indicated by a dashed-dotted line A1-A2 in (A), and is also a cross-sectional view of the transistor 200 in the channel length direction. Moreover, (C) in each drawing is a cross-sectional view corresponding to a portion indicated by a dashed-dotted line A3-A4 in (A), and is also a cross-sectional view of the transistor 200 in the channel width direction. Note that for simplification of the drawing, some components are not illustrated in the top view of (A) in each drawing.

First, as described above, a fabrication process of the semiconductor device is performed using the method illustrated in FIG. 4 to FIG. 6.

Next, the insulating film to be the insulator 280 is deposited over the insulating film 273A. The insulating film to be the insulator 280 can be deposited by a sputtering method, a CVD method, an MBE method, a PLD method, an ALD method, or the like. Next, the insulating film to be the insulator 280 is subjected to CMP treatment, so that the insulator 280 having a flat top surface is formed (see FIG. 19).

Then, part of the insulator 280, part of the insulating film 273A, part of the insulating film 272A, and part of the conductor layer 242B are processed to form an opening that exposes the oxide layer 243B. The opening is preferably formed to overlap with the conductor 205. The conductor 242a, the conductor 242b, the insulator 272, and the insulator 273 are formed by forming the opening. Due to the formation of the opening, the thickness of part of the oxide layer 243B decreases in some cases (see FIG. 19).

Part of the insulator 280, part of the insulating film 273A, part of the insulating film 272A, and part of the conductor layer 242B may be processed under different conditions. For example, part of the insulator 280 may be processed by a dry etching method, part of the insulating film 273A may be processed by a wet etching method, and part of the insulating film 272A and part of the conductor layer 242B may be processed by a dry etching method.

Figure 20A:
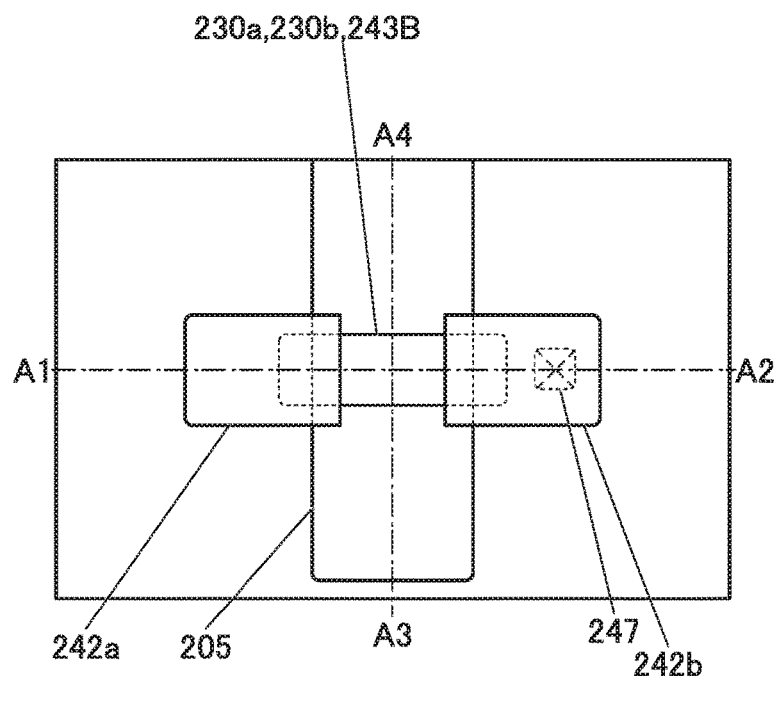
FIG. 20 (A)-(C) A top view and cross-sectional views illustrating a method for fabricating a semiconductor device of one embodiment of the present invention.
Figure 20C:
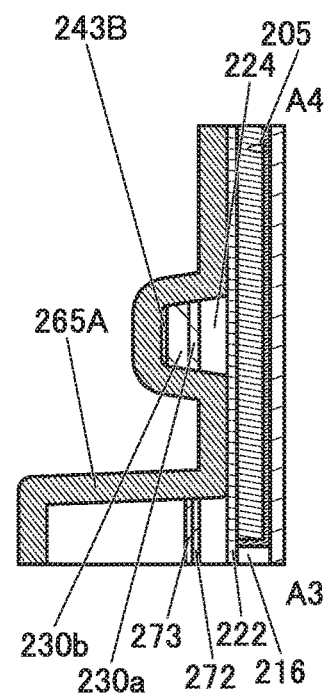
Figure 20B:
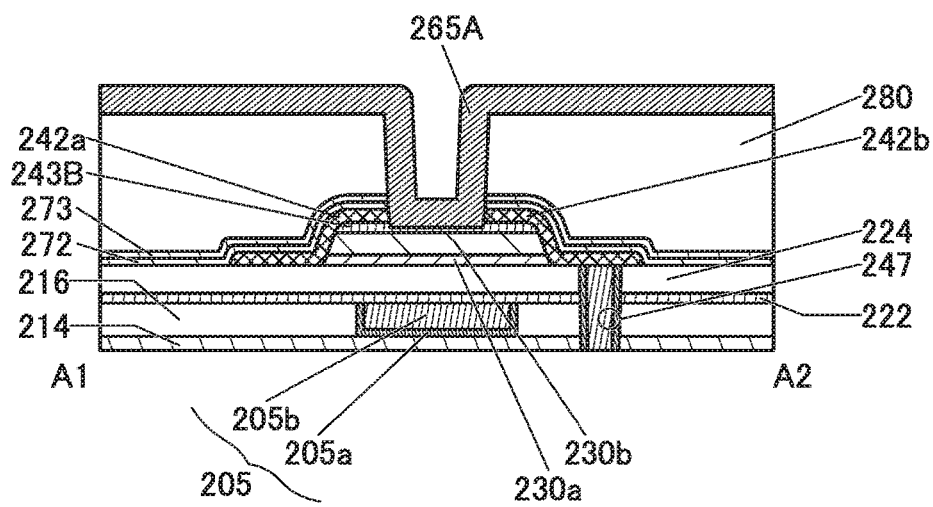

Next, a dummy film 265A is formed over the insulator 280 and in the opening (see FIG. 20). The dummy film 265A needs to be deposited on a sidewall of the opening; the distance between the oxide 243a and the oxide 243b, that is, the channel length (L) is determined by the thickness of the dummy film. Thus, the dummy film 265A is preferably deposited by an ALD method or a CVD method that provides good coverage and makes fine adjustment of the thickness comparatively easily. The dummy film 265A may be formed so as to have a thickness at the side surface of the opening of greater than or equal to 5 nm and less than or equal to 20 nm, and may be provided as appropriate depending on electrical characteristics required for the transistor 200. For example, in the case where the thickness of the dummy film 265A at the sidewall of the opening is 5 nm, the channel length can be 10 nm shorter than the width of the opening; and in the case where the thickness of the dummy film 265A at the sidewall of the opening is 20 nm, the channel length can be 40 nm shorter than the width of the opening. Note that it is preferable to use a film that can be easily processed minutely and easily removed as the dummy film 265A because the dummy film 265A is finally removed.

Figure 21A:
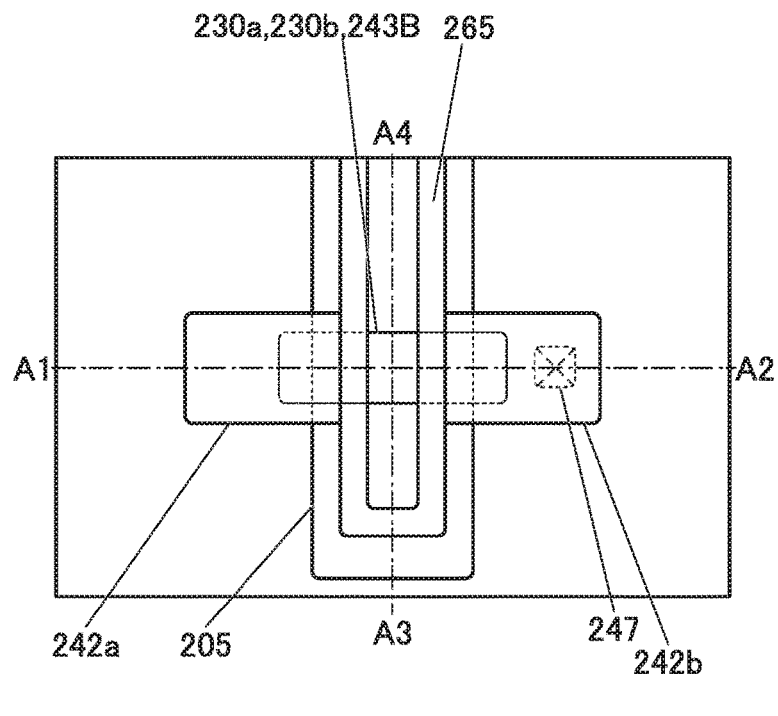
FIG. 21 (A)-(C) A top view and cross-sectional views illustrating a method for fabricating a semiconductor device of one embodiment of the present invention.
Figure 21C:
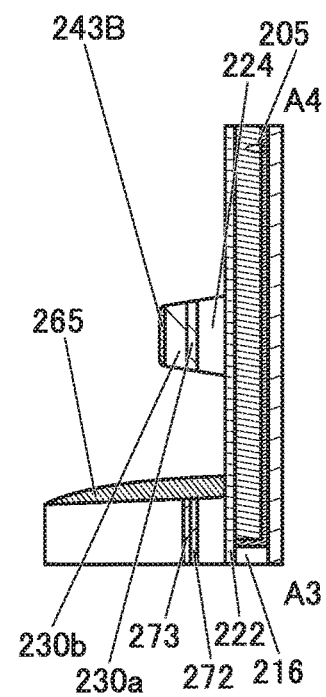
Figure 21B:
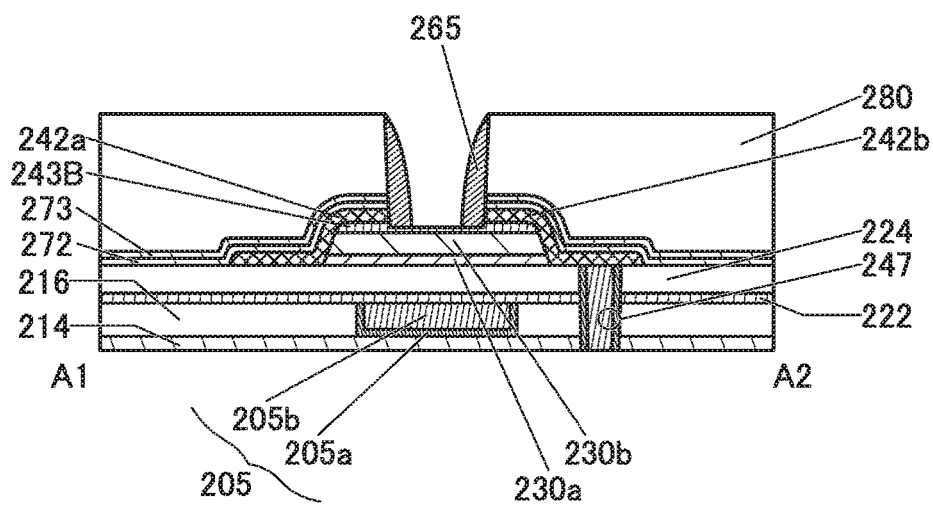

Next, the dummy film 265A is subjected to anisotropic etching such that only a portion of the dummy film 265A in contact with the side surface of the opening remains, whereby a dummy film 265 is formed (see FIG. 21). Here, the width of the dummy film 265 is preferably greater than or equal to 5 nm and less than or equal to 20 nm. The width of the dummy film 265 depends on the thickness of the dummy film 265A at the side surface of the opening. In the case where the width of the dummy film 265 becomes short relative to the thickness of the dummy film 265A at the side surface of the opening, the dummy film 265A can be formed thicker; therefore, the thickness of the dummy film 265A is not limited to the value mentioned above.

Figure 22A:
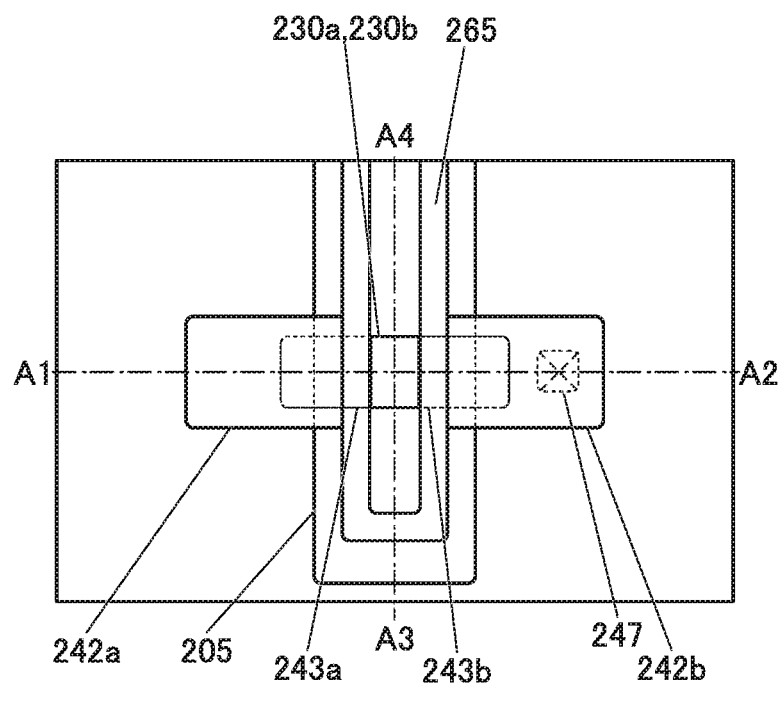
FIG. 22 (A)-(C) A top view and cross-sectional views illustrating a method for fabricating a semiconductor device of one embodiment of the present invention.
Figure 22C:
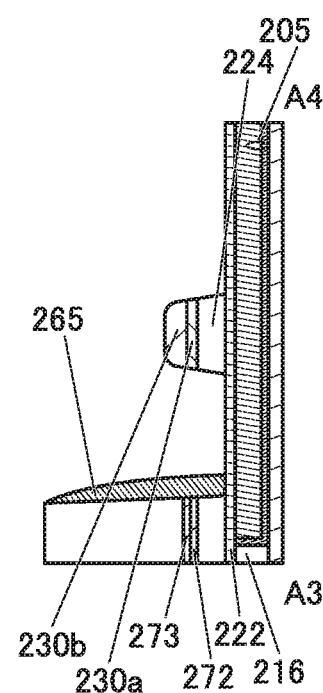
Figure 22B:
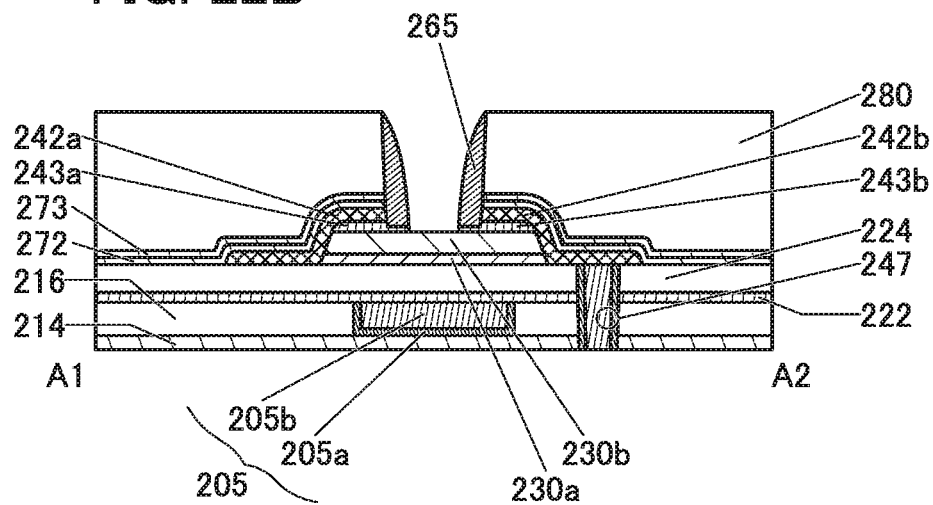

Next, the oxide layer 243B is etched using the dummy film 265 as a mask, whereby the oxide 243a and the oxide 243b are formed (see FIG. 22). Note that etching of the dummy film 265 and etching of the oxide layer 243B may be performed successively. Furthermore, in some cases, part of the top surface of the oxide 230b that is exposed through the region between the oxide 243a and the oxide 243b is removed.

At this time, the oxide layer 243B is processed using the dummy film 265 as a mask, whereby the oxide 243a and the oxide 243b are formed. Thus, the opening formed in the insulator 280 overlaps with a region between the conductor 242a and the conductor 242b and a region between the oxide 243a and the oxide 243b. In this manner, the conductor 260 can be positioned between the conductor 242a and the conductor 242b and between the oxide 243a and the oxide 243b in a self-aligned manner in a later step.

In this embodiment, a method for forming the oxide layer 243B using the dummy film 265 is described; however, the method is not limited thereto. For example, the oxide 243a and the oxide 243b may be formed in such a manner that after the oxide layer 243B is formed, a resist mask or the like is formed by performing patterning treatment, and the oxide layer 243B is processed using the resist mask.

Figure 23A:
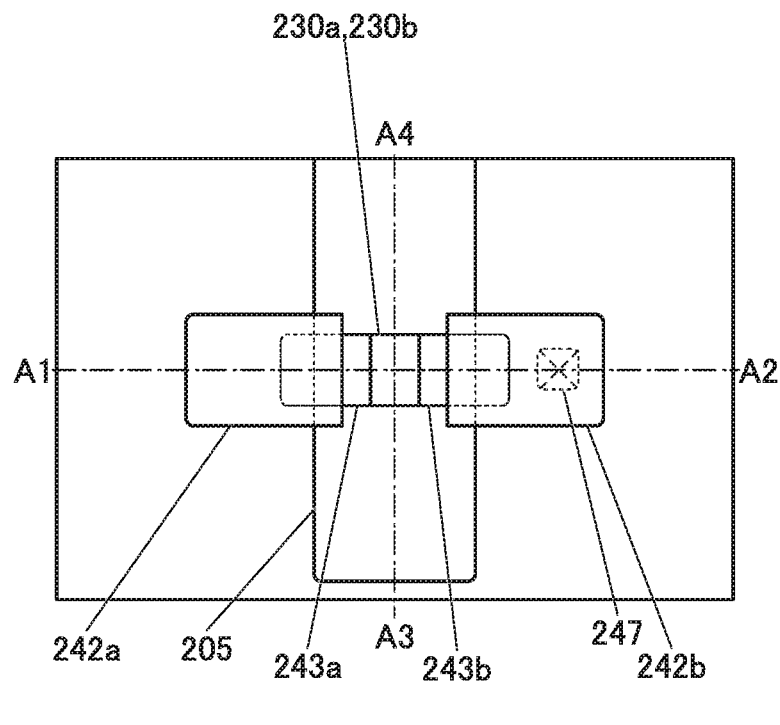
FIG. 23 (A)-(C) A top view and cross-sectional views illustrating a method for fabricating a semiconductor device of one embodiment of the present invention.
Figure 23C:
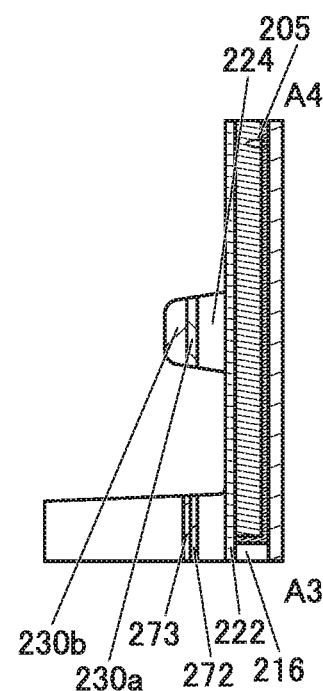
Figure 23B:
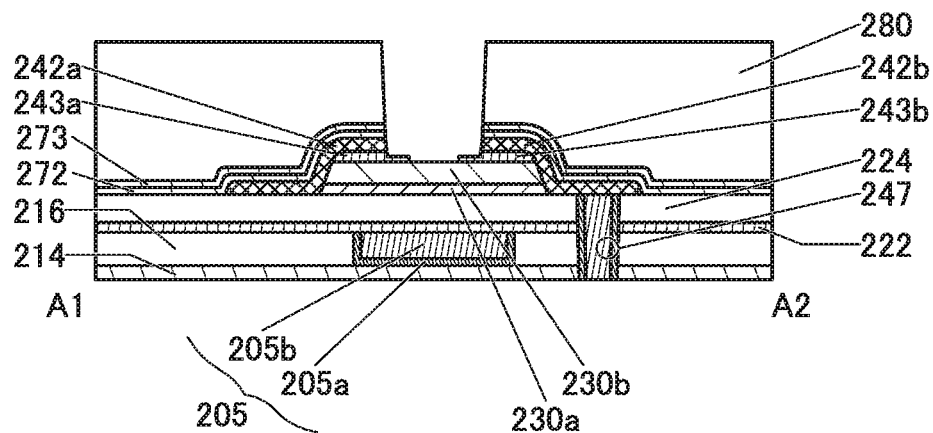

Then, the dummy film 265 is selectively removed using isotropic etching (see FIG. 23). As the isotropic etching, wet etching or etching using a reactive gas is used, for example. In this manner, the distance between the oxide 243a and the oxide 243b can be shorter than the length of the opening in the channel length direction.

In some cases, treatment such as dry etching performed in the above process causes the attachment or diffusion of impurities due to an etching gas or the like to a surface or an inside of the oxide 230a, the oxide 230b, or the like. Examples of the impurities include fluorine and chlorine.

In order to remove the impurities and the like, cleaning is performed. Examples of a cleaning method include wet cleaning using a cleaning solution or the like, plasma treatment using plasma, and cleaning by heat treatment, and these cleanings may be performed in appropriate combination.

As the wet cleaning, cleaning treatment may be performed using an aqueous solution obtained by diluting an oxalic acid, a phosphoric acid, ammonia water, a hydrofluoric acid, or the like with carbonated water or pure water. Alternatively, ultrasonic cleaning using pure water or carbonated water may be performed.

As described above, the manufacturing process of the semiconductor device can be performed using the method illustrated in FIG. 8 to FIG. 11. In such a manner, the semiconductor device illustrated in FIG. 16 can be fabricated. The structure, method, and the like described in the above modification example can be used in combination as appropriate with the other structures, methods, and the like described in this embodiment.

The structure, method, and the like described above in this embodiment can be used in combination as appropriate with the structures, methods, and the like described in the other embodiments.

Embodiment 2

In this embodiment, one embodiment of a semiconductor device will be described with reference to FIG. 24 to FIG. 26.

[Memory Device 1]

Figure 24:
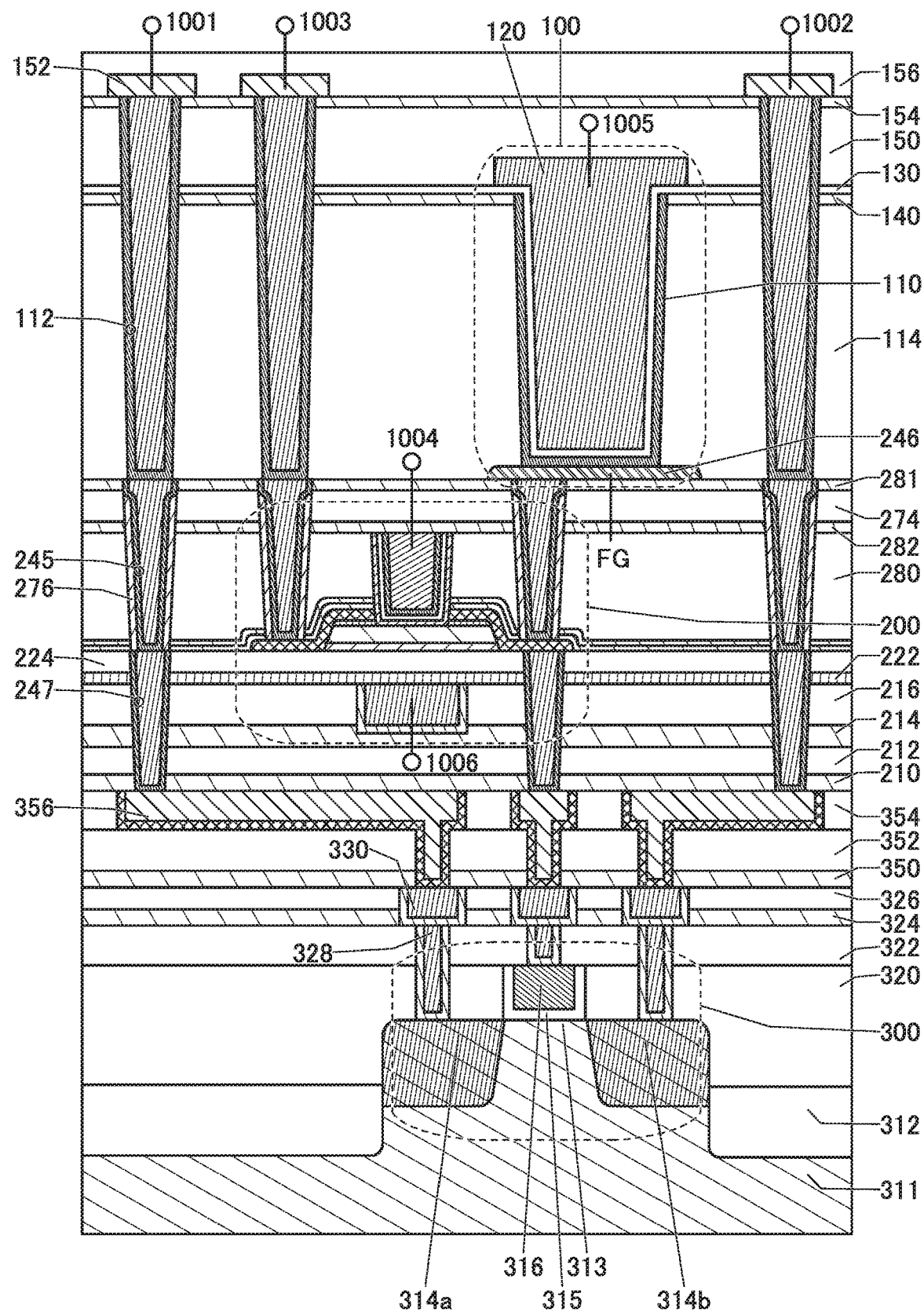
FIG. 24 A cross-sectional view illustrating a structure of a memory device of one embodiment of the present invention.

FIG. 24 illustrates an example of a semiconductor device (memory device) in which the capacitor of one embodiment of the present invention is used. In the semiconductor device of one embodiment of the present invention, the transistor 200 is provided above a transistor 300, and a capacitor 100 is provided above the transistor 300 and the transistor 200. Preferably, at least part of the capacitor 100 or the transistor 300 overlaps with the transistor 200. Accordingly, the area occupied by the capacitor 100, the transistor 200, and the transistor 300 in a top view can be reduced, whereby miniaturization or high integration of the semiconductor device of this embodiment can be achieved.

Note that the transistor 200 described in the above embodiment can be used as the transistor 200, and the capacitor 100 described in the above embodiment can be used as the capacitor 100. Therefore, for the transistor 200, the capacitor 100, and layers including the transistor 200 or the capacitor 100, the description in the above embodiment can be referred to. Unlike in the above embodiment, the capacitor 100 is provided over the transistor 200 in Memory device 1, which is different from the above embodiment.

The transistor 200 is a transistor whose channel is formed in a semiconductor layer containing an oxide semiconductor. Since the transistor 200 has a low off-state current, a memory device including the transistor 200 can retain stored data for a long time. In other words, such a memory device does not require refresh operation or has an extremely low frequency of the refresh operation, which leads to a sufficient reduction in power consumption of the memory device.

In the memory device illustrated in FIG. 24, a wiring 1001 is electrically connected to a source of the transistor 300, and a wiring 1002 is electrically connected to a drain of the transistor 300. A wiring 1003 is electrically connected to one of the source and the drain of the transistor 200. A wiring 1004 is electrically connected to a first gate of the transistor 200. A wiring 1006 is electrically connected to a second gate of the transistor 200. A gate of the transistor 300 and the other of the source and the drain of the transistor 200 are electrically connected to one electrode of the capacitor 100. A wiring 1005 is electrically connected to the other electrode of the capacitor 100. Note that anode connected to the gate of the transistor 300, the other of the source and the drain of the transistor 200, and the one electrode of the capacitor 100 is hereinafter referred to as a node FG in some cases.

The memory device illustrated in FIG. 24 is capable of data writing, retention, and reading by having a feature in that it is capable of retaining the potential of the gate of the transistor 300 (the node FG) by switching of the transistor 200.

Furthermore, by arranging the memory devices illustrated in FIG. 24 in a matrix, a memory cell array can be formed.

<Transistor 300>

The transistor 300 is provided over a substrate 311 and includes a conductor 316 functioning as a gate electrode, an insulator 315 functioning as a gate insulator, a semiconductor region 313 that is part of the substrate 311, and a low-resistance region 314a and a low-resistance region 314b functioning as a source region and a drain region.

Here, the insulator 315 is positioned over the semiconductor region 313, and the conductor 316 is positioned over the insulator 315. The transistors 300 formed in the same layer are electrically isolated from each other by an insulator 312 functioning as an element isolation insulating layer. The insulator 312 can be formed using an insulator similar to that used for an insulator 326 or the like described later. The transistor 300 may be a p-channel transistor or an n-channel transistor.

In the substrate 311, it is preferable that a region of the semiconductor region 313 where a channel is formed, a region in the vicinity thereof, the low-resistance region 314a and the low-resistance region 314b functioning as the source region and the drain region, and the like contain a semiconductor such as a silicon-based semiconductor and it is also preferable that single crystal silicon is included therein. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 300 may be an HEMT (High Electron Mobility Transistor) with GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to the semiconductor material used for the semiconductor region 313.

The conductor 316 functioning as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

Here, in the transistor 300 illustrated in FIG. 24, the semiconductor region 313 (part of the substrate 311) in which a channel is formed has a convex shape. Furthermore, the conductor 316 is provided so as to cover a side surface and top surface of the semiconductor region 313 with the insulator 315 positioned therebetween. Such a transistor 300 is also referred to as a FIN-type transistor because it utilizes a convex portion of the semiconductor substrate. Note that an insulator functioning as a mask for forming the convex portion may be placed in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 24 is only an example and is not limited to the structure illustrated therein; an appropriate transistor may be used in accordance with a circuit structure or a driving method.

<Wiring Layers>

Wiring layers provided with an interlayer film, a wiring, a plug, and the like may be provided between the components. A plurality of wiring layers can be provided in accordance with the design. Note that a plurality of conductors functioning as plugs or wirings are collectively denoted by the same reference numeral in some cases. Furthermore, in this specification and the like, a wiring and a plug electrically connected to the wiring may be a single component. That is, there are a case where part of a conductor functions as a wiring and a case where part of a conductor functions as a plug.

For example, an insulator 320, an insulator 322, an insulator 324, and an insulator 326 are sequentially stacked over the transistor 300 as interlayer films. In addition, A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as plugs or wirings.

The insulator functioning as an interlayer film may function as a planarization film that covers an uneven shape thereunder. For example, a top surface of the insulator 322 may be planarized by planarization treatment using a chemical mechanical polishing (CMP) method or the like to improve planarity.

A wiring layer may be provided over the insulator 326 and the conductor 330. For example, in FIG. 24, an insulator 350, an insulator 352, and an insulator 354 are stacked in this order. Furthermore, a conductor 356 is formed in the insulator 350, the insulator 352, and the insulator 354. The conductor 356 functions as a plug or a wiring.

Similarly, a conductor 247, a conductor included in the transistor 200 (the conductor 205), and the like are embedded in an insulator 210, an insulator 212, the insulator 214, an insulator 216, an insulator 222, and an insulator 224. Note that the conductor 247 has a function of a plug or a wiring that is electrically connected to the capacitor 100, the transistor 200, or the transistor 300. For example, the conductor 247 is electrically connected to the conductor 316 functioning as the gate electrode of the transistor 300.

A conductor 112, conductors included in the capacitor 100 (the conductor 120 and the conductor 110) and the like are embedded in the insulator 114, the insulator 140, the insulator 130, the insulator 150, and an insulator 154 over the insulator 281. Note that the conductor 112 functions as a plug or a wiring that electrically connects the transistor 200 or the transistor 300 and a conductor 152 functioning as a terminal. An insulator 156 is provided over the insulator 154 and the conductor 152.

Examples of an insulator that can be used as an interlayer film include an oxide, a nitride, an oxynitride, a nitride oxide, a metal oxide, a metal oxynitride, and a metal nitride oxide, each of which has an insulating property.

For example, when a material having a low relative permittivity is used for the insulator functioning as an interlayer film, the parasitic capacitance generated between wirings can be reduced. Thus, a material is preferably selected depending on the function of the insulator.

For example, for the insulator 320, the insulator 322, the insulator 326, the insulator 352, the insulator 354, the insulator 212, the insulator 114, the insulator 150, the insulator 156, and the like, an insulator with low relative permittivity is preferably used. For example, the insulator preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulators each preferably have a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (nylon, aramid, or the like), polyimide, polycarbonate, and acrylic.

It is preferable that the resistivity of an insulator provided over or under the conductor 152 be higher than or equal to $1.0 \times 10^{12}$ Ωcm and lower than or equal to $1.0 \times 10^{15}$ Ωcm, preferably higher than or equal to $5.0 \times 10^{12}$ Ωcm and lower than or equal to $1.0 \times 10^{14}$ Ωcm, further preferably higher than or equal to $1.0 \times 10^{13}$ Ωcm and lower than or equal to $5.0 \times 10^{13}$ Ωcm. When the resistivity of the insulator provided over or under the conductor 152 is within the above range, the insulator can disperse charge accumulated between the transistor 200, the transistor 300, the capacitor 100, the conductor 152, and the like and can inhibit poor characteristics and electrostatic breakdown of the transistor and a memory device including the transistor due to the charge, while maintaining the insulating property. For such an insulator, silicon nitride or silicon nitride oxide can be used. For example, the resistivity of the insulator 154 can be set within the above range.

When the transistor using an oxide semiconductor is surrounded by an insulator that has a function of inhibiting the transmission of oxygen and impurities such as hydrogen, the electrical characteristics of the transistor can be stable. Thus, an insulator having a function of inhibiting the transmission of oxygen and impurities such as hydrogen is used as the insulator 324, the insulator 350, the insulator 210, and the insulator 154.

As an insulator having a function of inhibiting the transmission of oxygen and impurities such as hydrogen, a single layer or a stacked layer of an insulator containing for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting the transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride can be used.

For the conductors that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electrical conductivity, typified by polycrystalline silicon containing an impurity element such as phosphorus, or silicide such as nickel silicide may be used.

For example, for the conductor 328, the conductor 330, the conductor 356, the conductor 247, the conductor 112, the conductor 152 or the like, a single layer or stacked layers of a conductive material such as a metal material, an alloy material, a metal nitride material, or a metal oxide material that is formed using the above material can be used. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

<Wiring or Plug in Layer Provided with Oxide Semiconductor>

In the case where an oxide semiconductor is used in the transistor 200, an insulator including an excess oxygen region is provided in the vicinity of the oxide semiconductor in some cases. In that case, an insulator having a barrier property is preferably provided between the insulator including the excess oxygen region and the conductor provided in the insulator including the excess oxygen region.

For example, an insulator 276 is preferably provided between the insulator 280 including excess oxygen and a conductor 245 in FIG. 24. Here, the conductor 245 corresponds to the conductor 240 described in the above embodiment and the insulator 276 corresponds to the insulator 241 described in the above embodiment. Since the insulator 276 is provided in contact with the insulator 272, the conductor 245 and the transistor 200 can be sealed by the insulators having a barrier property.

That is, the excess oxygen included in the insulator 280 can be inhibited from being absorbed by the conductor 245 when the insulator 276 is provided. In addition, diffusion of hydrogen, which is an impurity, into the transistor 200 through the conductor 245 can be inhibited when the insulator 276 is included.

Here, the conductor 245 functions as a plug or a wiring that is electrically connected to the capacitor 100, the transistor 200, or the transistor 300. For example, the conductor 245 electrically connects the conductor 242b functioning as the other of the source and the drain of the transistor 200 and the conductor 110 functioning as one of the electrodes of the capacitor 100 through the conductor 246.

The above is the description of the structure example. With the use of the structure, a change in electrical characteristics can be reduced and reliability can be improved in a semiconductor device using a transistor including an oxide semiconductor. Alternatively, a transistor including an oxide semiconductor and having high on-state current can be provided. Alternatively, a transistor including an oxide semiconductor and having low off-state current can be provided. Alternatively, a semiconductor device with low power consumption can be provided.

[Memory Device 2]

Figure 25:
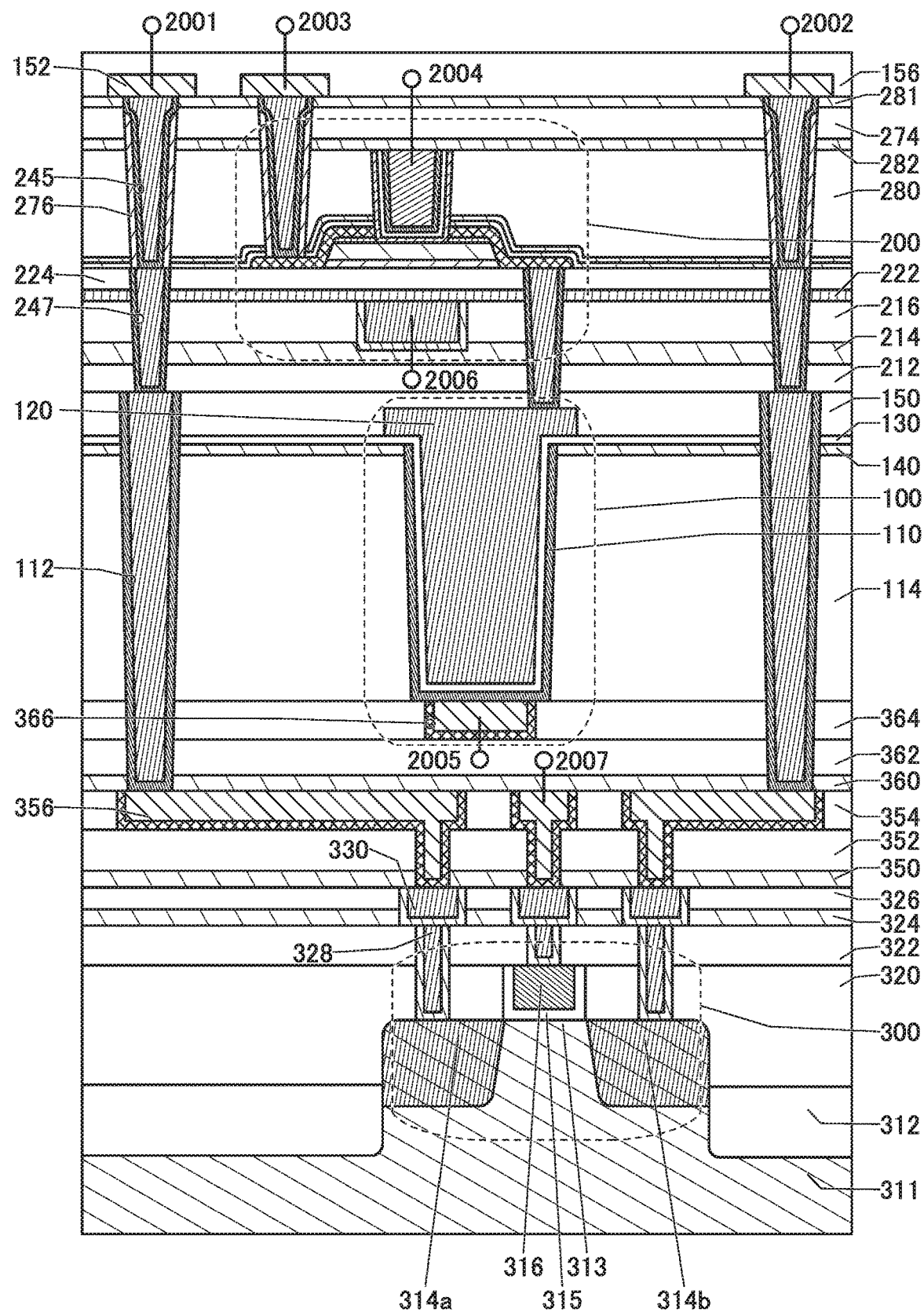
FIG. 25 A cross-sectional view illustrating a structure of a memory device of one embodiment of the present invention.

FIG. 25 illustrates an example of a memory device using the semiconductor device of one embodiment of the present invention. Like the semiconductor device illustrated in FIG. 24, the memory device illustrated in FIG. 25 includes the transistor 200, the transistor 300, and the capacitor 100. Note that the memory device illustrated in FIG. 25 is different from the memory device illustrated in FIG. 24 in that the capacitor 100 is positioned under the transistor 200 and the transistor 200 and the transistor 300 are not electrically connected to each other through the conductor 247.

In the semiconductor device of one embodiment of the present invention, the transistor 200 is provided above the transistor 300, and the capacitor 100 is provided below the transistor 200. Preferably, at least part of the capacitor 100 or the transistor 300 overlaps with the transistor 200. In such cases, the area occupied by the capacitor 100, the transistor 200, and the transistor 300 in the top view can be reduced, whereby the semiconductor device of this embodiment can be miniaturized or highly integrated.

Note that the capacitor 100, the transistor 200, and the transistor 300 mentioned above can be used as the capacitor 100, the transistor 200, and the transistor 300, respectively. Therefore, the above description can be referred to for the capacitor 100, the transistor 200, the transistor 300, and the layers including the capacitor 100, the transistor 200, or the transistor 300.

In the memory device illustrated in FIG. 25, a wiring 2001 is electrically connected to the source of the transistor 300, a wiring 2002 is electrically connected to the drain of the transistor 300, and a wiring 2007 is electrically connected to the gate of the transistor 300. A wiring 2003 is electrically connected to one of the source and the drain of the transistor 300, a wiring 2004 is electrically connected to a first gate of the transistor 200, and a wiring 2006 is electrically connected to a second gate of the transistor 200. The other of the source and the drain of the transistor 200 is electrically connected to one of the electrodes of the capacitor 100, and a wiring 2005 is electrically connected to the other electrode of the capacitor 100.

The memory device illustrated in FIG. 25 has characteristics of being able to retain charge stored in one of the electrodes of the capacitor 100 by switching of the transistor 200; thus, writing, retention, and reading of data can be performed.

Furthermore, by arranging the memory devices illustrated in FIG. 25 in a matrix, a memory cell array can be formed.

The layer including the transistor 300 has the same structure as that in the memory device illustrated in FIG. 24, and therefore the above description can be referred to for the structure below the insulator 354.

An insulator 360 is positioned over the insulator 354, an insulator 362 is positioned over the insulator 360, an insulator 364 is positioned over the insulator 362, and an insulator 114 is positioned over the insulator 364. An insulator that can be used as the insulator 350 and the like can be used as the insulator 360. For the insulator 362 and the insulator 364, an insulator that can be used for the insulator 352 or the like can be used.

An opening is formed in the insulator 364, and a conductor 366 is positioned in the opening. The conductor 366 is in contact with the bottom surface of the conductor 110. That is, the conductor 366 functions as a wiring that connects to the other electrode of the capacitor 100. For the conductor 366, an insulator that can be used for the conductor 356 and the like can be used.

The conductor 112, conductors included in the capacitor 100 (the conductor 120 and the conductor 110), and the like are embedded in the insulator 360, the insulator 362, the insulator 364, the insulator 114, the insulator 140, the insulator 130, and the insulator 150. Note that the conductor 112 functions as a plug or a wiring that electrically connects the transistor 300 and the conductor 152 that functions as a terminal.

The layer over the insulator 150 including the transistor 200 has the same structure as that in the memory device illustrated in FIG. 24; therefore, the above description can be referred to. However, the transistor 200 in the memory device illustrated in FIG. 25 does not include the conductor 240*b*. Furthermore, the conductor 152 is positioned over the conductor 245, and the insulator 156 is positioned over the conductor 152 and the insulator 281.

The conductor 247 functions as a plug or a wiring that is electrically connected to the capacitor 100, the transistor 200, or the transistor 300. For example, the conductor 247 is electrically connected to the conductor 120 functioning as the other electrode of the capacitor 100.

[Memory Device 3]

Figure 26:
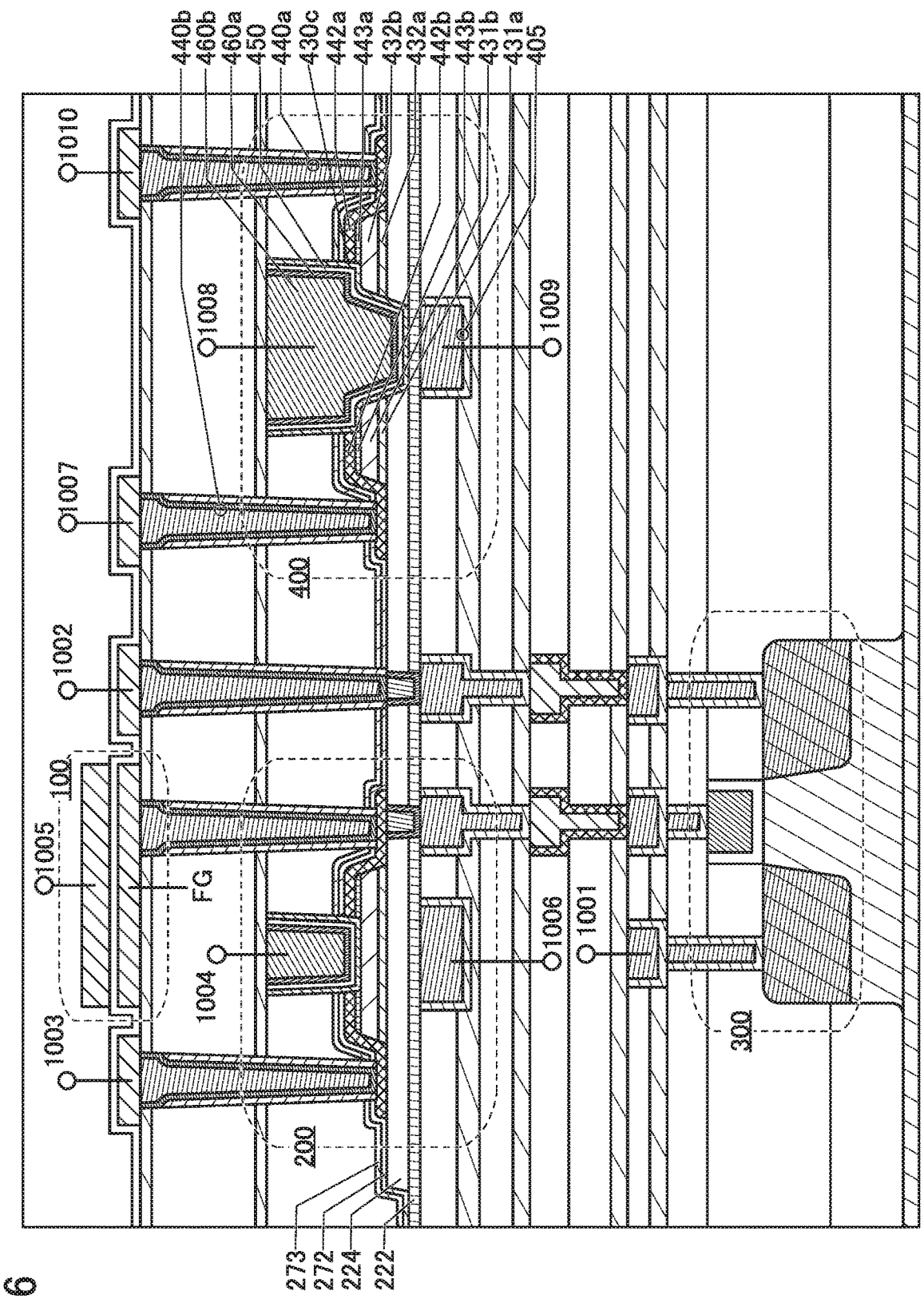
FIG. 26 A cross-sectional view illustrating a structure of a memory device of one embodiment of the present invention.

FIG. 26 illustrates an example of a memory device using the semiconductor device of one embodiment of the present invention. The memory device illustrated in FIG. 26 includes the transistor 400 in addition to the semiconductor device including the transistor 200, the transistor 300, and the capacitor 100 illustrated in FIG. 24.

The transistor 400 can control a second gate voltage of the transistor 200. For example, a first gate and a second gate of the transistor 400 are diode-connected to a source of the transistor 400, and the source thereof is connected to the second gate of the transistor 200. When a negative potential of the second gate of the transistor 200 is retained in this structure, the first gate-source voltage and the second gate-source voltage of the transistor 400 are 0 V. In the transistor 400, a drain current when the second gate voltage and the first gate voltage are 0 V is extremely low; thus, the negative potential of the second gate of the transistor 200 can be held for a long time even without power supply to the transistor 200 and the transistor 400. Accordingly, the memory device including the transistor 200 and the transistor 400 can retain stored data for a long time.

Hence, in FIG. 26, the wiring 1001 is electrically connected to the source of the transistor 300, and the wiring 1002 is electrically connected to the drain of the transistor 300. The wiring 1003 is electrically connected to one of the source and the drain of the transistor 200, the wiring 1004 is electrically connected to the gate of the transistor 200, and the wiring 1006 is electrically connected to a back gate of the transistor 200. A gate of the transistor 300 and the other of the source and the drain of the transistor 200 are electrically connected to one of the electrodes of the capacitor 100. The wiring 1005 is electrically connected to the other electrode of the capacitor 100. A wiring 1007 is electrically connected to the source of the transistor 400, a wiring 1008 is electrically connected to a gate of the transistor 400, a wiring 1009 is electrically connected to a back gate of the transistor 400, and a wiring 1010 is electrically connected to the drain of the transistor 400. The wiring 1006, the wiring 1007, the wiring 1008, and the wiring 1009 are electrically connected to each other.

When the memory devices illustrated in FIG. 26 are arranged in a matrix like the memory devices illustrated in FIG. 24, a memory cell array can be formed. Note that one transistor 400 can control second gate voltages of the transistors 200. For this reason, the number of provided transistors 400 is preferably smaller than the number of transistors 200.

Note that in the memory device illustrated in FIG. 24, the capacitor 100 is a cylinder shape; however, the present invention is not limited thereto. For example, as illustrated in FIG. 26, the capacitor 100 may be a planar shape.

<Transistor 400>

The transistor 400 and the transistors 200 are formed in the same layer and thus can be fabricated in parallel. The transistor 400 includes a conductor 460 (a conductor 460*a* and a conductor 460*b*) functioning as a first gate electrode; a conductor 405 (a conductor 405*a* and a conductor 405*b*) functioning as a second gate electrode; the insulator 222, the insulator 224, and an insulator 450 each functioning as a gate insulating layer; an oxide 430*c* including a region where a channel is formed; a conductor 442*a* functioning as one of a source and a drain; an oxide 443*a*, an oxide 431*a*, and an oxide 431*b*; a conductor 442*b* functioning as the other of the source and the drain; an oxide 443*b*, an oxide 432*a* and an oxide 432*b*; and a conductor 440 (a conductor 440*a* and a conductor 440*b*).

In the transistor 400, the conductor 405 is in the same layer as the conductor 205. The oxide 431*a* and the oxide 432*a* are in the same layer as the oxide 230*a*, and the oxide 431*b* and the oxide 432*b* are in the same layer as the oxide 230*b*. The conductor 442 is in the same layer as the conductor 242. The oxide 443 is in the same layer as the oxide 243. The oxide 430*c* is in the same layer as the oxide 230*c*. The insulator 450 is in the same layer as the insulator 250. The conductor 460 is in the same layer as the conductor 260.

Note that the structure bodies formed in the same layer can be formed at the same time. For example, the oxide 430*c* can be formed by processing an oxide film to be the oxide 230*c*.

In the oxide 430*c* functioning as an active layer of the transistor 400, oxygen vacancies and impurities such as hydrogen and water are reduced, as in the oxide 230 or the like. Accordingly, the threshold voltage of the transistor 400 can be higher than 0 V, an off-state current can be reduced, and the drain current at the time when the second gate voltage and the first gate voltage are 0 V can be extremely low.

<Dicing Line>

A dicing line (also referred to as a scribe line, a dividing line, or a cutting line in some cases) that is provided when a large-sized substrate is divided into semiconductor elements so that a plurality of semiconductor devices are each formed in a chip form will be described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 26, it is preferable that a region in which the insulator 272 and the insulator 222 are in contact with each other be the dicing line. That is, an opening is provided in the insulator 224 near the region to be the dicing line that is provided in the outer edge of the transistor 400 and the memory cell including a plurality of transistors 200. The insulator 272 is provided to cover the side surface of the insulator 224.

That is, in the opening provided in the insulator 272, the insulator 222 is in contact with the insulator 272. For example, the insulator 222 and the insulator 272 may be formed using the same material and the same method. When the insulator 222 and the insulator 272 are formed using the same material and the same method, the adhesion therebetween can be increased. For example, aluminum oxide is preferably used.

With such a structure, the insulator 224, the transistor 200, and the transistor 400 can be enclosed with the insulator 222 and the insulator 272. Since the insulator 222 and the insulator 272 have a function of inhibiting diffusion of oxygen, hydrogen, and water even when the substrate is divided into circuit regions each of which is provided with the semiconductor elements in this embodiment to form a plurality of chips, the entry and diffusion of impurities such as hydrogen or water from the direction of a side surface of the divided substrate to the transistor 200 or the transistor 400 can be inhibited.

In the structure, excess oxygen in the insulator 224 can be inhibited from diffusing into the outside of the insulator 272 and the insulator 222. Accordingly, excess oxygen in the insulator 224 is efficiently supplied to the oxide where the channel is formed in the transistor 200 or the transistor 400. The oxygen can reduce oxygen vacancies in the oxide where the channel is formed in the transistor 200 or the transistor 400. Thus, the oxide where the channel is formed in the transistor 200 or the transistor 400 can be an oxide semiconductor with a low density of defect states and stable characteristics. That is, a change in electrical characteristics of the transistors 200 or the transistor 400 can be inhibited and reliability can be improved.

This embodiment can be implemented in combination with any of the structures described in the other embodiments and the like, as appropriate.

Embodiment 3

In this embodiment, a memory device of one embodiment of the present invention including a transistor in which an oxide is used for a semiconductor (hereinafter referred to as an OS transistor in some cases) and a capacitor (hereinafter such a memory device is also referred to as an OS memory device in some cases) will be described with reference to FIG. 27 and FIG. 28. The OS memory device includes at least a capacitor and an OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 27A:
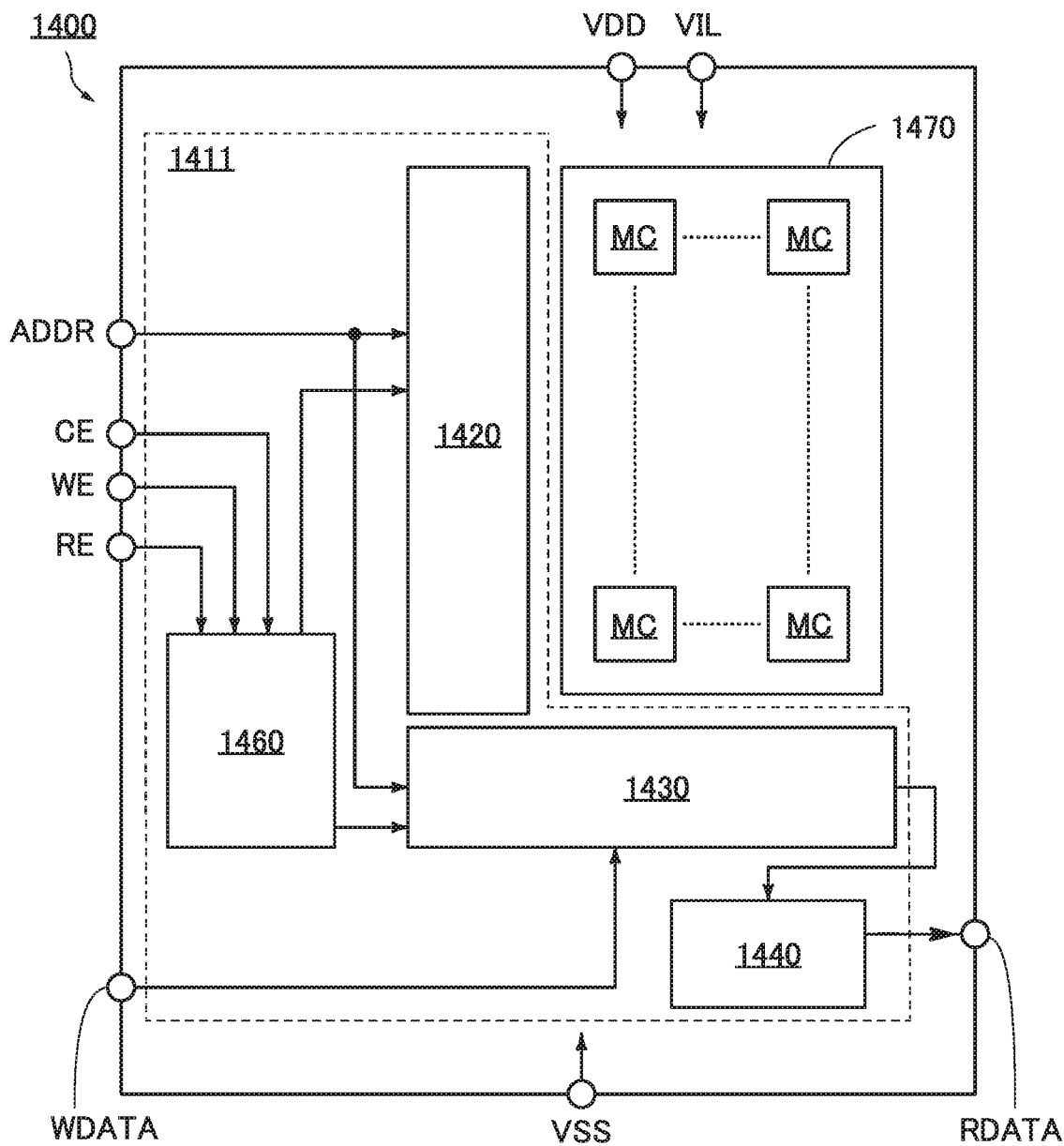
FIG. 27 (A)(B) Block diagrams illustrating structure examples of a memory device of one embodiment of the present invention.

FIG. 27(A) illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and will be described later in detail.

The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and WDATA is input to the write circuit.

The control logic circuit 1460 processes the signals (CE, WE, and RE) input from the outside, and generates control signals for the row decoder and the column decoder. CE denotes a chip enable signal, WE denotes a write enable signal, and RE denotes a read enable signal. Signals processed by the control logic circuit 1460 are not limited thereto, and other control signals may be input as necessary.

The memory cell array 1470 includes a plurality of memory cells MC and a plurality of wirings arranged in a matrix. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 27B:
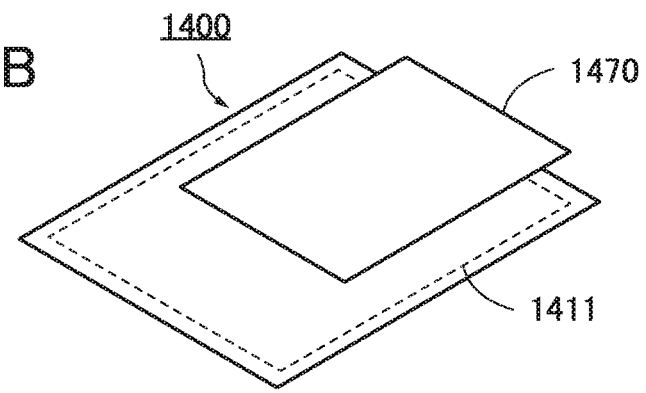

Note that FIG. 27(A) illustrates an example in which the peripheral circuit 1411 and the memory cell array 1470 are formed on the same plane; however, this embodiment is not limited thereto. For example, as illustrated in FIG. 27(B), the memory cell array 1470 may be provided over the peripheral circuit 1411 to partly overlap with the peripheral circuit 1411. For example, the sense amplifier may be provided below the memory cell array 1470 so that they overlap with each other.

FIG. 28 illustrate structure examples of memory cells applicable to the memory cell MC.

[DOSRAM]

Figure 28A:
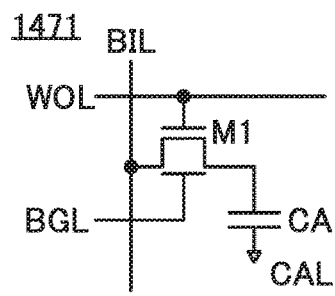
FIG. 28 (A)-(H) Circuit diagrams each illustrating a structure example of a memory device of one embodiment of the present invention.
Figure 28B:
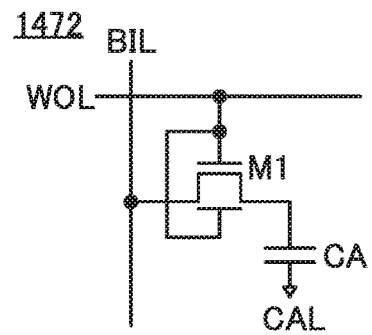
Figure 28C:
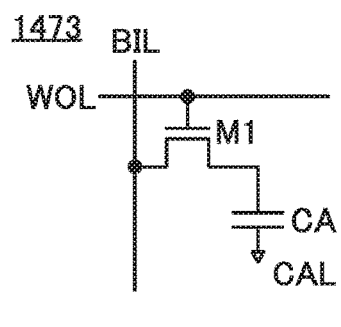

FIG. 28(A) to FIG. 28(C) each illustrate a circuit structure example of a DRAM memory cell. In this specification and the like, a DRAM using a memory cell including one OS transistor and one capacitor is sometimes referred to as a DOSRAM (Dynamic Oxide Semiconductor Random Access Memory). A memory cell 1471 illustrated in FIG. 28(A) includes a transistor M1 and a capacitor CA. Note that the transistor M1 includes a gate (also referred to as a front gate in some cases) and a back gate.

A first terminal of the transistor M1 is connected to a first terminal of the capacitor CA. A second terminal of the transistor M1 is connected to a wiring BIL. A gate of the transistor M1 is connected to a wiring WOL. A back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

Here, the memory cell 1471 illustrated in FIG. 28(A) corresponds to the memory device illustrated in FIG. 25. That is, the transistor M1, the capacitor CA, the wiring BIL, the wiring WOL, the wiring BGL, and the wiring CAL correspond to the transistor 200, the capacitor 100, the wiring 2003, the wiring 2004, the wiring 2006, and the wiring 2005, respectively. Note that the transistor 300 illustrated in FIG. 25 corresponds to a transistor provided in the peripheral circuit 1411 of the memory device 1400 illustrated in FIG. 27(B).

The memory cell MC is not limited to the memory cell 1471, and the circuit structure can be changed. For example, in the memory cell MC, the back gate of the transistor M1 may be connected to the wiring WOL instead of the wiring BGL as in a memory cell 1472 illustrated in FIG. 28(B). As another example, the memory cell MC may be configured with a single-gate transistor, that is, the transistor M1 that does not have a back gate, like a memory cell 1473 illustrated in FIG. 28(C).

In the case where the semiconductor device described in the above embodiment is used in the memory cell 1471 or the like, the transistor 200 can be used as the transistor M1, and the capacitor 100 can be used as the capacitor CA. The use of an OS transistor as the transistor M1 enables the leakage current of the transistor M1 to be extremely low. That is, written data can be retained for a long time with the transistor M1; thus, the frequency of refresh of the memory cell can be reduced. Alternatively, the refresh operation of the memory cell can be omitted. In addition, the extremely low leakage current allows multi-level data or analog data to be retained in the memory cell 1471, the memory cell 1472, or the memory cell 1473.

In addition, in the DOSRAM, when the sense amplifier is provided below the memory cell array 1470 to overlap with the memory cell array 1470 as described above, the bit line can be shortened. This reduces bit line capacity, which reduces the storage capacity of the memory cell.

[NOSRAM]

FIGS. 28(D) to 28(H) each illustrate a circuit structure example of a gain-cell memory cell including two transistors and one capacitor. A memory cell 1474 illustrated in FIG. 28(D) includes a transistor M2, a transistor M3, and a capacitor CB. Note that the transistor M2 includes a front gate (simply referred to as a gate in some cases) and a back gate. In this specification and the like, a memory device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to the wiring RBL, a second terminal of the transistor M3 is connected to the wiring SL, and a gate of the transistor M3 is connected to the first terminal of the capacitor CB.

The wiring WBL functions as a write bit line. The wiring RBL functions as a read bit line. The wiring WOL functions as a word line. The wiring CAL functions as a wiring for applying a predetermined potential to the second terminal of the capacitor CB. During data writing, data retention, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

Figure 28D:
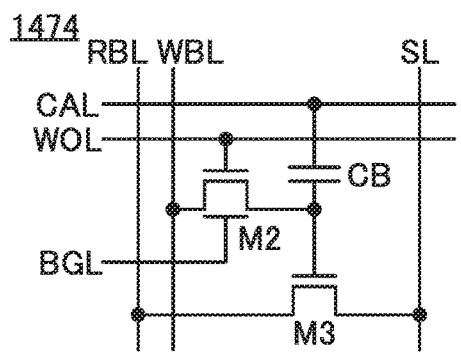
Figure 28E:
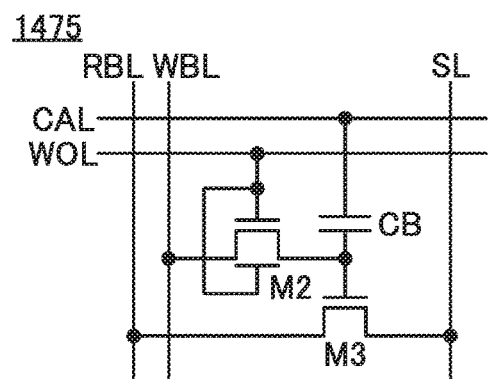
Figure 28F:
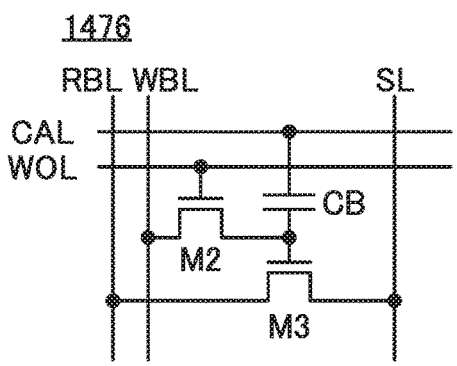
Figure 28G:
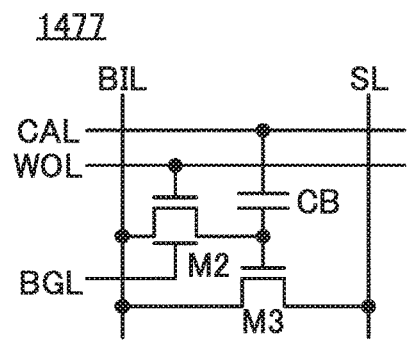

Here, the memory cell 1474 illustrated in FIG. 28(D) corresponds to the memory device illustrated in FIG. 24. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 1003, the wiring 1004, the wiring 1006, the wiring 1005, the wiring 1002, and the wiring 1001, respectively.

In addition, the memory cell MC is not limited to the memory cell 1474, and the circuit structure can be changed as appropriate. For example, as in a memory cell 1475 illustrated in FIG. 28(E), a structure may be employed in which the back gate of the transistor M2 is connected not to the wiring BGL but to the wiring WOL in the memory cell MC. Alternatively, for example, like a memory cell 1476 illustrated in FIG. 28(F), the memory cell MC may be a memory cell including a single-gate transistor, that is, the transistor M2 that does not include a back gate. Alternatively, for example, like a memory cell 1477 illustrated in FIG. 28(G), the memory cell MC may have a structure where the wiring WBL and the wiring RBL are combined into one wiring BIL.

In the case where the semiconductor device described in the above embodiment is used in the memory cell 1474 or the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, written data can be retained for a long time with the transistor M2; thus, the frequency of refresh of the memory cell can be reduced. Alternatively, the refresh operation of the memory cell can be omitted. In addition, the extremely low leakage current allows multi-level data or analog data to be retained in the memory cell 1474. The same applies to the memory cells 1475 to 1477.

Note that the transistor M3 may be a transistor containing silicon in a channel formation region (hereinafter such a transistor is referred to as a Si transistor in some cases). The conductivity type of the Si transistor may be either an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the memory device can be achieved.

Alternatively, the transistor M3 may be an OS transistor. When OS transistors are used as the transistors M2 and M3, the circuit of the memory cell array 1470 can be formed using only n-channel transistors.

Figure 28H:
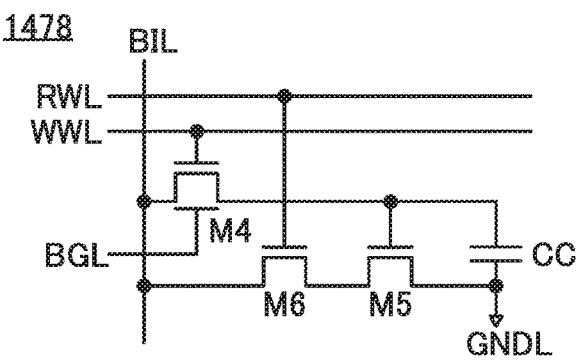

In addition, FIG. 28(H) illustrates an example of a gain-cell memory cell including three transistors and one capacitor. A memory cell 1478 illustrated in FIG. 28(H) includes transistors M4 to M6 and a capacitor CC. The capacitor CC is provided as appropriate. The memory cell 1478 is electrically connected to wirings BIL, RWL, WWL, BGL, and GNDL. The wiring GNDL is a wiring for supplying a low-level potential. Note that the memory cell 1478 may be electrically connected to the wirings RBL and WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistors M5 and M6 may be an n-channel Si transistor or a p-channel Si transistor. Alternatively, the transistors M4 to M6 may be OS transistors, in which case the circuit of the memory cell array 1470 can be formed using only n-channel transistors.

In the case where the semiconductor device described in the above embodiment is used in the memory cell 1478, the transistor 200 can be used as the transistor M4, the transistors 300 can be used as the transistors M5 and M6, and the capacitor 100 can be used as the capacitor CC. The use of an OS transistor as the transistor M4 enables the leakage current of the transistor M4 to be extremely low.

Note that the structures of the peripheral circuit 1411, the memory cell array 1470, and the like described in this embodiment are not limited to those described above. The arrangement and functions of these circuits and the wirings, circuit components, and the like connected to the circuits can be changed, removed, or added as needed.

The structure described in this embodiment can be used in an appropriate combination with the structures described in the other embodiments and the like.

Embodiment 4

In this embodiment, an example of a chip 1200 on which the semiconductor device of the present invention is mounted will be described with reference to FIG. 29 A plurality of circuits (systems) are implemented in the chip 1200. A technique for integrating a plurality of circuits (systems) into one chip is referred to as system on chip (SoC) in some cases.

Figure 29A:
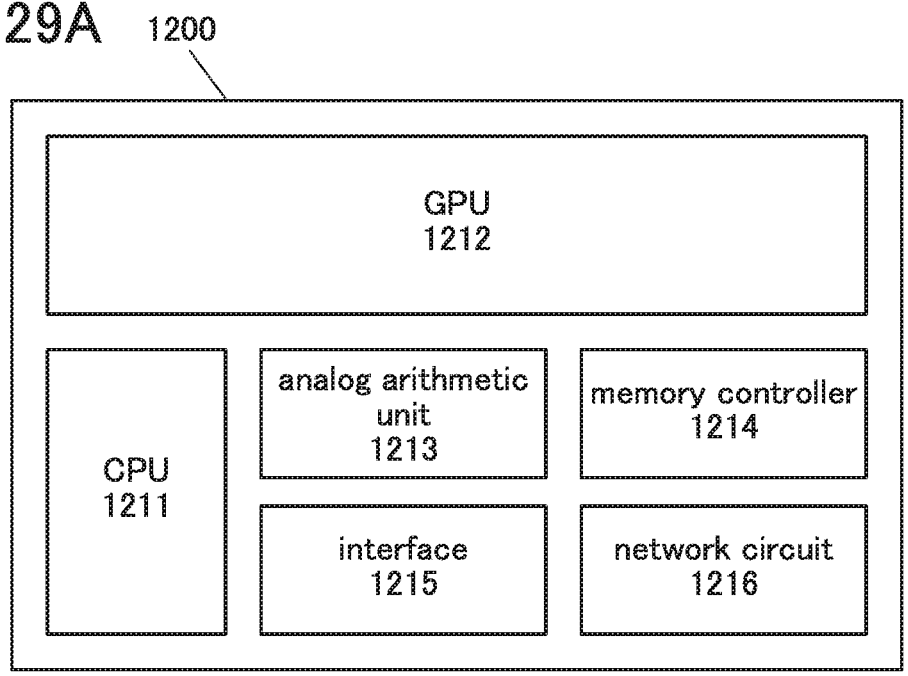
FIG. 29 (A) (B) Schematic views of a semiconductor device of one embodiment of the present invention.

As illustrated in FIG. 29(A), the chip 1200 includes a CPU (Central Processing Unit) 1211, a GPU (Graphics Processing Unit) 1212, one or more of analog arithmetic units 1213, one or more of memory controllers 1214, one or more of interfaces 1215, one or more of network circuits 1216, and the like.

Figure 29B:
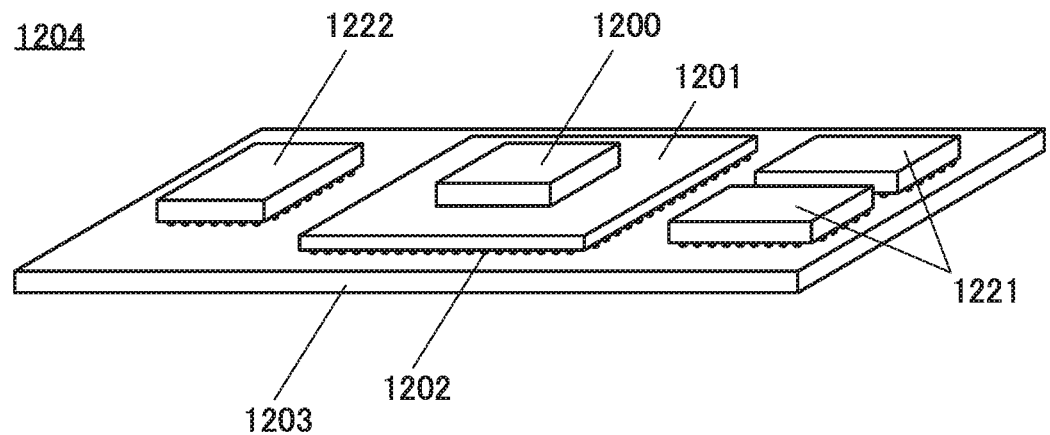

A bump (not illustrated) is provided on the chip 1200, and as illustrated in FIG. 29(B), the chip 1200 is connected to a first surface of a printed circuit board (PCB) 1201. In addition, a plurality of bumps 1202 are provided on a rear side of the first surface of the PCB 1201, and the PCB 1201 is connected to a motherboard 1203.

Memory devices such as DRAMs 1221 and a flash memory 1222 may be provided over the motherboard 1203. For example, the DOSRAM described in the above embodiment can be used as the DRAM 1221. In addition, for example, the NOSRAM described in the above embodiment can be used as the flash memory 1222.

The CPU 1211 preferably includes a plurality of CPU cores. In addition, the GPU 1212 preferably includes a plurality of GPU cores. Furthermore, the CPU 1211 and the GPU 1212 may each include a memory for temporarily storing data. Alternatively, a common memory for the CPU 1211 and the GPU 1212 may be provided in the chip 1200. The NOSRAM or the DOSRAM described above can be used as the memory. Moreover, the GPU 1212 is suitable for parallel computation of a number of data and thus can be used for image processing or product-sum operation. When an image processing circuit or a product-sum operation circuit using an oxide semiconductor of the present invention is provided in the GPU 1212, image processing and product-sum operation can be performed with low power consumption.

In addition, since the CPU 1211 and the GPU 1212 are provided on the same chip, a wiring between the CPU 1211 and the GPU 1212 can be shortened, and the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a network circuit such as a LAN (Local Area Network). The network circuit 1216 may further include a circuit for network security.

The circuits (systems) can be formed in the chip 1200 through the same manufacturing process. Therefore, even when the number of circuits needed for the chip 1200 increases, there is no need to increase the number of manufacturing processes; thus, the chip 1200 can be fabricated at low cost.

The motherboard 1203 provided with the PCB 1201 on which the chip 1200 including the GPU 1212 is mounted, the DRAMs 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can execute arithmetic operation in a deep neural network (DNN), a convolutional neural network (CNN), a recurrent neural network (RNN), an autoencorder, a deep Boltzmann machine (DBM), a deep belief network (DBN), or the like; thus, the chip 1200 can be used as an AI chip or the GPU module 1204 can be used as an AI system module.

The structure described in this embodiment can be used in combination with the structures described in the other embodiments as appropriate.

Embodiment 5

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable memory devices such as memory cards (e.g., SD cards), USB memories, and SSDs (solid state drives). FIG. 30 schematically illustrates some structure examples of removable memory devices. The semiconductor device described in the above embodiment is processed into a packaged memory chip and used in a variety of storage devices and removable memories, for example.

Figure 30A:
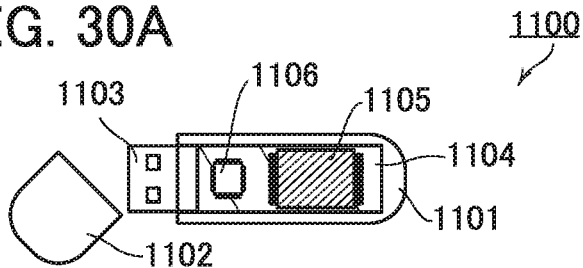
FIG. 30 (A)-(E) Schematic views of memory devices of one embodiment of the present invention.

FIG. 30(A) is a schematic diagram of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like on the substrate 1104.

Figures 30B, 30C:
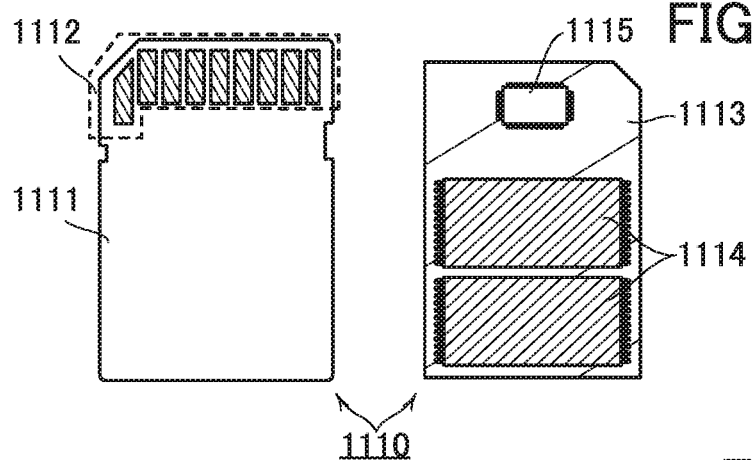

FIG. 30(B) is an external schematic diagram of an SD card, and FIG. 30(C) is a schematic diagram illustrating the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113, in which case data can be read from and written in the memory chip 1114 by radio communication between a host device and the SD card 1110. The semiconductor device described in the above embodiment can be incorporated in the memory chip 1114 or the like on the substrate 1113.

Figures 30D, 30E:
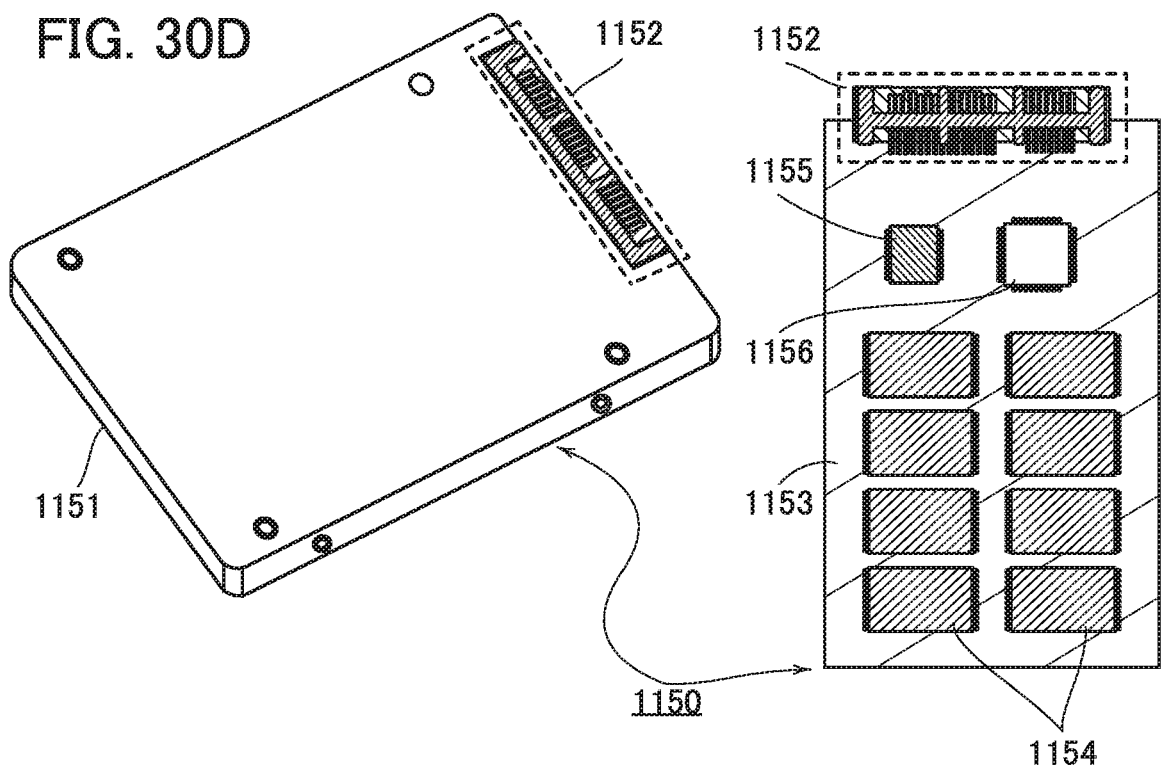

FIG. 30(D) is an external schematic diagram of an SSD, and FIG. 30(E) is a schematic diagram illustrating the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like on the substrate 1153.

This embodiment can be implemented in combination with any of the structures described in the other embodiments and the like, as appropriate.

Embodiment 6

In this embodiment, a product image applicable to the semiconductor device of one embodiment of the present invention and specific examples of electronic devices will be described using FIG. 31 and FIG. 32.

Figure 31:
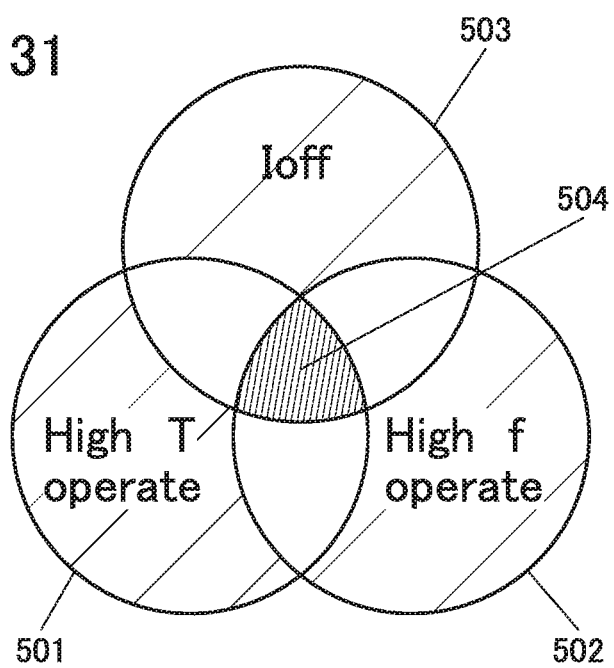
FIG. 31 A diagram describing a product image applicable to a semiconductor device of one embodiment of the present invention.

First, FIG. 31 illustrates a product image applicable to the semiconductor device of one embodiment of the present invention. A region 501 illustrated in FIG. 31 represents high temperature characteristics (High T operate), a region 502 represents high frequency characteristics (High f operate), a region 503 represents low off characteristics (Ioff), and a region 504 represents a region where the region 501, the region 502, and the region 503 overlap one another.

Note that when the region 501 is intended to be satisfied, it can be roughly satisfied by using a carbide or a nitride such as silicon carbide or gallium nitride for a channel formation region of a semiconductor device. When intended to be satisfied, the region 502 can be roughly satisfied by using a silicide such as single crystal silicon or crystalline silicon for a channel formation region of a semiconductor device. In addition, when intended to be satisfied, the region 503 can be roughly satisfied by using an oxide semiconductor or a metal oxide for a channel formation region of a semiconductor device.

The semiconductor device of one embodiment of the present invention can be favorably used for a product in the range represented by the region 504, for example.

A conventional product has difficulty in satisfying all of the region 501, the region 502, and the region 503. However, the semiconductor device of one embodiment of the present invention includes a crystalline OS in a channel formation region. In the case where the crystalline OS is included in the channel formation region, a semiconductor device and an electronic device satisfying high temperature characteristics, high frequency characteristics, and low off characteristics can be provided.

Note that examples of a product in the range represented by the region 504 are an electronic device including a low-power consumption and high-performance CPU, an in-car electronic device required to have high reliability in a high-temperature environment, and the like.

More specifically, the semiconductor device of one embodiment of the present invention can be used for a chip or a processor such as a CPU or a GPU. FIG. 32 illustrates specific examples of electronic devices including a chip or a processor such as a CPU or a GPU of one embodiment of the present invention.

<Electronic Device and System>

The GPU or the chip according to one embodiment of the present invention can be mounted on a variety of electronic devices. Examples of electronic devices include a digital camera, a digital video camera, a digital photo frame, a cellular phone, a portable game machine, a portable information terminal, and an audio reproducing device in addition to electronic devices provided with comparatively large screens, such as a television device, a desktop or laptop personal computer, a monitor for a computer or the like, digital signage, and a large game machine like a pachinko machine. In addition, when an integrated circuit or a chip according to one embodiment of the present invention is provided in the electronic device, the electronic device can include artificial intelligence.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 32 illustrates examples of electronic devices.

[Mobile Phone]

Figure 32A:
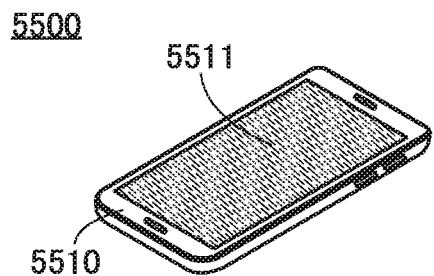
FIG. 32 (A)-(F) Diagrams illustrating electronic devices of one embodiment of the present invention.

FIG. 32A illustrates a mobile phone (smartphone) which is a type of an information terminal. An information terminal 5500 includes a housing 5510 and a display portion 5511. As input interfaces, a touch panel is provided in the display portion 5511 and a button is provided in the housing 5510.

When the chip of one embodiment of the present invention is applied to the information terminal 5500, the information terminal 5500 can execute an application utilizing artificial intelligence. Examples of the application utilizing artificial intelligence include an application for recognizing a conversation and displaying the content of the conversation on the display portion 5511; an application for recognizing letters, figures, and the like input to the touch panel of the display portion 5511 by a user and displaying them on the display portion 5511; and an application for performing biometric authentication using fingerprints, voice prints, or the like.

[Information Terminal]

Figure 32B:
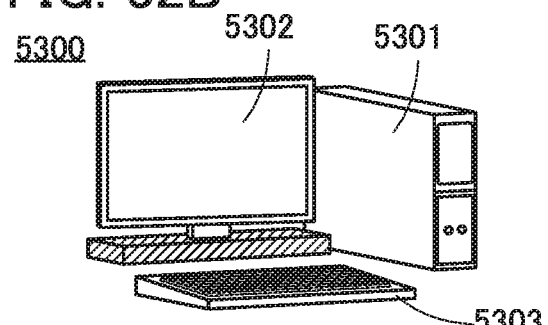

FIG. 32(B) illustrates a desktop information terminal 5300. The desktop information terminal 5300 includes a main body 5301 of the information terminal, a display 5302, and a keyboard 5303.

Like the information terminal 5500 described above, when the chip of one embodiment of the present invention is applied to the desktop information terminal 5300, the desktop information terminal 5300 can execute an application utilizing artificial intelligence. Examples of the application utilizing artificial intelligence include design-support software, text correction software, and software for automatic menu generation. Furthermore, with use of the desktop information terminal 5300, novel artificial intelligence can be developed.

Note that in the above description, as examples of the electronic devices, a smartphone and a desktop information terminal are shown in FIGS. 32(A) and 32(B), respectively; however, the electronic devices can be information terminals other than a smartphone and a desktop information terminal. Examples of an information terminal other than the smartphone and the desktop information terminal include a PDA (Personal Digital Assistant), a notebook information terminal, and a workstation.

[Household Appliance]

Figure 32C:
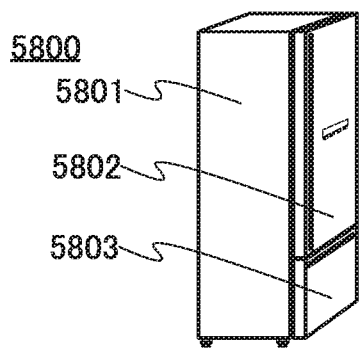

FIG. 32(C) illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

[Game Machine]

Figure 32D:
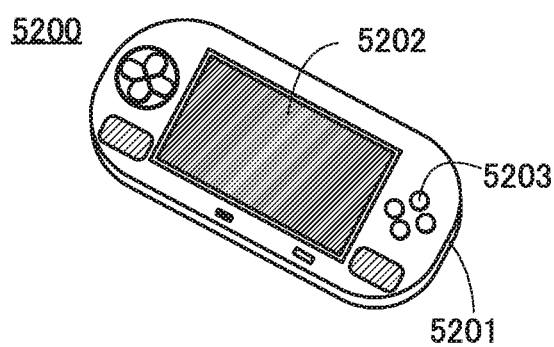
Figure 32D:
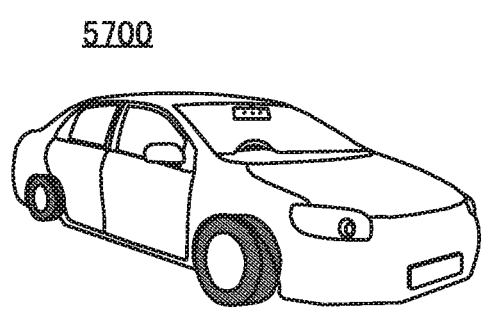
Figure 32D:
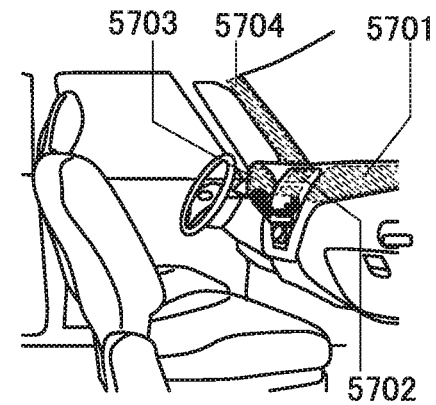

FIG. 32(D) illustrates a portable game machine 5200 as an example of a game machine. The portable game machine includes a housing 5201, a display portion 5202, a button 5203, and the like.

When the GPU or the chip of one embodiment of the present invention is applied to the portable game machine 5200, the portable game machine 5200 with low power consumption can be achieved. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is applied to the portable game machine 5200, the portable game machine 5200 including artificial intelligence can be achieved.

In general, the progress of a game, the actions and words of game characters, and expressions of a phenomenon and the like occurring in the game are determined by the program in the game; however, the use of artificial intelligence in the portable game machine 5200 enables expressions not limited by the game program. For example, it becomes possible to change expressions such as questions posed by the player, the progress of the game, time, and actions and words of game characters.

In addition, when a game requiring a plurality of players is played on the portable game machine 5200, the artificial intelligence can create a virtual game player, thus, the game can be played alone with the game player created by the artificial intelligence as an opponent.

Although the portable game machine is illustrated as an example of a game machine in FIG. 32(D), the game machine using the GPU or the chip of one embodiment of the present invention is not limited thereto. Examples of the game machine to which the GPU or the chip of one embodiment of the present invention is applied include a home stationary game machine, an arcade game machine installed in entertainment facilities (a game center, an amusement park, and the like), and a throwing machine for batting practice installed in sports facilities.

[Moving Vehicle]

The GPU or the chip of one embodiment of the present invention can be applied to an automobile, which is a moving vehicle, and the periphery of a driver's seat in the automobile.

FIG. 32(E1) illustrates an automobile 5700, which is an example of a moving vehicle, and FIG. 32(E2) is a diagram illustrating the surroundings of a windshield inside the automobile. FIG. 32(E2) illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging device (not illustrated) provided for the automobile 5700. That is, displaying an image taken by the imaging device provided outside the automobile 5700 leads to compensation for the blind spot and an increase in safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be applied to a component of artificial intelligence, the chip can be used for an automatic driving system of the automobile 5700, for example. The chip can also be used for a navigation system, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is applied to each of these moving vehicles.

[Broadcasting System]

The GPU or the chip of one embodiment of the present invention can be applied to a broadcasting system.

Figure 32F:
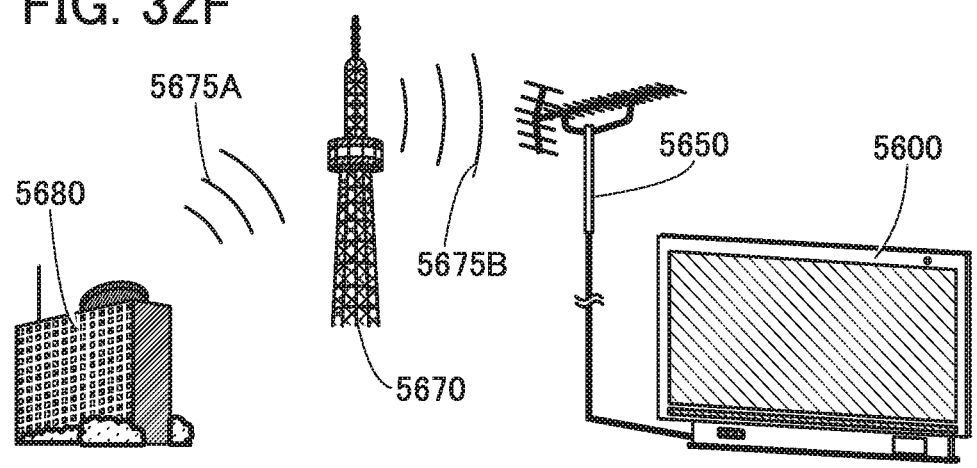

FIG. 32(F) schematically illustrates data transmission in a broadcasting system. Specifically, FIG. 32(F) illustrates a path in which a radio wave (a broadcast signal) transmitted from a broadcast station 5680 is delivered to a television receiver (TV) 5600 of each household. The TV 5600 includes a receiving device (not illustrated), and the broadcast signal received by an antenna 5650 is transmitted to the TV 5600 through the receiving device.

Although a UHF (Ultra High Frequency) antenna is illustrated as the antenna 5650 in FIG. 32(F), a BS/110° CS antenna, a CS antenna, or the like can also be used as the antenna 5650.

A radio wave 5675A and a radio wave 5675B are broadcast signals for terrestrial broadcasting; a radio wave tower 5670 amplifies the received radio wave 5675A and transmits the radio wave 5675B. Each household can view terrestrial TV broadcasting on the TV 5600 by receiving the radio wave 5675B with the antenna 5650. Note that the broadcasting system is not limited to the terrestrial broadcasting shown in FIG. 32(F) and may be satellite broadcasting using an artificial satellite, data broadcasting using an optical line, or the like.

The broadcasting system may be a broadcasting system utilizing artificial intelligence by applying the chip of one embodiment of the present invention. When broadcast data is transmitted from the broadcast station 5680 to the TV 5600 of each household, the broadcast data is compressed by an encoder. When the antenna 5650 receives the compressed broadcast data, the compressed broadcast data is decompressed by a decoder of the receiving device included in the TV 5600. With use of artificial intelligence, for example, a display pattern included in an image to be displayed can be recognized in motion compensation prediction, which is one of the compression methods for the encoder. In addition, in-frame prediction or the like can also be performed utilizing artificial intelligence. Furthermore, for example, when broadcast data with low resolution is received and the broadcast data is displayed on the TV 5600 with high resolution, image interpolation processing such as upconversion can be performed in the broadcast data decompression by the decoder.

The broadcasting system utilizing artificial intelligence is suitable for ultra-high definition television (UHDTV: 4K, 8K) broadcasting, which needs a larger amount of broadcast data.

In addition, as an application of artificial intelligence in the TV 5600, a recording device including artificial intelligence may be provided in the TV 5600, for example. With such a structure, the artificial intelligence in the recording device can learn the user's preference, so that TV programs that suit the user's preference can be recorded automatically.

The electronic devices, the functions of the electronic devices, the application examples of artificial intelligence, their effects, and the like described in this embodiment can be combined as appropriate with the description of another electronic device.

This embodiment can be implemented in combination with any of the structures described in the other embodiments and the like, as appropriate.

REFERENCE NUMERALS

100: capacitor, 100a: capacitor, 110: conductor, 110a: conductor, 112: conductor, 114: insulator, 114a: insulator, 114b: insulator, 116: insulator, 120: conductor, 120a: conductor, 130: insulator, 130a: insulator, 140: insulator, 140a: insulator, 140b: insulator, 150: insulator, 152: conductor, 154: insulator, 156: insulator, 200: transistor, 200a: transistor, 200b: transistor, 205: conductor, 205a: conductor, 205b: conductor, 210: insulator, 212: insulator, 214: insulator, 216: insulator, 222: insulator, 224: insulator, 230: oxide, 230a: oxide, 230A: oxide film, 230b: oxide, 230B: oxide film, 230c: oxide, 230C: oxide film, 231a: region, 231b: region, 234: region, 240: conductor, 240a: conductor, 240b: conductor, 241: insulator, 241a: insulator, 241b: insulator, 242: conductor, 242a: conductor, 242A: conductive film, 242b: conductor, 242B: conductor layer, 243: oxide, 243a: oxide, 243A: oxide film, 243b: oxide, 243B: oxide layer, 245: conductor, 246: conductor, 246a: conductor, 246b: conductor, 247: conductor, 247a: conductor, 247b: conductor, 250: insulator, 250A: insulating film, 260: conductor, 260a: conductor, 260Aa: conductive film, 260Ab: conductive film, 260b: conductor, 265: dummy film, 265A: dummy film, 272: insulator, 272A: insulating film, 273: insulator, 273A: insulating film, 274: insulator, 276: insulator, 280: insulator, 281: insulator, 282: insulator

The invention claimed is:

1. A semiconductor device comprising:
    a first insulator in which an opening is formed;
    a first conductor positioned in the opening;
    a first oxide over the first insulator;
    a second oxide over the first oxide;
    a third oxide and a fourth oxide over the second oxide;
    a second conductor over the third oxide and the first conductor;
    a third conductor over the fourth oxide;
    a fifth oxide over the second oxide;
    a second insulator over the fifth oxide; and
    a fourth conductor positioned over the second insulator and overlapping with the fifth oxide,
    wherein the fifth oxide is in contact with each of a side surface of the third oxide and a side surface of the fourth oxide, and
    wherein the second conductor is in contact with a top surface of the first conductor.

2. The semiconductor device according to claim 1, further comprising a fifth conductor in contact with a top surface of the second conductor,
wherein the fifth conductor overlaps with at least part of the first conductor.

3. The semiconductor device according to claim 1, wherein the third oxide and the fourth oxide each include zinc.

4. The semiconductor device according to claim 1, wherein the thicknesses of the third oxide and the fourth oxide are each larger than or equal to 1 nm and smaller than or equal to 10 nm.

5. The semiconductor device according to claim 1, wherein the third oxide and the fourth oxide each have crystallinity.

6. The semiconductor device according to claim 1, wherein the second oxide includes In, an element M (M is Al, Ga, Y, or Sn), and Zn.

7. The semiconductor device according to claim 1,
wherein the third oxide comprises a first region that does not overlap with the second conductor,
wherein the fourth oxide comprises a second region that does not overlap with the third conductor, and
wherein the fifth oxide is in contact with each of a top surface of the first region and a top surface of the second region.

8. The semiconductor device according to claim 1,
wherein the conductivity of the third oxide is higher than the conductivity of the second oxide, and
wherein the conductivity of the fourth oxide is higher than the conductivity of the second oxide.

9. A semiconductor device comprising: a first to a third insulator; a first to a sixth conductor; a first to a fifth oxide; a capacitor; and a transistor,
wherein the capacitor comprises:
the fifth conductor;
the third insulator over the fifth conductor; and
the sixth conductor over the third insulator,
wherein the transistor comprises:
the first insulator in which an opening is formed;
the first conductor positioned in the opening;
the first oxide over the first insulator;
the second oxide over the first oxide;
the third oxide and the fourth oxide over the second oxide;
the second conductor over the third oxide and the first conductor;
the third conductor over the fourth oxide;
the fifth oxide over the second oxide;
the second insulator over the fifth oxide; and
the fourth conductor positioned over the second insulator and overlapping with the fifth oxide,
wherein the fifth oxide is in contact with each of a side surface of the third oxide and a side surface of the fourth oxide,
wherein the conductivity of the third oxide is higher than the conductivity of the second oxide,
wherein the conductivity of the fourth oxide is higher than the conductivity of the second oxide, and
wherein the second conductor is in contact with a top surface of the first conductor.

10. The semiconductor device according to claim 9, wherein the capacitor is formed below the transistor, and
wherein the first conductor is electrically connected to the sixth conductor.

11. The semiconductor device according to claim 9, further comprising, below the first insulator, a fourth insulator in which an opening is formed,
wherein at least part of the fifth conductor, the third insulator, and the sixth conductor are positioned in the opening of the fourth insulator.

12. The semiconductor device according to claim 9,
wherein the third oxide comprises a first region that does not overlap with the second conductor,
wherein the fourth oxide comprises a second region that does not overlap with the third conductor, and
wherein the fifth oxide is in contact with each of a top surface of the first region and a top surface of the second region.

13. A semiconductor device comprising: a first to a fourth insulator; a first to a seventh conductor; a first to a fifth oxide; a capacitor; a first transistor; and a second transistor,
wherein the capacitor comprises:
the fifth conductor;
the third insulator over the fifth conductor; and
the sixth conductor over the third insulator,
wherein the first transistor comprises:
the first insulator in which an opening is formed;
the first conductor positioned in the opening;
the first oxide over the first insulator;
the second oxide over the first oxide;
the third oxide and the fourth oxide over the second oxide;
the second conductor over the third oxide and the first conductor;
the third conductor over the fourth oxide;
the fifth oxide over the second oxide;
the second insulator over the fifth oxide; and
the fourth conductor positioned over the second insulator and overlapping with the fifth oxide,
wherein the fifth oxide is in contact with each of a side surface of the third oxide and a side surface of the fourth oxide,
wherein the conductivity of the third oxide is higher than the conductivity of the second oxide,
wherein the conductivity of the fourth oxide is higher than the conductivity of the second oxide,
wherein the second conductor is in contact with a top surface of the first conductor, and
wherein the second transistor comprises:
the fourth insulator over a silicon substrate; and
the seventh conductor over the fourth insulator.

14. The semiconductor device according to claim 13,
wherein the third oxide comprises a first region that does not overlap with the second conductor,
wherein the fourth oxide comprises a second region that does not overlap with the third conductor, and
wherein the fifth oxide is in contact with each of a top surface of the first region and a top surface of the second region.

15. The semiconductor device according to claim 13,
wherein the first transistor further comprises an eighth conductor in contact with a top surface of the second conductor,
wherein the capacitor is formed over the first transistor,
wherein the eighth conductor is electrically connected to the fifth conductor,
wherein the second transistor is formed below the first transistor, and
wherein the first conductor is electrically connected to the seventh conductor.

16. The semiconductor device according to claim 15, further comprising, over the eighth conductor, a fifth insulator in which an opening is formed, wherein at least part of the fifth conductor, the third insulator, and the sixth conductor are positioned in the opening of the fifth insulator.

* * * * *